United States Patent [19]

Vlach et al.

[11] Patent Number: 5,548,539
[45] Date of Patent: Aug. 20, 1996

[54] ANALYSIS MECHANISM FOR SYSTEM PERFORMANCE SIMULATOR

[75] Inventors: Martin Vlach, Portland; Ernst Christen, Beaverton; Darrell A. Teegarden, Lake Oswego; David G. Bedrosian, Tigard, all of Oreg.

[73] Assignee: Analogy, Inc., Beaverton, Oreg.

[21] Appl. No.: 148,697

[22] Filed: Nov. 5, 1993

[51] Int. Cl.$^6$ .................................................. G06F 17/00
[52] U.S. Cl. .......................................... 364/578; 364/488
[58] Field of Search ..................................... 364/488, 578

[56] References Cited

U.S. PATENT DOCUMENTS

| | | | |
|---|---|---|---|
| 4,868,770 | 9/1989 | Smith et al. | 364/578 |
| 4,985,860 | 1/1991 | Vlach | 364/578 |
| 5,046,024 | 9/1991 | Smith et al. | 364/578 |
| 5,092,780 | 3/1992 | Vlach | 434/433 |
| 5,111,413 | 5/1992 | Lazansky et al. | 364/578 |
| 5,199,103 | 3/1993 | Smith et al. | 395/140 |
| 5,220,512 | 6/1993 | Watkins et al. | 364/489 |
| 5,222,030 | 6/1993 | Dangelo et al. | 364/489 |
| 5,363,320 | 11/1994 | Boyle et al. | 364/578 |

OTHER PUBLICATIONS

Analog Work Bench Manual, May, 1992 (material sections only).
Anacad Manual, May, 1993 (material sections only).
Syscap Manual, Mar. 28, 1989 (material sections only).
PSpice Manual, Jul. 1993 (material sections only).

*Primary Examiner*—Michael Zanelli
*Attorney, Agent, or Firm*—Robert D. Varitz, Esq.

[57] ABSTRACT

An analysis mechanism is intended for use in a system performance simulator which includes a core simulator and which is intended for simulating the performance of a physical, real-world system, and which operates with a hardware description language. The hardware description language includes representations of physical, real-world devices in the form of a template set, wherein each template in the set includes an extraction mechanism for extracting indicators of system quality from the core simulator for each template, as the simulation progresses, or after simulation is complete. Additionally, a display interface is provided for displaying the system performance indicators of design quality to a designer, either during or after the simulation.

20 Claims, 15 Drawing Sheets

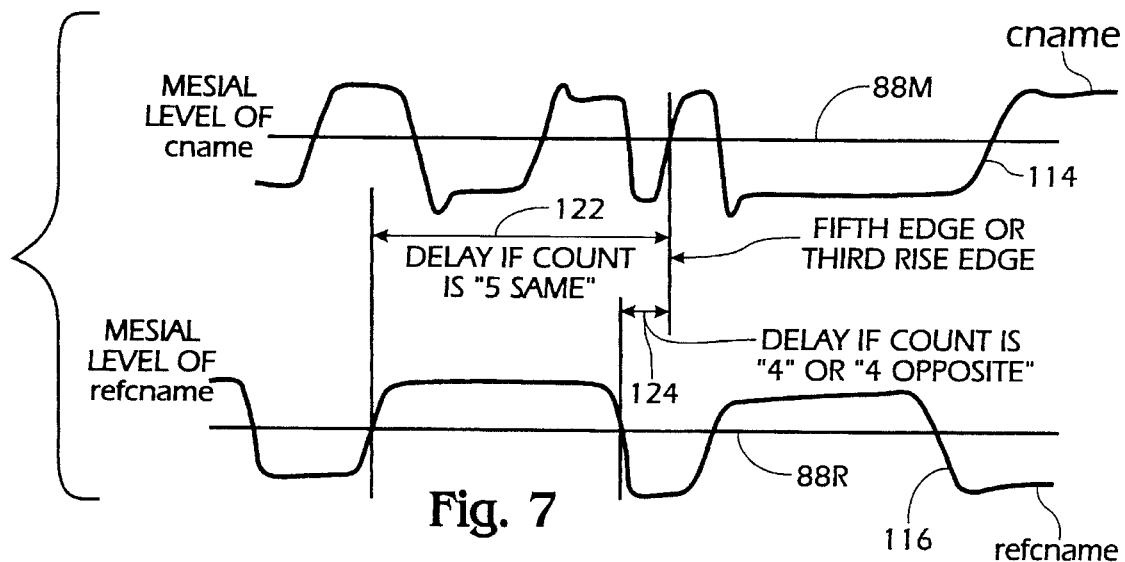
Fig. 7
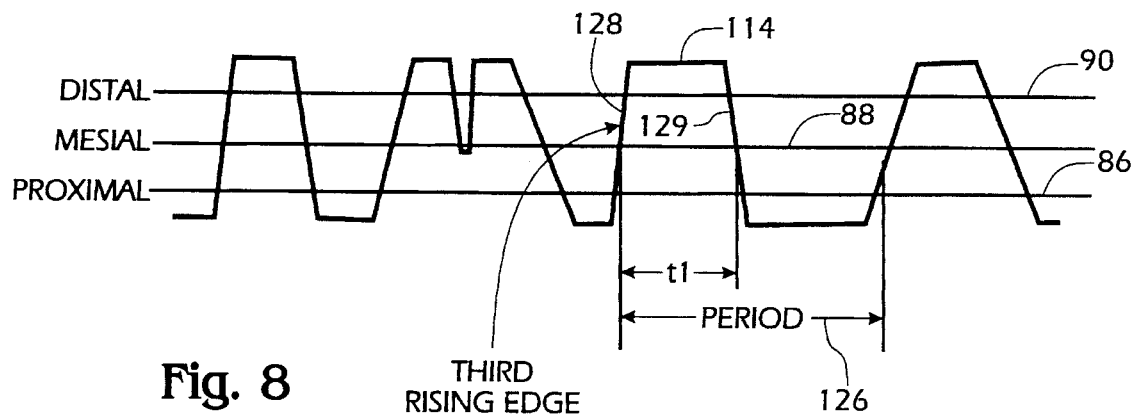
Fig. 8    THIRD RISING EDGE

DUTY CYCLE = PULSEWIDTH / PERIOD

ANALYSIS MECHANISM FOR SYSTEM PERFORMANCE SIMULATOR

BACKGROUND

This invention relates to system performance simulators, and specifically to an analysis mechanism which allows a designer to investigate and interact with a simulator to determine, qualitatively, and quantitatively, how well a system being simulated performs during a simulation.

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

A simulator which incorporates a hardware description language is described in U.S. Pat. No. 5,092,780 to Vlach, for SYSTEM PERFORMANCE SIMULATOR, granted Mar. 3, 1992. The system performance simulator described in the Vlach patent includes a library having a number of templates therein, where each template represents, mathematically and operatively, real-world, physical devices. Templates each include one or more mathematical equations which are descriptive of the behavioral characteristics of the represented physical device. Such templates are part of what has become to be known as a hardware descriptive language (HDL). Templates may be combined with a quantitative value set, also contained in the library. A template which is combined with a quantitative value set is referred to as a component model, which represents a specific real-world device.

The library further includes a system topology which describes how the individual devices are connected. A system assembler is operable to take the equations from the individual component models and form them into a set of system equations for the system which is to be simulated. A core simulator then performs the actual simulation by solving the system equations and provides an output. Other features of the system performance simulator include the ability to define an expression and to build templates using a modeling subsystem.

The system performance simulator described in the Vlach patent includes what are referred to as conservation properties, which are located within the templates and which contain the necessary mathematics to simulate conserved, physical systems. Additionally, environmental parameters are included in the templates and component models to provide a simulation which is sensitive to changing environmental conditions, such temperature, pressure, etc.

U.S. Pat. No. 4,868,770 for SIMULATION RESULTS ENHANCEMENT METHOD AND SYSTEM, granted Sep. 19, 1989 to Smith et al., further describes the system performance simulator of Vlach as including a results enhancement software which is operable to produce a simulation completion results database. A certain amount of post processing may be done on the completion results database which enables a designer to view or plot a dependent variable or a transform thereof from the modeling subsystem. This provides the Capability of interrupting the simulation upon the occurrence of a designer-defined event, such as the overloading of a physical circuit component, which is mathematically acceptable to the simulator, but which will result in the failure of the physical, real-world device.

While the aforementioned technologies are suitable for their intended purposes, it is desirable to be able to extract additional indicators of design quality from a system performance simulation wherein such indicators will provide a quantitative and qualitative measurement of sensitivity within the system, the amount of stress on the system, to be able to perform a worst case analysis on the system, to be able to simulate failure modes and the effects thereof, and to provide a centering and tolerancing analysis. All of these quantitative and qualitative measures of performance require the ability to extract an individual quantitative measure from the data set that is the result of the system performance simulation.

While such analyses have been done in the past, the techniques for accomplishing such analyses are, to say the least, cumbersome. For instance, in order to determine the sensitivity of a system, as where one component is changed and the effect of such change is to be analyzed with respect to other components, a designer must run an entire series of individual simulations wherein the device parameters for a physical device are manually and/or individually varied in the model, or in the representative code, for that device, and the results of such variations are analyzed with respect to the other system components. This is obviously a very time consuming process.

Likewise, a stress analysis may be accomplished manually by observing all operating parameters and noting those which are operating outside of their design envelopes. However, as previously noted, the simulator will simply perform a mathematical analysis. The simulator has no concept of "failure", as the mathematics will not necessarily indicate that a part is not operating, but will provide information which is used by the remainder of the system equations. The '770 patent discussed above, provides a method for stopping a simulation if the operational envelope of a particular component is exceeded, but does nothing to indicate how the rest of the physical system which is being simulated will perform as a result of the failure of a particular component thereof.

It is possible in known HDL models to simulate a specific part over a range of device parameters by manually changing the device parameters within the model during successive simulation. However, such an HDL model does not offer the capability of having a range of parameters specified therein. Therefore, the simulator will not, on its own, provide an analysis mechanism which operates within a range of parameters and which will detect and report primary and secondary component failures.

SUMMARY OF THE INVENTION

It is an object of the instant invention to overcome the shortcomings of known simulators and HDLs cited above.

Another object of the invention is to provide an analysis mechanism which allows a designer systematically to input a series of values and modes into an HDL template and to provide simulation over the range of such values and modes.

A further object of the invention is to provide an analysis of stress and sensitivity of system components when environmental and self-induced failures are considered. These failures may be the result of a chain reaction produced by one failure causing an environment which results in one or more additional failures.

Another object of the invention is to provide an analysis mechanism which will determine the interaction of system device tolerances on the system performance and on the tolerances and performances of other devices in the system.

A further object of the invention is to determine minimum and maximum worst case values for device and/or system performance with a defined set of device values and tolerances and to determine, under worst case conditions, whether any devices exceed their specifications or operate outside of their design envelopes.

Still another object of the invention is to provide an analysis mechanism which determines system design values such that specified measures of system and device performance are optimized.

Yet another object of the invention is to be able to provide an analysis mechanism which will be useful in optimizing manufacturing performance when the system design is to be manufactured in quantity.

The analysis mechanism of the invention is intended for use in a system performance simulator which includes a core simulator and which is intended for simulating the performance of a physical, real-world system, and which operates with an enhanced HDL. The enhanced HDL includes representations of physical, real-world devices in the form of a template set, wherein each template in the set includes an extraction mechanism for extracting system indicators of design quality from the simulator for each template, or from the system design that results from the interconnection of one or more templates as the simulation progresses, or upon completion of the simulation. Additionally, a display interface, in the form of analysis reports, is provided for displaying the indicators of design quality to a designer, either during or after the simulation.

These and other objects and advantages of the invention will become more fully apparent as the description which follows is read in conjunction with the drawings.

BRIEF DESCRIPTION OF THE DRAWINGS

FIG. 7 is a representation of the DELAY function of the measure analysis.

FIG. 8 is a representation of the DUTYcycle function of the measure analysis.

FIG. 30 illustrates an easily read dutycycle of a relatively simple square-wave waveform. FIG. 31 shows a more complex set of square-wave waveforms, wherein it is difficult to assess the effect of dutycycle on variations which take place in the value of a resistor in the circuit under analysis. FIG. 32 shows a plot of dutycycle vs. resistance value resulting from use of the performance measurement capability of the present invention on the square-wave curves shown in FIG. 31.

BEST MODE OF PRACTICING THE INVENTION

Figure 1:
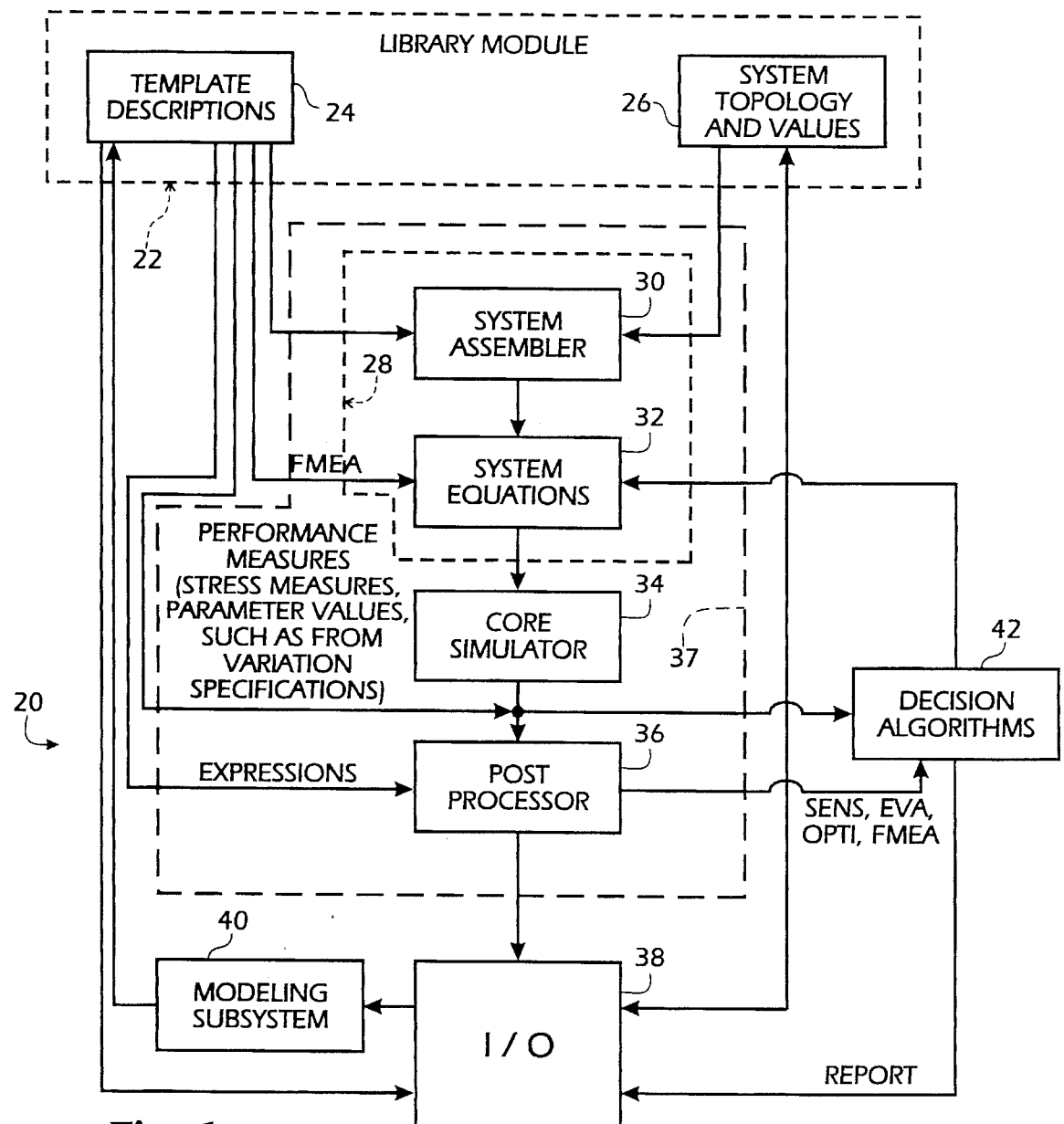
FIG. 1 is a block diagram of a system performance simulator incorporating the invention.

Turning now to FIG. 1, a system performance simulator constructed according to the invention is depicted generally at 20. Simulator 20 includes a library module 22, which contains template descriptions 24 and system topology and a quantitative value set, block 26.

As used herein, the term "template" means computer code that is a representation of a physical, real-world device, which includes a description of the mathematical equations, which may be algebraic, differential, etc., which define the physical characteristics of a device. A template, however, is technically a generic description of a real-world device, such as a resistor, capacitor, motor, transistor, etc. The template may be in the form of a macro-model, and/or represent a number of physical devices.

The template includes the necessary mathematics to describe the mathematical operation of a real-world device and includes what are referred to herein as conservation properties, which in the case of an electrical component follow the Kirchoff Current Law, KCL, which essentially defines the sum of through variables, such as current, at a node is equal to zero. Other features, such as what are referred to as environmental parameters, are provided in the set of equations which will describe mathematically how the real-world device responds to temperature, pressure, humidity, and other environmental characteristics.

A template is combined with a set of values from block 26 to become what is referred to herein as a "component model", which is a template having a specific set of values assigned thereto, and which describes a specific physical device, such as a specific type and model of resistor, transistor, motor, etc. While it should be understood that component models are used to form a system to be simulated, for ease of description, the term template is used herein to include generic templates and component models.

An assembly module 28 receives information from the library module. A system assembler 30 prepares a set of system equations 32 from equations in the component models and the system topology, which defines the interaction of the component models. A core simulator 34 then solves the system equations, passes its output to a post processor 36, which in turn passes output to I/O device 38. A modeling subsystem 40 is also provided which allows a designer to implement or change template descriptions. A set of decision algorithms 42 is provided to implement the analysis mechanism of the invention.

Turning attention for a moment to these algorithms, the decision algorithms receive information from templates and from simulation results and then make decisions regarding future simulations. This is both a feed-forward and a feed-back mechanism. That is, the decision algorithms may be able to establish future simulation requirements solely on input from user-specified requirements and template capabilities (feed-forward). Other times, however, the results of one simulation must be known before the requirements for the next simulation can be specified (feed-back). The decision algorithms use the appropriate information at the appropriate times to establish the requirements and specification of simulations. The following examples require application of, and illustrate, the decision algorithms:

A. Sensitivity
B. Worst Case Analysis (WCA)
 (1) Monte Carlo (MC)
 (2) Extreme Value Analysis (EVA)
 (3) Root-Sum-Square (RSS)
C. Centering and Tolerancing
Each of these will be discussed in detail:

A. Sensitivity

The decision algorithms for sensitivity operate in a feed-forward mode. The user specifies the system parameters and performance measures of interest. The decision algorithms determine the simulations required to calculate the ratio of the change in performance measure with change in system parameter (sensitivity). After the simulations are completed, a post-processing function calculates the desired sensitivity ratios.

B. Worst Case Analysis (WCA)

The objective of WCA is to determine the bounds of the system performance (under the circumstances that some of the system parameter values have statistical variation or uncertainty), and to determine if the system performance is acceptable within the desired performance specifications. These performance measures can include both achievement of desirable system functionality (such as bandwidth), and the detection of unwanted side effects (such as component stress). The decision algorithms control the simulations during these analyses.

Three different techniques for determining or approximating the Worst Case performance are discussed below:

(1) Monte Carlo (MC)

The decision algorithms for MC-WCA operate in the feed-forward mode. The required simulations are determined by the system parameters variations. Standard Monte Carlo simulations are performed. After the simulations are complete, post-processing functions determine the Worst Case occurrence of various performance measures.

(2) Extreme Value Analysis (EVA)

The decision algorithms for EVA-WCA operate in the feed-back mode. Sensitivity (as discussed above) is performed for each performance measure and system parameter of interest. The sensitivity information is used by the decision algorithm to determine the direction to change the system parameters in order to achieve the Worst Case performance. The decision algorithm changes these parameters to their extreme values (as determined by their parameter variation distributions) and repeats the sensitivity analyses at the new parameter set. If the direction of sensitivity has not changed from the original, then the correct "Worst Case" set of parameters is assumed to have been found. If not, the procedure is repeated from the new parameter set until the sensitivity stops changing sign or until the maximum number of iterations is reached.

(3) Root-Sum-Square (RSS)

The decision algorithms for RSS-WCA operate in the feed-back mode. This type of WCA is very similar to EVA-WCA, except that instead of using the extreme values of the variations of the parameter distributions, the components of the variations are split into bias dependent and truly random variations. The "extreme" values to use in the WCA analysis are determined by a "Root-Sum-Square" (RSS) combination of the truly random components of system parameter variation summed with the bias dependent components of variation. This provides a somewhat more realistic set of extreme values than EVA (EVA is quite pessimistic):

Definitions

Define the $i^{th}$ parameter as $P_i$ for $i=1, \ldots N$, where N is the total number of parameters.

Define the $j^{th}$ performance measure result as $M_j$ for $j=1, \ldots K$, where K is the total number of performance measures.

The $j^{th}$ performance measure is determined by the simulation of the system and the application of the measure command:

$$M_j = \text{meas}_j (f(P_1, P_2, \ldots P_N)) \equiv \text{meas}_j (f(P))$$

where the function f is the simulation of the system and $\text{meas}_j$ is the $j^{th}$ measurement operation.

The nominal value of the $j^{th}$ performance measure is found by simulating and measuring the system with all parameters set to their nominal values:

$$M_{jNOM} = meas_j(f(PNOM))$$

Define $\Delta P_{i(-BIASED)}$ as the change in the value of the parameter $P_i$ in the negative direction due to deterministic causes (e.g. temperature coefficient) for the desired level of confidence.

Define $\Delta P_{i(+BIASED)}$ as the change in the value of the parameter $P_i$ in the positive direction due to deterministic causes for the desired level of confidence.

Define $\Delta P_{iRANDOM}$ as the change in the value of the parameter $P_i$ due to random statistical variations for the desired level of confidence.

The maximum and minimum values for the $i^{th}$ parameter are defined as:

$$P_{i_{MAX}} = P_{i_{NOM}} + \Sigma \Delta P_{i_{+BIASED}} + \sqrt{\Sigma (\Delta P_{i_{RANDOM}})^2}$$

$$P_{i_{MIN}} = P_{i_{NOM}} + \Sigma \Delta P_{i_{-BIASED}} - \sqrt{\Sigma (\Delta P_{i_{RANDOM}})^2}$$

These values are used to determine the worst case system performance by either evaluation or by sensitivity linearization as described below.

Worst Case Performance by Evaluation

This approach uses a sensitivity analysis to determine the combination of parameter values, $P_{MAX}$ & $P_{MIN}$, which lead to the maximum and minimum performance measure, respectively.

The $i^{th}$ entry in $P_{MAX}$ is chosen either as $P_{iMAX}$ if the sensitivity $\delta M_j/\delta P_i$ is positive, or as $P_{iMIN}$ if the sensitivity is negative.

Using these values, the system is simulated to determine the corresponding performance measures.

$$M_{jMAX} = meas_j(f(P_{MAX}))$$

$$M_{jMIN} = meas_j(f(P_{MIN}))$$

Worst Case Performance by Sensitivity Linearization

This approach uses a sensitivity analysis to determine the change in the performance measure relative to a small change in each parameter. These sensitivities are assumed constant to calculate the worst case performance measures.

$$M_{jMAX} = M_{jNOM} + \sigma_{M_{jMAX}}$$

$$M_{jMIN} = M_{jNOM} - \sigma_{M_{jMIN}}$$

where $$\sigma_{M_{jMAX}} = \sqrt{\sum_{i=1}^{N} \left( \frac{\partial M_j}{\partial P_i} P_{i_{MAX}} \right)^2}$$

$$\sigma_{M_{jMIN}} = \sqrt{\sum_{i=1}^{N} \left( \frac{\partial M_j}{\partial P_i} P_{i_{MIN}} \right)^2}$$

C. Centering and Tolerancing

The decision algorithms for Centering and Tolerancing operate in the feedback mode. Statistical analyses are performed based on the system parameter variations. Post-processing functions determine various measures of system performance. The values of the system performance measures are compared to the user determined system specifications. The expected manufacturing yield can be determined from this information. The decision algorithms determine (from the simulated performance results and from the desired system specifications) a better set of nominal system parameters (design centering) or system parameter variations (design tolerancing) that will provide an improved overall system manufacturing yield and/or cost. This procedure is repeated until desired yield and cost goals are met or maximum number of iterations is reached Continuing with what is shown in FIG. 1, an extraction mechanism is provided to extract an indicator of design quality from simulator 37. As used in this context, simulator 37 includes the core simulator 34 and also the assembly module 28 and post processor 36. Additional code is placed into core simulator 34, system assembler 30, system equations 32 and post processor 36, which code is operable to recognize the enhanced HDL used in the templates and component models, all of which cooperate to provide an indicator-of-design-quality output.

An important feature of the system performance simulator, which is fully described in U.S. Pat. No. 5,092,780, incorporated herein by reference, is that system assembler 30 allows external definition of the physical components of the system which is being simulated. This allows the designer a great amount of flexibility in incorporating various real-world devices into a system and then being able to perform a simulation of that system on a computer.

As depicted in FIG. 1, a number of data paths are shown which implement the analysis mechanism of the invention. One of the data paths extending from template description block 24 to system equation block 32 is a line identified as FMEA, which stands for failure modes and effects analysis. Another data path extends from block 24 to the connection between core simulator 34 and post processor 36 and is identified as PERFORMANCE MEASURES, STRESS MEASURES, PARAMETER VALUES, SUCH AS FROM VARIATION SPECIFICATIONS. This data path allows the code which is part of the enhanced template of the invention to enter post processor 36, and also allows such code to be combined with the output of core simulator 34, and to enter decision algorithms block 42. An additional data path between post processor 36 and algorithm block 42 provides a path for SENS, EVA, OPTI and FMEA data to enter decision algorithm block 42. Yet another data path is provided between decision algorithm block 42 and assembly module 28, which allows input to the system equations in the event of a simulated failure or when it is necessary to modify the system equation as the result of a simulation and the instructions which are provided by the analysis mechanism of the invention. The foregoing will be described in greater detail later herein.

Figure 2:
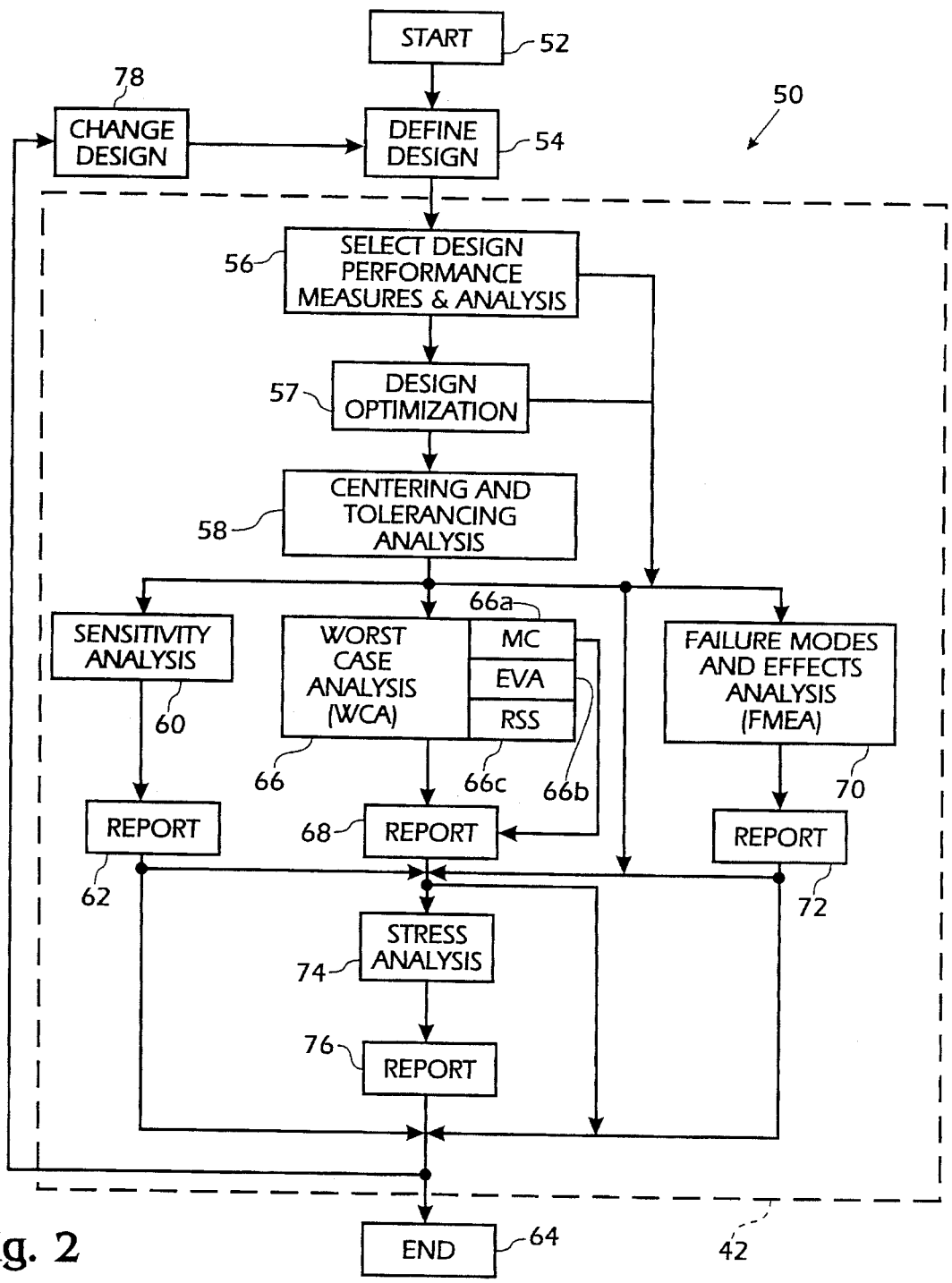
FIG. 2 is a block diagram depicting the analysis mechanism of the invention.

Referring now to FIG. 2, the analysis mechanism is depicted in a block diagram generally at 50. Block 50 includes the decision algorithms, block 42 of the system performance simulator. At the start 52 of the procedure, the design of the system is defined, block 54, which may be considered to be part of the system topology and values, block 26 of FIG. 1. Next, the designer selects the design performance measurements, block 56.

The measure analysis, may, for example, involve the selection of the gain of an electrical circuit as a design performance measure. Other examples of design performance measurements may be risetime, falltime, and bandwidth; all of these are indications of the design quality.

"Measure", as used herein, means that a single-number value may be extracted from a wave form, or from a set of wave forms, which are generated by core simulator 34 and post processor 36, or by an intermediate measure or transformation operation. This single-number value is one example of an indicator of design quality. Measurement analysis is used to distill the information contained in detailed waveforms down to single numbers or new waveforms that contain the essence of the information about the detailed waveforms. For example, a "square-wave" is really a detailed analog waveform. Measurement analysis allows the essence of the information contained in the waveform, such as rise-time, fall-time, pulse-width, duty-cycle, frequency, etc., to be extracted and used in further analysis, such as sensitivity analysis.

The measure analysis provides a qualitative and quantitative representation of the wave form or set of wave forms and may be compared to other measures to evaluate a number of simulation runs. From this point, the designer may select any or all of the analysis mechanisms which are provided, however, certain of the analysis mechanisms may be performed prior to others as set forth in FIG. 2.

A centering and tolerancing analysis 58 may be performed if desired. This is an optional analysis. The centering and tolerancing analysis allows a designer to establish reasonable tolerance limits for devices in the system. Design centering includes adjusting the design parameters of a design so that the result will provide the highest yield and reliability at the time of manufacture and over the life of the product. Design tolerancing is determining the largest allowable tolerance on parameters of a design such that the resulting design still meets yield and reliability goals at the time of manufacture and over the life of the product. An important assumption which is made in design tolerancing is that larger tolerances correspond to the use of less expensive components. Centering and tolerancing provides another performance indicator of design quality.

From the point of view of design optimization (57), the decision algorithms for design optimization operate in the feed-back mode. Optimization is similar to centering and tolerancing in that the system parameters are iteratively modified in an attempt to achieve desired system performance. Optimization is different, however, in that the "cost function" to be optimized is general purpose and the simulations need not be statistical in nature. Optimization may be used to modify the "nominal" system design parameters to maximize nominal functionality and to minimize cost, stress, noise, etc. The decision algorithms determine how the system performance is to be modified based on the results of previous simulations.

Center and tolerance analysis is closely related to a sensitivity analysis (SENS) 60, which provides information about how sensitive the system performance measures which have been specified are to variations in other devices in the system. Sensitivity analysis is intended to provide a tool that allows a designer to find out how sensitive circuit performance measures (see e.g., measurement analysis, block 56 herein) are to circuit parameters. For example, the designer may want to find out how sensitive the rise-time of a certain node is with respect to load capacitance. This is another indicator of design quality. Sensitivity allows a designer to select optimum part values and tolerances. The results are presented in sensitivity report 62, or display interface, examples of which are presented later herein as Reports 1 and 7. The analysis may be terminated at the end of this analysis, block 64, without ever performing any of the other analyses.

A worst case analysis (WCA), block 66, may be performed, providing still another design quality indicator, and a WCA report 68 may be generated as part of a display interface. As part of the WCA, worst case values for device parameters may be provided by a Monte Carlo analysis block 66a, an Extreme Value Analysis (EVA) block 66b or by a Root-Sum-Square analysis (RSS), block 66c. Blocks 66a, 66b and 66c are collectively referred to herein-as an iterating module, which is operable to systematically input a series of values into a template as device parameters. Appropriate computer code is provided in the templates to accept such iterations. Extreme worst case values for design performance measures can be determined by using the EVA. Part values are varied within their tolerance ranges to find the combination of values that result in a maximum and a minimum value, or indicator of design quality, for each design performance measure. This information is then used to set up conditions for an EVA stress analysis. The EVA stress analysis determines which parts exceed their specifications under these worst case conditions. This information may be used, for example, to predict the effect of long term drift on a design.

Worst case analysis, block 66, allows a designer to determine the most adverse condition under which the system will still perform within acceptable limits. The Monte Carlo analysis generates histograms which depicts statistical distributions of a system performance simulation. The minimum and maximum worst case data points may be identified and the performance parameters of specific devices which resulted in such data points determined. The results Of such an analysis may be used, for example, to predict the manufacturing yield for a particular system and to identify which devices tend to contribute to failure of a system incorporating the devices.

Extreme worst case values for a particular system may be determined using EVA, block 66b. Device parameters are varied within their tolerance ranges, to find the combination of values which result in a maximum and a minimum value of a design performance measure for each system performance simulation. This information is then provided in a report, which is part of what is referred to herein as a display interface. The information is used to define device parameters which are used in an EVA stress analysis which will determine which devices exceed their specifications under worst case conditions. Such an analysis may be used, for example, to determine the effect of long term drift on a particular system. EVA reports are illustrated later herein as Reports 2, 3, 8 and 9.

A Monte Carlo (MC) analysis, block 66a, generates histograms showing statistical distributions of a design performance measure. The minimum and maximum worst case data points can also be identified and the part values that resulted in those data points determined. The results of MC analysis may be used, for example, to predict the manufacturing yield for a design and to identify the parts contributing to failures. It should be noted that report 68 may be generated solely from the MC analysis, which will provide the designer with information as to how the MC analysis provided a set of values to the component models. Further details of MC-WCA are provided later herein.

A Failure Modes and Effects Analysis (FMEA), block 70, may be performed to provide an indication of design quality and a report 72 generated, such as Report 10, later herein. FMEA causes parts to be failed in the design and then determines the effects of these failures on design performance measures. This analysis also determines which other parts in the design exceed their specifications as a result of the failures induced. Information provided by this analysis may be used, for example, to optimize a design for reduced cost of maintenance and repair.

The failure modes and effects analysis, block 70, causes simulated devices to be failed, and then determines the effects of such failures on the system performance. This analysis also determines which other devices in the system exceed their specifications as a result of the induced failures. Such an analysis may be used, for example, to optimize a system to reduce the cost of maintenance and repair thereof.

A stress analysis, block 74, may be performed and a report 76 generated therefrom. Samples of Stress Analysis Reports are depicted herein as Reports 4–6. It should be noted that stress analyses may be performed as an initial and/or stand-alone analysis, or may be performed after any of the other analyses. The purpose of a stress analysis is to determine, under simulated operating conditions, when a component in a design is operating outside of its intended Safe Operating Area (SOA). Over-stressing of parts is a common cause of failures in electro-mechanical systems.

The stress analysis allows a designer to specify a derating factor for a device and informs the designer as to which parts have exceeded their specifications or SOA when the derating factor is applied to all devices in the system. This type of analysis may be used, for example, to determine the effects of stress for end-of-life or radiation factors, and to tell a designer when a part is operating outside of its SOA. The results of a stress analysis are presented in stress report 76.

If it becomes apparent to the designer that the simulated design is defective, the design may be changed, block 78, and the analysis run again. Such change may simply involve changing the quantitative value set for a template, effectively changing a real-world part, or may involve changing a template, thereby selecting a different kind or quality of part.

Measurement, also referred to herein as measurement or performance measurement, and stress analyses are all post-simulation processes, and are performed after simulation is completed. Sensitivity analysis, however, requires one nominal simulation and an additional simulation for each parameter which is undergoing sensitivity analysis. Sensitivity analysis, therefor, may significantly increase simulation time, while the other analyses take place in a relatively short time after simulation is completed. WCA and FMEA will affect simulation time, and the result may be to lengthen or shorten simulation time, depending on whether the situation being simulated complicates the system being analyzed, or whether the situation being simulated causes the system to malfunction and quit.

Templates are discussed in the above cited patents. The analysis mechanism of the invention requires the rewriting of templates to include specific computer language code to implement the features described herein. Additionally, specific commands are incorporated into simulator 37 to invoke the features incorporated into the rewritten templates. To further describe the improved analysis mechanism of the invention, the following example depicts a template for a capacitor as provided in the hardware description language (HDL) of the system performance simulator described in the '780 patent (identification and explanation of the code elements and terms for the following Template 1 and for the later-described Template 2, which incorporates the enhanced HDL of the invention, will be provided in the portion hereof in which the various analysis mechanisms are more fully described):

TEMPLATE 1

```
element template c p m = c
# . . . declaration of connections:
electrical p,m
# . . . declaration of arguments
number c = undef                  # Capacitance
#+++++++++++++++++++++++++++++++++++++++++++++
#Start of definition
{
# . . . Quantities useful for output:
val v v                           # Total Capacitor voltage
val q q                           # Capacitor charge
#+++++++++++++++++++++++++++++++++++++++++++++
values }
      # . . . Definition of output quantities:
      v = v(p) – v(m)
      q = cap*v
      }
#+++++++++++++++++++++++++++++++++++++++++++++
equations }
i(p->m) += i
      i: 0= i – d_by_dt(q)
      }
}
```

The following is a template for a capacitor which includes the extraction mechanism of the invention which provides for extracting indicators of design quality during or following a simulation. Comments which form a part of the template are preceded by a #.

TEMPLATE 2

```
element template c p m = c,rleak,tnom,rating,cqtol,rth,
                        part_type,part_class,fvolt,tau
# . . . declaration of connections:
electrical p,m
# . . . declaration of arguments
                                        # (the following section is provided for stress and
                                        # failure analysis)
      number      c = undef             # Capacitance
                  rleak = inf,          # Parallel leakage resistance
                  tnom = 27,            # Nominal temperature
                  rth = undef,          # Thermal resistance
                  fvolt = undef,        # Breakdown voltage
                  tau = 1m              # Filter timeconstant
      external number temp    # Temperature in °C.
                                        # (the following section is the part ratings used
                                        # in the stress analysis)
      struc {
                  number    vmax = undef      # Maximum forward voltage
                            vrmax = undef     # Maximum reverse voltage
                            tjmax = undef     #Maximum junction temperature
            }     ratings = ( )
```

TEMPLATE 2-continued

```
                                      # (the following section is included for variation,
                                      # sensitivity analysis, EVA, WCA and OPTI)
struc {
        number    init = 0            # Initial tolerance
                  eol = 0             # End of Life tolerance
                  tgrade = 0          # Temperature gradient
        } cqtol = ( )
                                      # (the following section is included to assist in
                                      # generating the reports)
string part_type = "capacitor",       # Type of device
part_Class = "generic"                # Class of the device
#+++++++++++++++++++++++++++++++++++++++++++++++++++++
# Start of definition
{
<varg.sin                             # (varg.sin is an appended file, and is presented at
                                      # the end of this template)
struc varg    c_varg                  # Capacitance variation structure
# . . . Quantities useful for output:
val v v,                              # Total Capacitor voltage
vabs                                  # Absolute value of capacitor voltage
val q q                               # Capacitor charge
val i ileak                           # Leakage current
number    cap                                     # Effective value of capacitance
          cchag=c*(cqtol->failchange),            # Value for change
          temp_tol,                               # Temperature Tolerance
          c_min,                                  # Minimum capacitance
          c_max                                   # Maximum capacitance
                                                  # (the following section includes failure values for
                                                  # the template)
number    is_open,       # Indicates the capacitor is failed "open"
          is_short,      # Indicates the capacitor is failed "short"
          is_change,     # Indicates the capacitor is failed "change-value"
          is_leak,       # Indicates the capacitor is failed "leak"
          is_failed      # Indicates one of the failure modes is active
#+++++++++++++++++++++++++++++++++++++++++++++++++++++
parameters
# . . . Variation Handling
        # . . . Determine temperature tolerances
        temp_tol = cqtol->tgrad*(temp-cqtol->tnom)
        if (temp_yol<0) temp_tol = 0
        # . . . Determine c tolerances
        c_min = c*(1-cqtol->init)*(1-cqtol->eol)*(1-temp_tol)
        if (c_min <0) c_min = 0
        c_max = c*(1+cqtol->init)*(1+cqtol->eol)*(I+temp_tol)
        c_varg->nominal = c
        c_varg->min = c_min
        c_varg->max = c_max
        c_varg->init_tol = cqtol->init
        c_varg->eol_tol = cqtol->eol
        c_varg->temp_tol = temp_tol
        cap = variation (c,c_varg)
# . . . Failure Handling
        is_short = 0, is_open 0, is_leak = 0, is_change = 0,
        if (failure(short)) {
                is_short = 1;
                message ("Failure: short %",instance( ))
        else if (failure (open)) {
                is_open = 1;
                message ("Failure: open %",instance( ))
                }
        else if (failure(leak)) }
                if (==undef) {
                message ("Must define releaks %", instance( ))
                }
        else {
                is_leak = 1;
                message ("Failure: leakage %",instance( ))
                }}
        else if (failure(change)) {
                is_change = 1;
                cap = cchag;
                message ("Failure: change value %",instance( ))
                }
        is_failed = is_short | is_open | is_leak | is_change
}
#+++++++++++++++++++++++++++++++++++++++++++++++++++++
values }
        # . . . Definition of output quantities:
        v = v(p) – v(m)
```

TEMPLATE 2-continued

```
        vabs = abs(v)
        q = cap*v
        }
when (threshold(vabs,fvolt) & (fvolt -= undef) & time_domain & ~(is_failed)) {
schedule_failure(time,short)
        }
control_section }
        # ... device type and class
        device_type(part_type,part_class)
        # ... variation spec
        variation_spec (c,c,"Capacitance")
        # ... failure modes
        failure_mode(change,change,"Capacitor change value",025,undef)
        failure_mode(open,open,"Capacitor opened",025,inf)
        failure_mode(short,short,"Capacitor shorted",025,0)
        failure_mode(leak,leak,"Capacitor leakage",025,undef)
        # ... Stress measures
        stress_measure(vmax,voltage,"Max Fwd Voltage",v,max,vmax)
        stress_measure(vrmax,voltage,"Max Rev Voltage",-v,max,vrmax)
        stress_measure(tjmax,temperature,"Max Temperature",temp,max,tjmax)
        # ... General Purpose Transformations
        transform (vfilt,voltage,"Sliding average capacitor voltage",v,filler,tau)
        # ... General Purpose Measures
        measure (vrms,voltage,"RMS capacitor voltage",v,rms)
        measure (vfiltmax,voltage,"maximum capacitor vfilt",vfilt,max)
}
#++++++++++++++++++++++++++++++++++++++++++++++++++++++
                                # (the equations section accounts for short,
                                # open and leak of the capacitor)
equations {
i(p->m) += i + ileak
        i: 0= is_open*i + is_short*v + (1 - is_open) * (1 - is_short)*i - d_by_dt((1 -
        is_open)*(1 - is_short)*q)
        ileak: 0= is_leak*v - rleak*ileak
        }
}
```

The following is a declaration for the argument C_varg which is passed to the variation () function in the preceding template. This function allows communication of tolerance information from the template descriptions 24 to the decision algorithms 42.

```
<distrib.sin
struc varg {
    number   nominal;    # nominal value
    number   min;        # minimum value
    number   max;        # maximum value
    number   init_tol;   # initial tolerance
    number   eol_tol;    # end of life tolerance
    number   temp_tol;   # temperature tolerance
    number   temp;       # actual temperature
    number   temp_n;     # nominal temperature
    }
```

As evidenced by the code presented in Template 2, the template written in the enhanced HDL which is used with the analysis mechanism of the invention includes a much more complete description of the behavior characteristics of a particular physical entity, or part. Additional statements are included in the enhanced code to describe the behavior of a part or device and to provide for analysis of such parameters as leakage resistance, consideration of junction temperature of the part, temperature gradient and end of life tolerance.

The template for the capacitor contains the specific instructions as to the behavior of the capacitor if, for instance, the capacitor has failed open or short, if its value changes or if it is determined to have a "leak". The behavior of the capacitor is also defined for changes of temperatures. The control section of the template contains instructions which are incorporated into various reports which describe the behavior of the specific capacitor. The equations are enhanced to provide a mathematic description of failure or altered behavior of the capacitor. The simulator becomes aware of the different behaviors, such as failure, of the modeled or represented part or device. The simulator then takes action, or instructs the template to take action, to implement a particular set of instructions contained in the template to properly represent the altered behavior of the part or device.

Collectively, the enhanced HDL provides a behavior protocol in the templates, which is a part of the extraction mechanism computer code segment which resides in the templates, and which represents the behavior characteristics of a device or part when the device or part is operated in the simulator in accordance with a predefined parameter set. In the preceding template, the available behavior characteristics of the capacitor device are the stress measures (vmax, vrmax, and tjmax), the general purpose transforms (vfilt), and the general purpose measures (vrms, vfiltmax). The predefined parameter set includes environmental and conservation properties, and also includes designer-definable performance parameters, includes the value sets from block 26, and any other valid performance parameters which may be incorporated into the templates for simulating the system. A command protocol portion of the extraction mechanism code segment resides in simulator 37, and will now be described.

MEASURE COMMAND

The measure command, which is a part of the measure analysis of block 56, extracts a scalar quantity from a specified waveform or waveforms in a given plotfile. The command includes many typical measurement functions as well as providing the designer with the ability to define other specific measurement functions. Where applicable, the command works with analog, event-driven and digital waveforms.

To accomplish the above requirements, appropriate code is incorporated into simulator 37 which allows the simulator to recognize a measure command. Before describing the syntax of the measure command, some concepts of pulse characteristics and pulse measurement must be understood.

Pulse Characteristics

Figure 3:
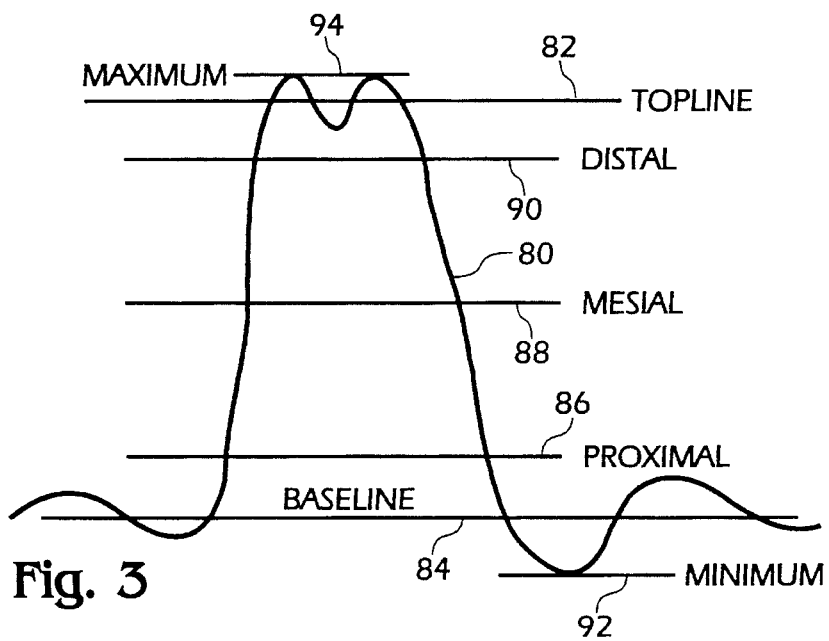
FIG. 3 is a representation of an analog waveform in an algorithmic environment as used by the measure analysis of the invention.

Consider the analog waveform 80 shown in FIG. 3. To determine quantities such as the risetime, falltime, duty-cycle, etc., upper and lower reference levels are required. The IEEE defines these levels as a topline 82 and a baseline 84, respectively. They are a function of the waveform and cannot be set by the designer. The IEEE suggests several algorithms for determining reference levels, and such algorithms are described later herein. Once topline 82 and baseline 84 values are determined, three additional levels may be defined: the proximal (lower) 86, mesial (middle) 88, and distal (upper) 90 levels. These levels are determined relative to the difference between the topline and baseline:

mesial=baseline+(topline−baseline)*MESIAL proximal=baseline+(topline−baseline)*PROXimal distal=baseline+(topline−baseline)*DISTAL The equations above indicate that the mesial, proximal and distal levels are based on the designer specified parameters MESIAL, PROXimal and DISTAL. If a designer changes the value of these parameters from their defaults, the designer will typically choose values between 0 and 1. A value of 0 corresponds to the baseline and a value of 1 corresponds to the topline. Values outside of this range are allowed, provided the following condition is satisfied:

minimum<proximal<mesial<distal<maximum where minimum and maximum 94 are, respectively, the lowest and highest points on the waveform and proximal 86, mesial 88 and distal 90 are the values calculated from the three equations above.

Figure 4:
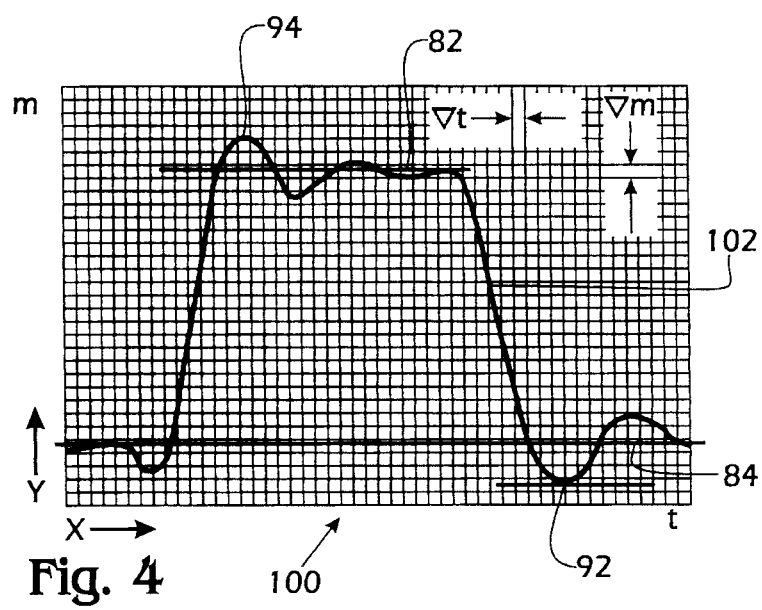
FIG. 4 is a representation of the IEEE post characteristic standard, showing a wave form and xbins and ybins.
Figure 4A:
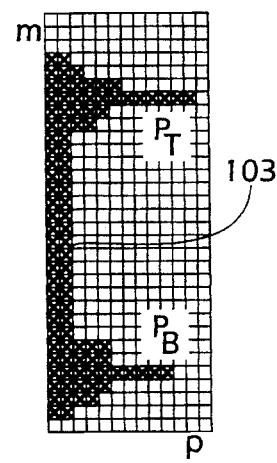
FIG. 4a is a representation of a probability density histogram as used by the measure analysis.

In the case of analog and event-driven signals, the designer can select between two methods to calculate the baseline and topline levels. The first method uses a probability density histogram, shown in FIG. 4 generally at 100, where the signal is sampled at a number of equally spaced points along the x-axis. The y-axis is equally divided into a number of bins and a count of the number of sampled points that fall within each bin is determined. Starting from midway between the maximum 92 and minimum 94 values, the algorithm searches up to find the y-axis bin with the most points. The midpoint of this bin is used as the topline level. In the case where two or more bins contain the same number of points, the upper most bin is used as the topline level. The baseline level is found the same way by searching down from the mid level. In the case of a tie, the lower bin is used as the baseline level. FIG. 4, taken from the IEEE Pulse Characteristic Standard, shows a waveform 102 and the xbins and ybins values as well as the probability density histogram 103 in FIG. 4a. The figure shows 51 equally spaced sample points along the x-axis and 26 equally sized bins along the y-axis. The bins above the maximum level and below the minimum level of the waveform are not included in the ybins count.

The binning method is best suited for signals with undershoot and overshoot from the low and high levels. As an alternative to the binning method, the topline and baseline levels can be set equal to the minimum and maximum levels of the waveform, respectively.

In the case of digital signals, the topline 82 and baseline 84 levels are set to logic 1 and logic 0 respectively. Since transitions of digital waveforms occur in 0 time, the proximal, mesial and distal levels do not apply. However, when required for the explanation of how a waveform operations works on digital signals, a mesial level halfway between logic 0 and logic 1 can be assumed.

Measure Command Syntax

Returning now to the measured command, the syntax for the computer code segment of the extraction mechanism for the measure command protocol is:

MEASure waveform_operation waveform_operation_variables-(measure_variables)

The possible waveform_operations and their variables are described later herein. The measurement variables are identified in Table 1 below, and definitions for the measurement variables follow.

TABLE 1

Measurement Variables

| Variable | Value | Default |
|---|---|---|
| PFIN | filename | last pfile produced |
| CNames | curve_name | no default |
| XRange | all | real1 real2 | comp real1 real2 (real2 > real1) | all |
| YTrans | none | mag | log | db | real | imag | phrad | phdeg | cphrad | cphdeg | depends of operation |
| RNames | register_name | no value (name internally generated) |
| PFOUT | _ | filename | — |
| REFCName | curve_name | no default |
| COUNT | integer | last [rise | fall] [same | opposite] (integer >= 1) | last |
| PROXimal | real (no limits) | 0.1 |
| MESIAL | real (no limits) | 0.5 |
| DISTAL | real (no limits) | 0.9 |
| XBINS | integer (>= 2) | 1001 |
| YBINS | integer (>= 1) | 1001 |

PFIN: specifies the name of the pfile to use as input. By default, the last generated pfile is used.

CNames: specifies the name of the curve or the template transform specification on which to make the measurement. Only one curve can be specified and wildcards are not permitted. No default CName is specified.

XRange: specifies the range of the X variable to use for the measurement calculation. By default, XRange is set to ALL which means the entire waveform is used.

YTrans: specifies a transformation to apply to the input signal before the operation is performed. For most waveform operations, the default value is None. Those operations with a different default are indicated with the descriptions below. The YTrans variable does not apply to digital waveforms.

RNames: specifies a single register name in which to keep the results of the measurement. The register is only needed when the measure command is run within a looping command. In this case, the default register name is internally generated by the measure command.

PFOUT: specifies the name of a plotfile which will be generated by the measure command. Specifying an output plotfile is useful when the measure command is run with an input plot file generated from a loop command (VARY of MC). The plotfile contains the results of the measure command for each iteration of the loop. By default, an output plotfile is not generated.

REFCName: specifies the name of the reference curve which must be contained in the file PFIN. To include analog curves from a different circuit, a plot file source (pfsrc) may be added to the circuit. The reference curve is only required for certain operations, which are identified below.

COUNT: is used to select a location on the curve where the measurement is to be taken. For example, if COUNT is set to 2 and the risetime is being measured, measure will return the risetime of the second rising edge of the specified CName (within the specified XRange). Similarly, if the dutycycle is being measured, the measurement will begin with the second edge (rising or falling) of the waveform. Integer values for COUNT must be greater than or equal to 1. Rather than an integer, the value LAST can be given, in which case the measurement will be applied to the last occurrence of the waveform. The COUNT value can be followed by the optional keywords RISE or FALL to select a type of edge for the COUNT (i.e., 3 RISE will take the third rising edge). If neither RISE nor FALL are specified, COUNT does not differentiate between the type of edge. Further details of how the COUNT variable works are given with the description of the different operations. The default value for count is LAST.

PROXimal: is a value, typically between 0 and 1, used to specify the lower measurement level of the signal. The default value is 0.1 which corresponds to a level 10% above the baseline, relative to the difference between the topline and the baseline. The PROXimal variable does not apply to digital waveforms.

MESIAL: is a value, typically between 0 and 1, used to specify the middle measurement level of the signal. The default value is 0.5 which corresponds to a level midway between the baseline and the topline. The MESIAL variable does not apply for digital waveforms, however, for those waveform operations where it is required, a mesial level half way between logic 0 and logic 1 can be assumed.

DISTAL: is a value, typically between 0 and 1, used to specify the upper measurement level of the signal. The default value is 0.9 which corresponds to a level 90% above the baseline, relative to the difference between the topline and the baseline. The DISTAL variable does not apply to digital waveforms.

XBINS: specifies the number of points along the x-axis, within the specified xrange, at which the waveform is sampled. The sampling is at equal intervals, unless the x data is logarithmically spaced (as in the case of an AC analysis), in which case the sampling is at logarithmic intervals. The xbins value is used to calculate the baseline and topline levels of the waveform. The xbins value must be greater than or equal to 2. The default value is 1001. The XBINS variable does not apply for digital waveforms.

YBINS: specifies the number of bins to use along the y-axis for the calculation of the topline and baseline levels. The bins are equally sized unless the y-data is logarithmic (i.e., if YTrans is dB), in which case the bins are logarithmically sized. Specifying a ybins value of 1 specifies that the topline and baseline levels are to be set to the maximum and minimum values of the waveform (within the specified xrange). The default YBINS value is 1001. The YBINS variable does not apply to digital waveforms. The following are examples of measure command syntax:

meas risetime (cn out)

meas overshoot 4.4 (cn out, pfin tr, xrange 1 m 2 m)

Note that the first line shows a waveform operation (risetime) and a single measurement variable for the curve name (cn out). The second line includes the waveform operation (overshoot), a waveform variable (the value 4.4) and several measure variables (cn out, pfin tr, xrange 1 m 2 m).

Waveform Operations

The measure command requires the specification of a waveform operation. The waveform operations have been divided into four groups: low level, frequency domain, time domain and general. There are three valid types of waveforms:

A=Analog

E=Event-driven

D=Digital

The valid waveform operation variables, and the measure variables refcname (refcn), count (count), proximal (p), roesial (m), distal (d), xbins (xb) and ybins (yb), are required to use the measure syntax. Items in brackets ([item]) in the following tables are optional; if a value is not specified, the default value will be used.

Some of the operations use the concept of a measurement level (measlevel). This is the level where the measurement is to be made. For example, a highpass measurement may be done at a level 3 dB below the topline, an overshoot measurement may be made at an absolute level of 5 V, etc. To allow for these possibilities, the following syntax is provided for measlevel:

value
or
TOP|BASE|MAX|MIN|DISTAL|MESIAL|PROXimal
or
TOP|BASE|MAX|MIN|DISTAL|MESIAL|PROXimal +|−|*|/ value The measurement level may be specified as TOP−3 or MESIAL or 5 or MAX−1 or TOP*0.707.

TABLE 2

Low level Waveform Operations

| name | waveform type | waveform operation variables | measurement variables |
|---|---|---|---|
| BASEline | A, E, D | no variables | xb, yb |
| TOPline | A, E, D | no variables | xb, yb |
| MESIAL | A, E | no variables | m, xb, yb |
| DISTAL | A, E | no variables | d, xb, yb |
| PROXimal | A, E | no variables | p, xb, yb |
| INBAND | A | y1 y2 measlevel [X|Y] | count, m, d, p, xb, yb * |
| OUTBAND | A | y1 y2 measlevel [X|Y] | count, m, d, p, xb, yb * |

* Note: xbins and ybins are only required if the measurement level uses either the topline or the baseline. One of either the mesial, proximal or distal values is also required if they are used with the measurement level.

TABLE 3

Frequency Domain Waveform Operations

| name | waveform type | waveform operation variables | measurement variables |
|---|---|---|---|
| HIGHpass | A | [Frequency|MLevel][measlevel] | m, d, p, xb, yb * |
| LOWpass | A | [Frequency|MLevel][measlevel] | m, d, p, xb, yb * |
| BANDpass | A | [Bandwidth|Low|High|Center|Q|MLevel][measlevel] | m, d, p, xb, yb * |
| STOPband | A | [Bandwidth|Low|High|Center|Q|MLevel][measlevel] | m, d, p, xb, yb * |
| GDelay | A | x | no variables |
| PMargin | A | [DEGrees|RADians] | no variables |
| GMargin | | [DB|MAG] | no variables |

*Note: xbins and ybins are only required if the measurement level uses either the topline or the baseline. One of either the mesial, proximal or distal values is also required if they are used with the measurement level.

TABLE 4

Time Domain Waveform Operations

| name | waveform type | waveform operation variables | measurement variables |
|---|---|---|---|
| RMS | A, E | no variables | no variables |
| AVErage | A, E | no variables | no variables |
| FREQuency | A, E, D | no variables | count, m, d, p, xb, yb |
| PERIOD | A, E, D | no variables | count, M, d, p, xb, yb |
| DUTYcycle | A, E, D | no variables | count, m, d, p, xb, yb |
| RISEtime | A | no variables | count, m, d, p, xb, yb |
| FALLtime | A | no variables | count, m, d, p, xb, yb |
| SLEWrate | A | no variables | count, m, d, p, xb, yb |
| OVERshoot | A | [measlevel] | m, d, p, xb, yb* |
| UNDERshoot | A | [measlevel] | m, d, p, xb, yb* |
| SETTLE | A | yband | no variables |
| PULSEwidth | A, E, D | no variables | count, m, d, p, xb, yb |
| DELAY | A, E, D | no variables | refcn, count, m, d, xb, yb |
| FORMfactor | A, E | no variables | no variables |
| CRESTfactor | A, E | no variables | no variables |

*Note: xbins and ybins are only required if the measurement level uses either the topline or the baseline. One of either the mesial, proximal or distal values is also required if they are used with the measurement level.

TABLE 5

General Waveform Operations

| name | waveform type | waveform operation variable | measurement variables |
|---|---|---|---|
| OPer_point | A, E | no variables | no variables |
| MAXimum | A, E | [X|Y] | no variables |

TABLE 5-continued

General Waveform Operations

| name | waveform type | waveform operation variable | measurement variables |
| --- | --- | --- | --- |
| MINimum | A, E | [X\|Y] | no variables |
| AMPlitude | A, E | no variables | xb, yb |
| PEAKtopeak | A, E | no variables | no variables |
| AT | A, E, D | x | no variables |
| THRESHold | A, E | measlevel | count, m, d, p, xb, yb* |
| CROSSing | A, E | [X\|Y] | refcn, count |
| XDIFFerence | A, E | y1 y2 | count |
| YDIFFerence | A, E | x1 x2 | no variables |
| LENGTH | A, E | x1 x2 | no variables |
| SLOPE | A | x | no variables |
| NORM | A, E | [L1\|L2\|LINF][measlevel] | refcn, m, d, p, xb, yb* |

Note: xbins and ybins are only required if the measurement level uses either the topline or the baseline. One of either the mesial, proximal or distal values is also required if they are used with the measurement level.

A detailed description of each waveform operation follows. Unless otherwise noted, all input data is assumed to be real. The type of input waveform (Analog signal, Event-Driven signal, or Digital signal) is also indicated with each operation.

AMPlitude: Returns the amplitude of a waveform.
AMplitude=TOPline–BASEline.
Analog and Event-Driven signals.

AT x: Returns the y value of a waveform corresponding to the given x value.
Analog, Event-Driven and Digital signals.

AVErage: Returns the average value of a waveform.
average=(1/T)*integral (waveform) where T is the duration of the waveform.
Analog and Event-Driven signals.

Figure 5:
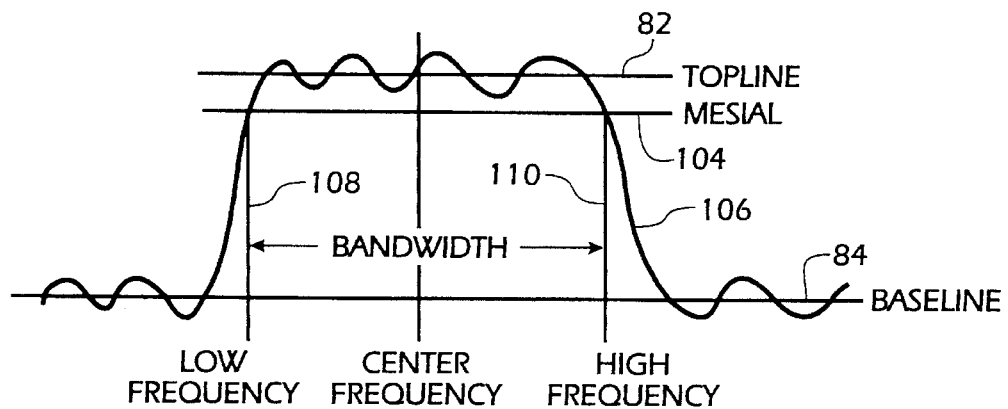
FIG. 5 is a representation of the BANDpass function of the measure analysis.

BANDPass [Bandwidth\|Low\|High\|Center\|Quality\|MLevel][measlevel]:
Referring now to FIG. 5, BANDPass returns either the Bandwidth, Low, High or Center frequency, the Quality factor, or the Measurement Level 104 corresponding to a waveform 106 with a bandpass shape. To determine the bandwidth, the points Low 108 and High 110 are found as the most extreme points on the curve such that all data points between low and high are above the measurement level 104. An error is reported if no points go above the measurement level. It is also an error if either the first or last data points are above the measurement level. By default, BANDPass returns the bandwidth using a measurement level of TOPline–3 and a YTransform of dB.

Center=sqrt(High*Low)
Quality=Center/Bandwidth

BASEline: Returns the baseline level of the signal. For an analog or event-driven waveform, the baseline level is either equal to the minimum level of the signal (if ybins=1) or is determined using the binning method (if ybins>1). For a digital waveform, the baseline level is logic 0.
Analog, Even-Driven and Digital signals.

CRESTfactor: Returns the crestfactor of a waveform.
CRESTfactor=MAXimum/RMS.
Analog and Event-Driven signals.

Figure 6:
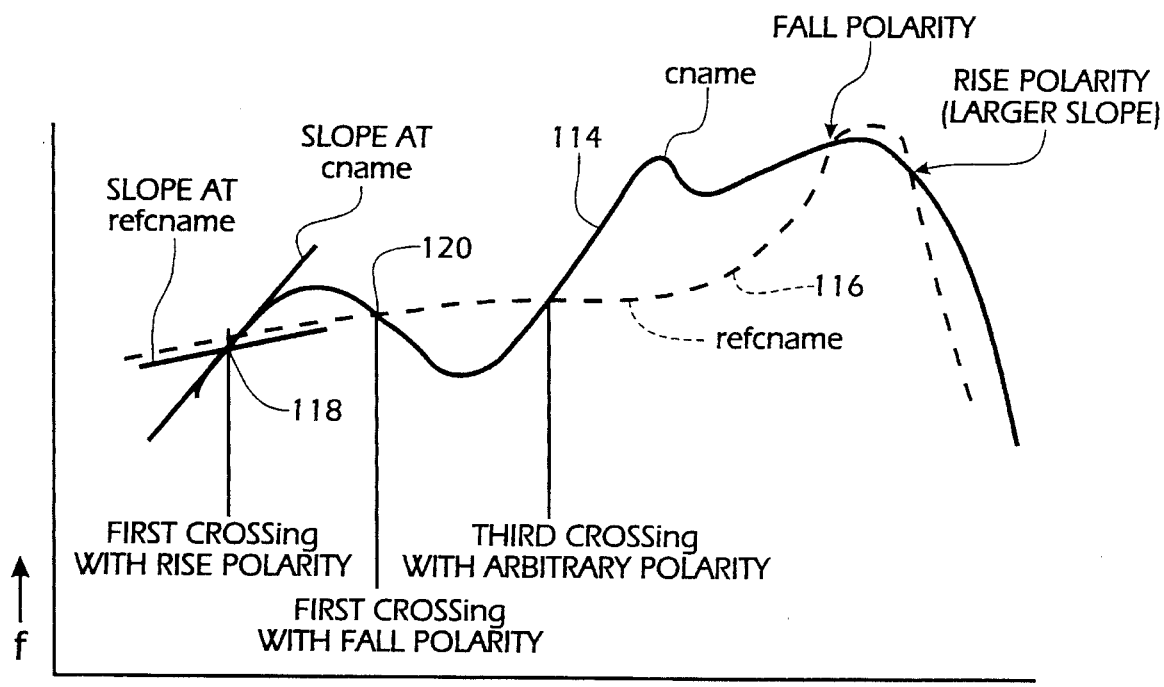
FIG. 6 is a representation of the CROSSING function of the measure analysis.

CROSSing [X\|Y]: Referring now to FIG. 6, CROSSing finds crossings of the measured waveform 114 (specified as cname) and the reference curve 116 (specified as refcname) and returns either the X or the Y value. The variable count allows the designer to select a particular crossing. The optional keywords RISE and FALL allow the selection of the slope difference between the measured 114 and the reference 116 curve. A rising crossing, such as shown at 118, is one where the measured curve has a larger slope than the reference curve. A falling crossing, such as shown at 120, is one where the measured curve has a smaller slope than the reference curve. In the case of waveforms with overlapping portions, the crossing points are the points where the overlap begins and ends. If a YTrans is specified, it applies to both the measured and the reference curve. An error is reported if the input and reference curve never cross or if they do not cross the number of times specified by the count variable. By default, the X value of the LAST crossing is returned Analog and Event-Driven signals.

DELAY: Returns the delay (along the x axis) between a particular edge on reference curve 116 (refcname), shown in FIG. 7, and the corresponding edge on measured curve 114 (specified as cname). It is assumed that the rising or fallTing edge on the reference curve causes the rising or falling edge on the measured curve, thus the reference edge occurs before the measured edge. The delay, such as shown at 122, is measured at the mesial level 88 of both curves. Note that the mesial level 88R of the reference curve may be different than the mesial level 88M of the measured curve. The variable count allows the designer to specify a particular edge (rising or falling) on the measured curve. From this edge, the algorithm searches backward to find an edge on the reference curve. The x difference between the two edges is the delay time. When searching backwards from the measured curve, there are three possibilities for how the edge on the reference curve can be selected. By default, the algorithm searches backwards and finds the first edge of either polarity on the reference curve. Alternatively, the designer can specify that the reference curve edge must have the "Same" or "Opposite" polarity as the measured curve edge. The delay shown at 122 may be identified as "5 RISE Same". As an example, assume that the delay time for an inverting amplifier is being measured. The designer may be interested in the delay of the fourth falling edge of the output curve (specified as cname). The count variable will be specified as "4 FALL Opposite", and is shown at 124. The keyword "opposite" implies that the reference curve edge must have the opposite polarity as the measured edge, which has been specified as the fourth falling edge. One or both of cname and refcname can be a digital waveform. If a YTrans is specified, it applies to both the measured and the reference curve (provided both curves are analog or event-driven—the YTrans variable never applies to digital waveforms). FIG. 7 illustrates several delay measurements. An error is reported if a search backwards from the measured curve edge does not find an edge of the correct polarity on the reference curve. An error is also reported if the edge specified by count does not exist on the measured curve. (for example, if the measured curve only has five edges and count is specified as the sixth edge.)

By default, a count value of LAST is used Analog, Digital and Event-Driven signals.

DISTAL: Returns the distal (upper) level of the waveform, as calculated with the following formula:

$$distal = baseline + (topline - baseline) * DISTAL$$

where DISTAL is the designer specified ratio, typically between 0 and 1. Analog and Event-Driven signals.

DUTYcycle: Returns the dutycycle of a waveform at the mesial level. Referring to FIG. 8, the dutycycle is calculated as the ratio of the time that the waveform is above the mesial level to the length of the period. The calculation of the period 126 is explained with the PERIOD operation. FIG. 8 indicates a dutycycle calculation when count is specified as 3 RISE, at 128. By default, the dutycycle of the last full cycle is measured Analog, Digital and Event-Driven signals.

Figure 9:
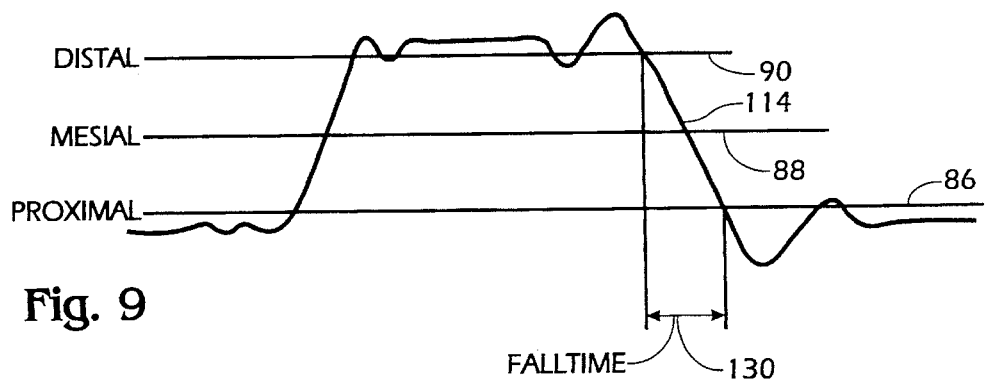
FIG. 9 is a representation of the FALLtime function of the measure analysis.

FALLtime: Referring now to FIG. 9, FALLtime returns the falltime 130 of a waveform between the distal 90 (upper) and proximal 86 (lower) levels. Specifying a number for COUNT allows the designer to measure the FALLtime of a particular falling edge; for example a COUNT of 3 measures the falltime of the third falling edge. The algorithm works by finding crossings of the waveform with the mesial (middle) level and searching backwards to the closest crossing with the distal level and forwards to the closest crossing with the proximal level. An error is reported if the waveform contains no falling edges or if the keyword RISE is used with the count variable. By default, the falltime of the last falling edge is measured. Analog signals.

FORMfactor: Returns the formfactor of a waveform. FORMfactor=RMS/AVErage.

Analog and Event-Driven signals.

FREQuency: Returns the frequency of a waveform at the mesial level 88. The frequency is calculated as the reciprocal of the period. The calculation of the period is explained with the PERIOD operation. By default, the frequency of the last complete cycle is measured.

Analog, Digital and Event-Driven signals.

GDelay x: Returns the group delay of a complex signal at a given x value. An error is reported if the input data is not complex or if a YTrans other than NONE is specified.

GDelay=-d(phase)/d(omega)

Analog signals.

GMargin [DEGrees|RADians]: Returns the gain margin of a complex signal. The gain margin is defined as the difference between the gain of the input signal and 0 dB at the frequency where the phase shift is -180 degrees. The gain margin is reported in dB or as a MAGnitude. An error is reported if the phase of the input waveform does not pass through -180 degrees, if the input data is not complex, or if a YTrans other than NONE is specified. It is not an error if the magnitude does not fall below 0 dB.

By default, the gmargin is returned in dB.

Analog signals.

HIGHpass [Frequency|MLevel][measlevel]: Returns the corner Frequency or the corresponding Measurement Level assuming a waveform with a highpass shape. The corner frequency is found by searching from right to left until the waveform first falls below the measurement level. An error is reported if the first data point is above or the last data point is below the measurement level. By default, highpass returns the frequency at a measurement level of TOPline-3 using a YTransform of DB.

Analog signals.

Figure 10:
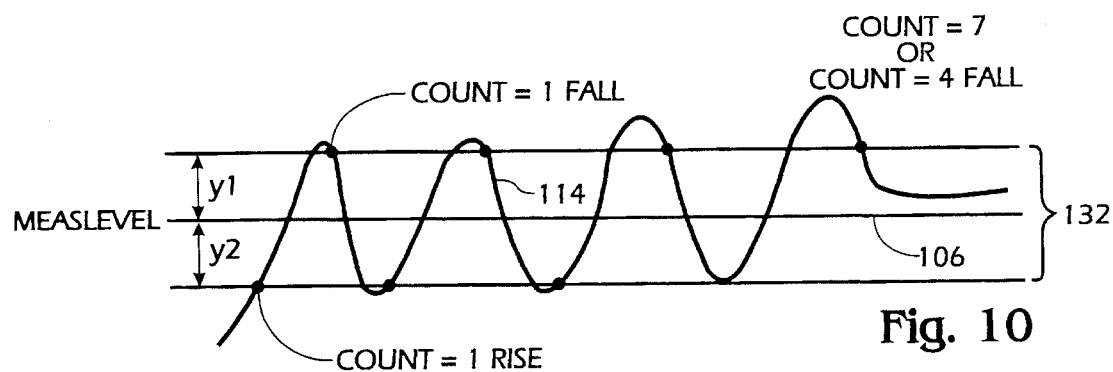
FIG. 10 is a representation of the INBAND function of the measure analysis.

INBAND y1 y2 measlevel [X|Y]: Referring now to FIG. 10, INBAND is a low level function used to find the point when a waveform 114 enters a specified band 132. The band is defined around the measurement level (measlevel) 106 which does not have a default. y1 and y2 are the offsets relative to the measurement level; they can take on any value including 0 and ±inf. The variable COUNT allows the specification of a particular entrance of the waveform into the specified band. The optional keywords RISE and FALL specify that the waveform must be rising (positive slope) or falling (negative slope) into the specified band. The designer can select between returning either the X or the Y value of the crossing of the waveform with the band. An error is reported if y1 and y2 have the same sign, if the waveform does not enter the specified band (this includes a waveform which is within the specified but doesn't leave and re-enter the band), or if the count value is greater than the number of times the waveform enters the band.

By default, inband returns the X value.

Analog signals.

LENGTH x1 x2: Returns the length of a straight line which connects the two points on a waveform defined by the values x1 and x2.

Analog and Event-Driven signals.

LOWpass [Frequency 1 MLevel][measlevel]: Returns the corner Frequency or the corresponding Measurement Level assuming a waveform with a lowpass shape. The corner frequency is found by searching from left to right until the waveform first falls below the measurement level. An error is reported if the first data point is below or the last data point is above the measurement level. By default, lowpass returns the frequency at a measurement level of TOPline-3 using a YTransform of DB.

Analog signals.

MAXimum: Referring to FIG. 3, MAXimum determines the maximum value 94 of a waveform 80 and returns that value if "Y" is selected or returns the corresponding X value if "X" is selected. In the case where the maximum value occurs at two or more points along the x axis, the point furthest to the right is returned as the X value.

By default, the Y value is returned.

Analog and Event-Driven signals.

MESIAL: Returns the mesial (middle) level 88 of the waveform 80, as calculated with the following formula:

$$mesial = baseline + (topline - baseline) * MESIAL$$

where MESIAL is the designer specified ratio, typically between 0 and 1.

Analog and Event-Driven signals.

MINimum: Determines the minimum value 92 of a waveform 80 and returns that value if "Y" is selected or returns the corresponding X value if "X" is selected. In the case where the minimum value occurs at two or more points along the x axis, the point furthest to the right is returned as the X value By default, the Y value is returned.

Analog and Event-Driven signals.

NORM [L1|L2|LINF][measlevel]: Referring to FIGS. 3 and 6, NORM returns the norm of a waveform with respect to either the measurement level (measlevel) 106 or a reference curve 116. If both a reference curve 116 and a measurement level 106 are specified, the algorithm uses the reference curve and ignores the measurement level. The calculation is performed by taking the specified norm of the difference between the measurement waveform (specified as cname) and either the measurement level or the reference waveform. For the case of a measurement level, the three norms are calculated as:

L1 norm: NORM=sum(abs(cname−measlevel))

L2 norm: NORM=sqrt(sum(cname−measlevel)**2)

LINF norm: NORM=max(abs(cname−measlevel))

Each norm is calculated on a point by point basis.

By default, the L2 norm is calculated using a measurement level of 0.

Analog and Event-Driven signals.

OPer_point: Returns the end point value of a waveform. When used with a DC analysis, this measurement will return the operating or DC value of the specified curve. Analog and Event-Driven signals.

Figure 11:
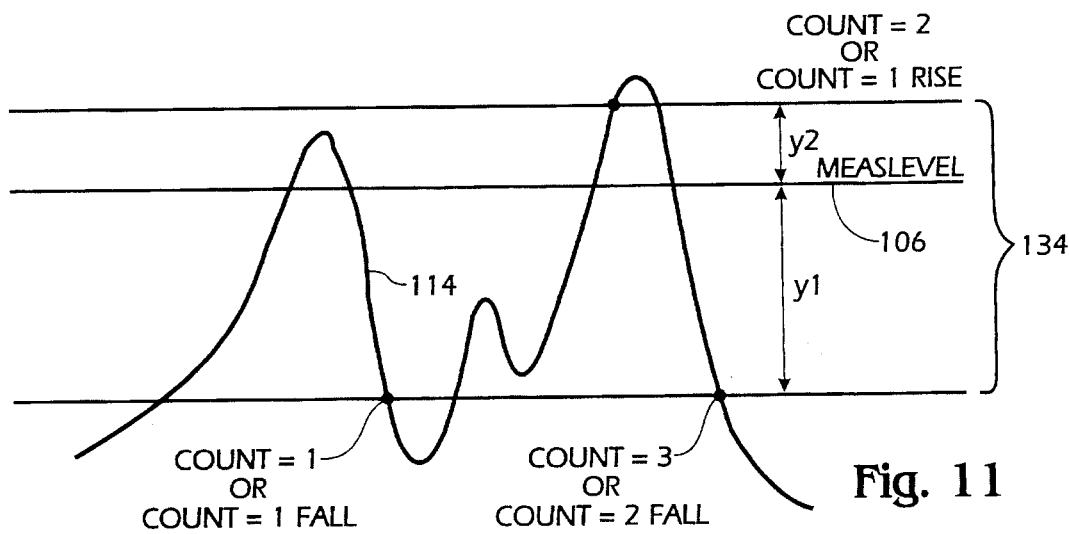
FIG. 11 is a representation of the OUTBAND function of the measure analysis.

OUTBAND y1 y2 measlevel [X¦Y]: Referring now to FIG. 11, OUTBAND is a low level function used to find the point when a waveform leaves a specified band 134. Band 134 is defined around the measurement level (measlevel) which does not have a default. y1 and y2 are the offsets relative to the measurement level; they can take on any value including 0 and ±inf. The variable COUNT allows the specification of a particular exit of the waveform out of the specified band. The optional keywords RISE and FALL specify that the waveform must be rising (positive slope) or falling (negative slope) when leaving the specified band. The designer can select between returning either X or the Y value of the crossing of the waveform with the band. An error is reported if y1 and y2 have the same sign, if the waveform does not leave the specified band, or if the count value is greater than the number of times the waveform exits the band.

By default, outband returns the X value.

Analog signals.

Figure 12:
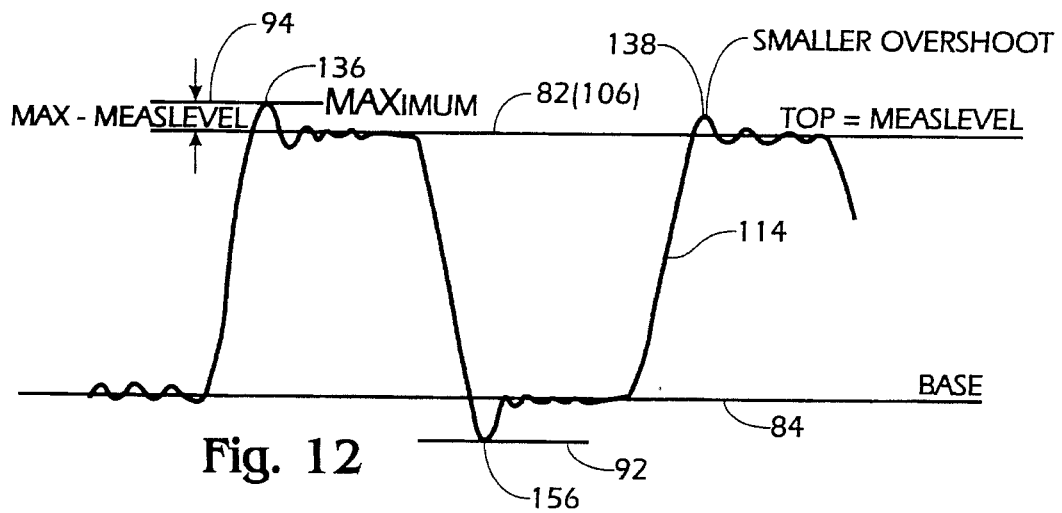
FIG. 12 is a representation of the OVERshoot function of the measure analysis.

OVERshoot [measlevel]: FIG. 12 illustrates an overshoot calculation. OVERshoot returns the overshoot 136, 138 of a waveform 114 relative to the measurement level. The overshoot is calculated as:

$$OVERshoot=(MAXimum-measlevel)/(TOPline-BASEline)$$

If the waveform contains more than one pulse, the largest overshoot 136 is reported. An error is reported if the waveform does not at least reach the measurement level.

By default, a measurement level equal to the TOPline is used.

Analog signals.

PEAKtopeak: Returns the peak to peak value of a waveform.

PEAKtopeak=MAXimum−MINimum.

Analog and Event-Driven signals.

PERIOD: Returns the period 126 of a waveform at the mesial level (FIG. 8). The period measurement requires that the rising 128 and falling 129 edges of the waveform be identified. This is done using the proximal 86, mesial 88 and distal 90 levels. A rising edge 128 starts below the proximal level 86 and rises through the mesial level 88 to a value above the distal level 90. Similarly, a falling edge 129 starts above the distal level 90, falls through mesial level 88 to a value below the proximal level 86. A specific period can be selected with the measurement variable, COUNT. A numeric value indicates that the period measurement is to begin with the "count" edge (rising or falling) of the waveform. Optionally, the keywords RISE or FALL can be specified after a numeric value to indicate that the measurement is to begin with the "count" edge of the indicated type. For example, if count is specified as "3 RISE", the algorithm looks for the third rising edge 128 of the waveform 114 and the period 126 is measured between this rising edge and the next rising edge. A COUNT value of "LAST" indicates that the period should be determined for the last complete cycle of the waveform. A count value of LAST followed by either the keywords RISE or FALL indicates that the period is to be determined for the last full cycle whose starting edge is rising or falling, respectively.

The default value for count is LAST.

Analog, Digital and Event-Driven signals.

PMargin [DEGrees¦RADians]: Returns the phase margin of a complex signal. The phase margin is defined as the difference between the phase of the input signal and −180 degrees at the unity gain frequency. The phase margin is reported in DEGrees or RADians. An error is reported if the magnitude of the input waveform does not pass through 0 dB, if the input data is not complex, or if a YTrans other than NONE is specified. It is not an error if the phase does not pass through −180 degrees.

By default, the pmargin is returned in degrees.

Analog signals.

PROXimal: Returns the proximal (lower) level 86 of the waveform, as calculated with the following formula:

$$proximal=baseline+(topline-baseline)*PROX$$

where PROX is the designer specified ratio, typically between 0 and 1.

Analog and Event-Driven signals.

Figure 13:
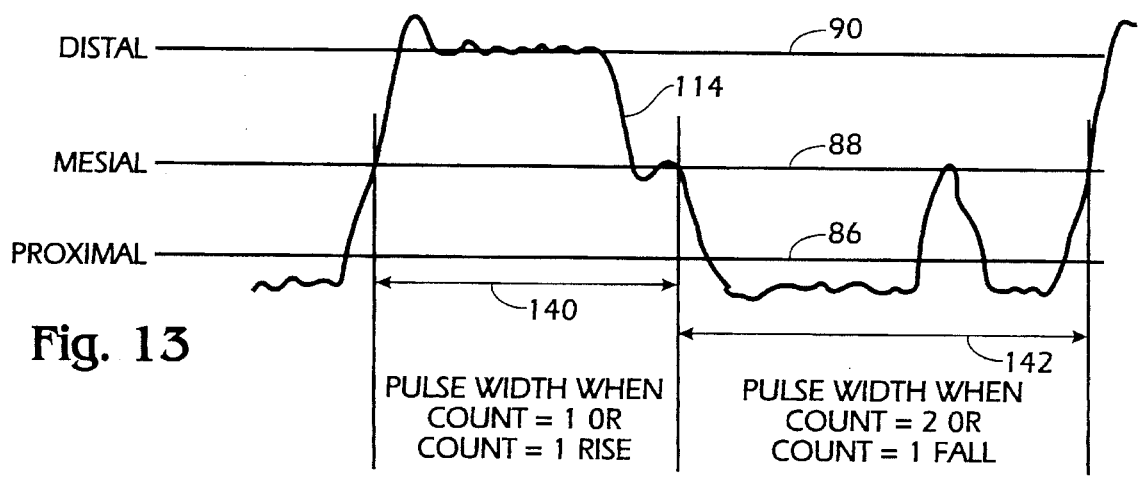
FIG. 13 is a representation of the PULSEwidth function of the measure analysis.

PULSEwidth: FIG. 13 illustrates a pulsewidth :measurement. PULSEwidth returns the width 140, 142 of a rising or falling pulse, where the width is measured at the mesial (middle) level 88. The variable COUNT allows the designer to select a specific edge within a pulse train to start the pulse measurement. For example, a count of "3 RISE" indicates that the measurement is to start at the third rising edge and determine the width until the next falling edge. To be considered for measurement, a pulse must rise above the distal level and fall below the proximal level.

By default, the width of the last pulse (rising or falling) is measured.

Analog, Digital and Event-Driven signals.

RISEtime: Returns the risetime of a waveform between the proximal (lower) and distal (upper) levels. Specifying a number for count allows the designer to measure the risetime of a particular rising edge; for example a count of 3 measures the risetime of the third rising edge. The algorithm works by finding crossings of the waveform with the mesial (middle) level and searching backwards to the closest crossing with the proximal level and forwards to the closest crossing with the distal level. An error is reported if the waveform contains no rising edges or if the keyword FALL is used with the count variable.

By default, the risetime of the last rising edge is measured.

Analog signals.

RMS: Returns the rms value of a waveform.

$$rms=(1/T) * sqrt(integral(waveform**2))$$

where T is the duration of the waveform.

Analog and Event-Driven signals.

Figure 14:
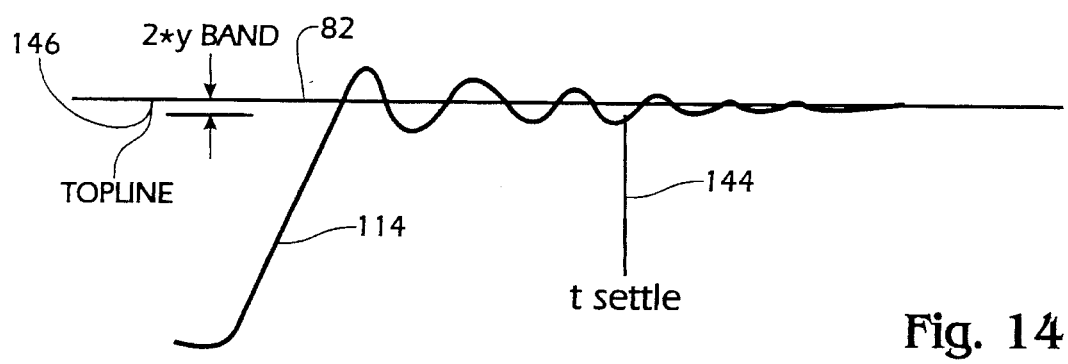
FIG. 14 is a representation of the SETTLE function of the measure analysis.

SETTLE yband: FIG. 14 illustrates the settle time measurement. SETFLE returns the settle time, tsettle 144, of a waveform 114. The algorithm defines a search band 146 of size 2*yband centered on either the TOPline 82 or the BASEline 84. The TOPline is used if the last data point falls within the range TOPline ±yband; the BASEline is used if the last data point falls within the range BASEline ±yband. An error is reported if the last data point does not fall within either of these ranges. Using the search band 146, the algorithm searches backwards from the last data point to find the first data point which is outside of the search band. The corresponding time is returned as the settle time.

Analog signals.

SLEWrate: Returns the slewrate of a rising or falling edge of a waveform. The variable count allows the designer to select a 5particular edge (rising or falling) of the waveform. To be counted, the edge must go above the distal level and below the proximal level..The slew rate is defined as the difference between the distal and proximal levels divided by the rise or fall time of the edge. The slewrate is positive for a rising edge and negative for a falling edge.

$$SLEWrate=(distal\_level-proximal\_level)/risetime$$

or $$SLEWrate=(proximal\_level-distal\_level)/falltime$$

By default, the slewrate of the last edge (rising or falling) is measured.

Analog signals.

SLOPE x: Returns the slope of a waveform at the given x value.

Analog signals.

STOPband [Bandwidth|Low|High|Center|Quality|MLevel][measlevel]: Returns either the stop Bandwidth, Low, High or Center frequency, the Quality factor, or the Measurement Level corresponding to a waveform with a stop-band shape. To determine the bandwidth, the points Low and High are found as the most extreme points on the curve such that all data points between low and high are below the measurement level. An error is reported if no points go below the measurement level. It is also an error if either the first or last data points are below the measurement level.

By default, stopband returns the bandwidth using a measurement level of:

TOPline–3 and a YTransform of DB.

Center=sqrt(High*Low)

Quality=Center/Bandwidth

Analog signals.

Figure 15:
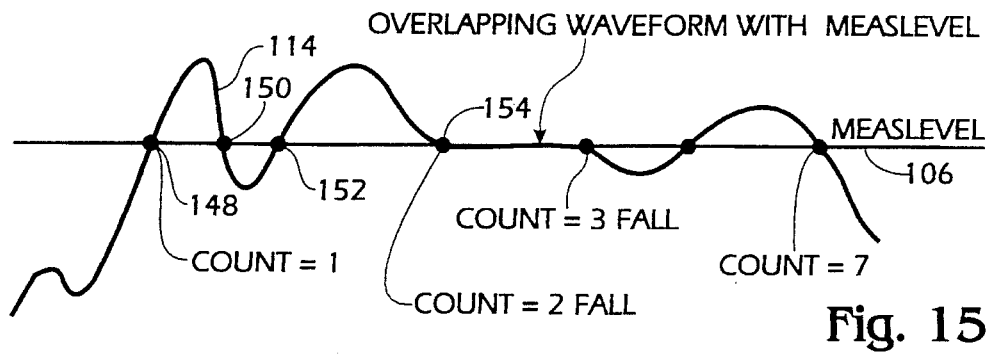
FIG. 15 is a representation of the THRESHold function of the measure analysis.

THRESHold measlevel: FIG. 15 illustrates several examples of threshold measurements. THRESHold returns the x value (THRESHold, 148, 150, 152, 154) of a waveform 114 corresponding to the given measurement level 106. In the case where the waveform crosses the measurement level several times, the variable count can be used to select a particular crossing. The optional keywords RISE and FALL allow the designer to select either rising or falling crossings with the measurement level. An error is reported if the waveform never crosses the measurement level or if the count value is larger than the number of crossings. The measurement level does not have a default value, but the default count value is LAST.

Analog and Event-Driven signals.

TOPline: Returns the topline level 82 of the signal, as shown in FIG. 3. For Analog and Event-driven waveforms, the topline level is either equal to the maximum level of the signal (if ybins=1) or is determined using the binning method (if ybins>1). For digital waveforms, the topline level is equal to logic 1.

Analog and Event-Driven signals.

UNDERshoot [measlevel]: Returns the undershoot 156 (FIG. 12) of a waveform relative to the measurement level. The undershoot is calculated as:

$$UNDERshoot=(measlevel-MINimum)/(TOPline-BASEline)$$

If the waveform contains more than one pulse, the largest undershoot is reported. An error is reported if the waveform does not go below the measurement level. By default, a measurement level equal to the BASEline 84 is used.

Analog signals.

Figure 16:
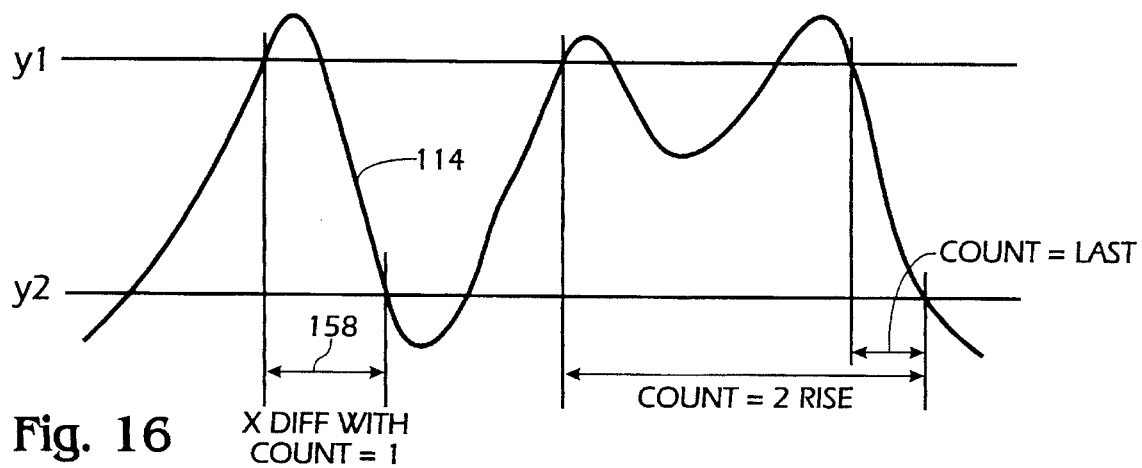
FIG. 16 is a representation of the XDIFFerence function of the measure analysis.

XDIFFerence y1 y2: FIG. 16 illustrates an xdifference measurement. XDIFFerence returns the X difference 158 in a waveform 114 given two y values. The algorithm finds the "count" crossing of the waveform with the y1 value and searches forward to find the next crossing with the y2 value. Count can be followed by the optional keywords RISE and FALL to select rising or falling crossings with the y1 level. Count does not apply to the y2 crossing. The y1 value can be less than or greater than the y2 value; it is even valid to specify y1=y2. An error is reported if the waveform does not cross both the y1 and the y2 levels, or if a y2 crossing is not found after the y1 crossing. The xdifference function cannot return a negative value. The default count value is LAST.

Analog and Event-Driven signals.

YDIFFerence x1 x2: Returns the Y difference in a waveform given two x values. An error is reported if the x1 and x2 values are outside of the range of the waveform, or if x2 is less than or equal to x1. The ydifference function cannot return a negative value.

Analog and Event-Driven signals.

In addition to the internally defined waveform operations, designers may define their own waveform operations or may select one or more measure specifications as defined within a template. Designer defined waveform operations receive, as inputs, the curve and reference curve data (including the number of points in each waveform), the value of the count variable, and the topline, baseline, proximal, mesial and distal levels for both curves. Output from the operation must be a single value. Designer defined waveform operations can be used either as an argument to the measure command or as an argument to the measure statement within a template.

Figure 30:
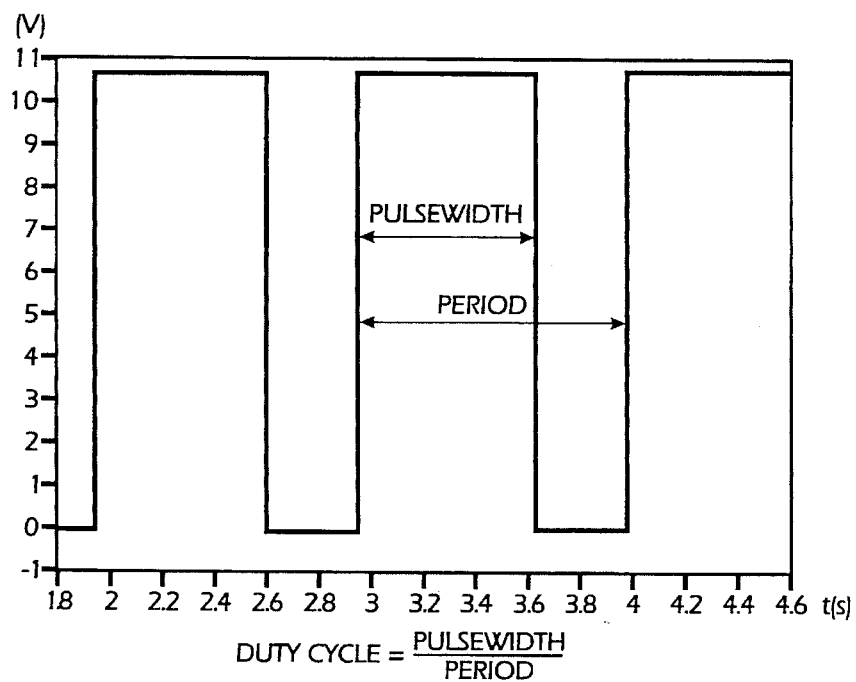
FIGS. 30, 31 and 32 are used herein to illustrate application of the performance measurement and analysis capabilities in the simulator of this invention.
Figure 31:
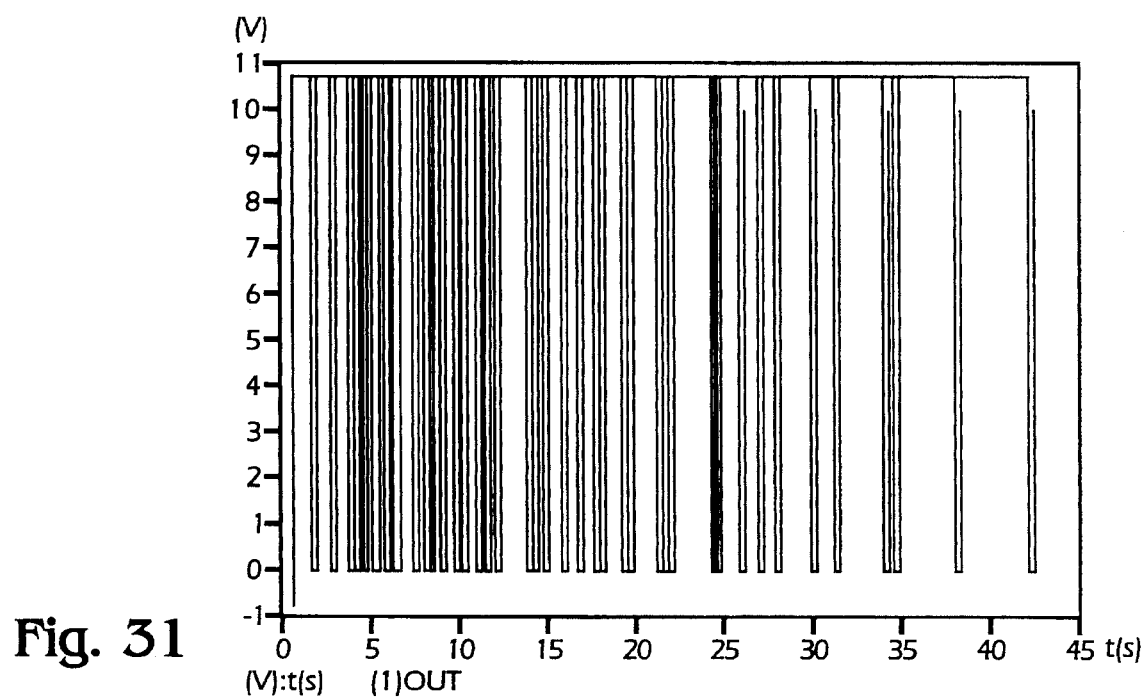
Figure 32:
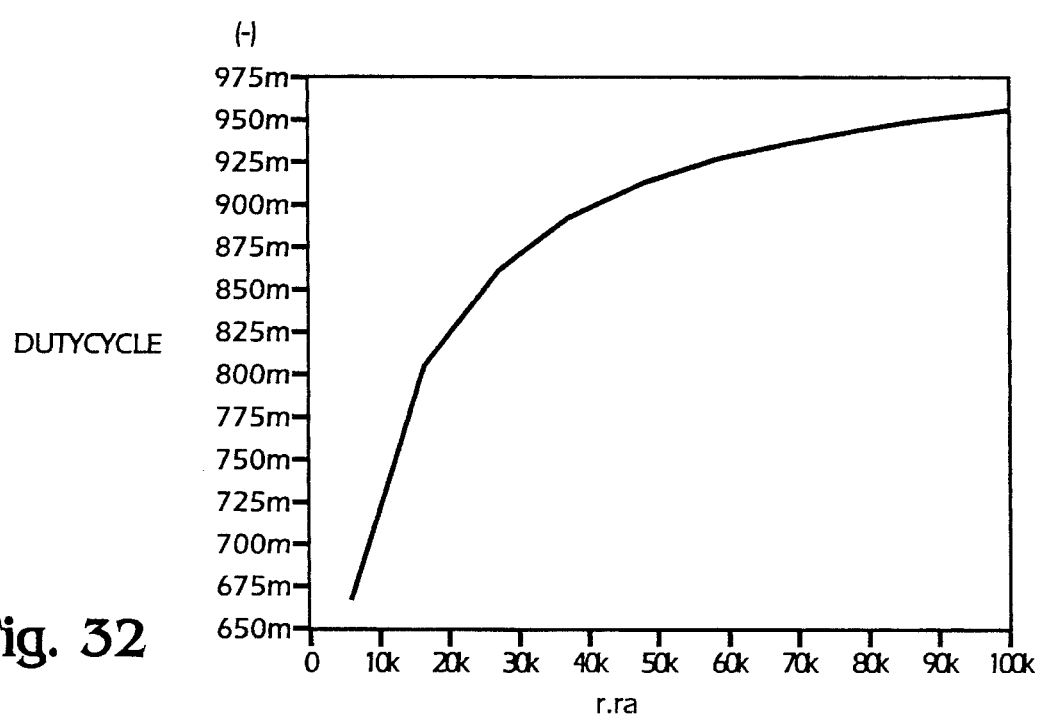

As was mentioned earlier herein, and specifically in connection with the brief descriptions of FIGS. 30, 31 and 32 in the drawings, these three figures illustrate use of the performance measure capability of the present invention. The plot or curve shown in FIG. 30 is of a relatively simple square-wave waveform. The dutycycle of this waveform is defined as the width of a pulse divided by the period, i.e., dutycycle=pulsewidth/period. The waveform depicted in FIG. 30 is for a particular circuit including a resistor which has, for example, the constant value of 5,000-ohms. This relatively simple curve is fairly easy to read for the assessment of dutycycle.

However, when one turns attention to the plot shown in FIG. 31, here what one sees is a plot of a fairly complex series of square waves. Each one represents, generically, the same circuit as that associated with the waveform pictured in FIG. 30, with the difference that the square waves shown in FIG. 31 result from different values of resistance for the resistor in the circuit. In particular, ten waveforms are shown in FIG. 31, with these resulting from resistor values varying from 5,000-ohms to 100,000-ohms. The relative complexity of this plot makes it difficult for one to draw any conclusions regarding, for example, the effect of the value of resistor mentioned on dutycycle.

FIG. 32 shows the result of using performance measurement analysis on the set of curves illustrated in FIG. 31. The performance measurement capability "measures" the dutycycle of each waveform for each value of resistance, and allows it to be plotted against the value of resistance. One can see from this FIG. 32 that it is quite easy to discern the effect of the value of the resistor mentioned on the resulting dutycycle.

Thus, and in general terms, the performance measurement capability of the system of this invention takes a large amount of raw data as its input, and produces more usable, easily readable and interpretable information as its output.

STRESS ANALYSIS

As previously noted, stress analysis allows a designer to calculate and display the amount of stress in a system. This analysis is useful not only for electrical circuits as has been demonstrated in the past, but also for systems that are characterized by a mix of technologies, such as electromechanical, electro-hydraulic, electro-thermal, mechanicalthermal, etc. It is possible to perform a stress analysis on the results of either a DC, a transient (TR), a DC-transient (DCTR), or a DC transfer (DT) analysis. Simulator 37 and the enhanced HDL have the functionality to allow specifications of maximum parts ratings.

The designer is able to apply derating to the manufacturer's maximum operating limits. The derating may be given as a fraction of the rated value (0.7*rating), as a new rated value (new_rating), or as an offset from the rated value (rating−25). It is possible to specify derating values for the entire design or subsystems in a design, for specific part types within a design or subsystem (i.e., all resistors), for classes of parts within a design or subsystem (i.e., all wirewound resistors), and for individual limits of parts (i.e., the maximum allowable temperature of a resistor).

It is possible to report the results of a stress analysis. The stress report 76 contains all relevant information about the stress analysis: the type of analysis (DC, TR, etc.) and the date when it was run, the name of the design file, any designer specified options, etc.

The stress command is implemented in such a way that after the intermediate data file (RFile) is generated, it is possible to generate a stress report 76 without the existence of the original simulation results.

The designer is able to specify the format for the stress report. This includes selection of the size of the page (lines and rows), which columns to display, the type of sorting and grouping to use, and the minimum stress ratio to report.

Stress for DC, TR, DCTR and DT Analyses

The stress command extracts data from the results of a previously run large signal analysis simulation. For a TR, DCTR or DT analysis, the results may be extracted from the dfile which is generated by default. This will not work for a DC analysis since a dfile is not generated by default. The preferred mode of overcoming this problem is to allow the stress command to operate on either a dfile or an ipfile, the latter of which is generated by default with a DC analysis.

Part Ratings

Part ratings define the maximum operating conditions for a part. These limits are typically specified by the manufacturer and are found in the template or component model with the description of the part. Although operating a part outside of its intended range of operation should be avoided, because such operation may alter the characteristics of the part and may even lead to premature failure, it is recognized that operation outside of the SOA occurs.

In many cases, a part's maximum rating is not constant, but rather varies as a function of the operating conditions of the device. For example, a ¼ W resistor can only dissipate ¼ watt below a particular ambient temperature. Above this temperature, the maximum allowable power dissipation drops linearly to 0 at the maximum operating temperature. A bipolar transistor (BJT) has a maximum power dissipation, maximum voltages and maximum currents, all of which may vary as a function of junction temperature, applied voltage, radiation, etc.

Figure 17:
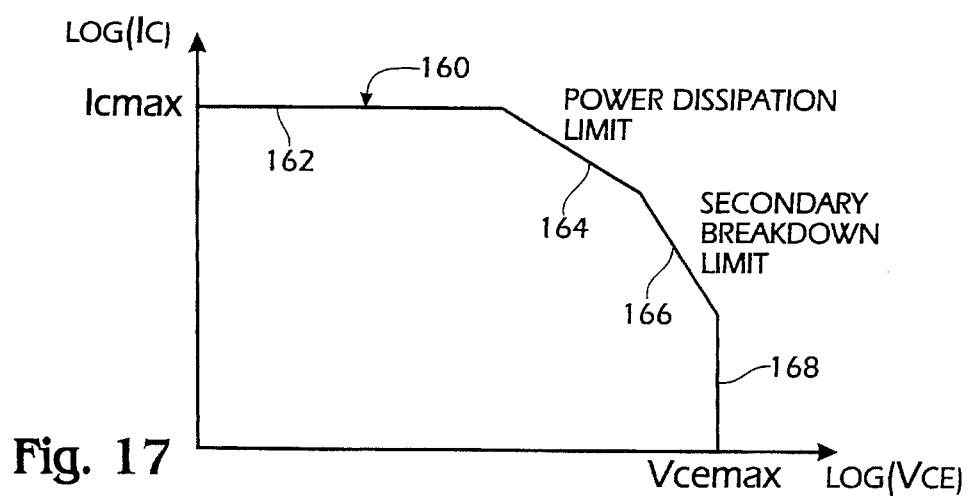
FIG. 17 is a representation of Safe Operating Area (SOA) curve for a bipolar transistor, as is used by the stress analysis mechanism.

FIG. 17 shows the maximum collector current 160 as a function of the collector-emitter voltage for a bipolar transistor. This curve is also referred to as an SOA (safe operating area) curve; for safe operation, the device must always operate within the boundaries of the curve. The individual segments of the curve correspond to different stress limits: maximum Ic 162, maximum power dissipation 164, secondary breakdown limit 166, and maximum Vce 168. Operating above any of these limits overstresses the transistor.

To determine the amount of stress on the transistor, the ratio of the collector current to the value of the SOA curve at the corresponding value of Vce must be calculated. Since Vce may change as the simulation progresses, the collector current must be compared to the SOA limit for all points of the analysis. The maximum ratio of the collector current to the SOA value is the stress ratio for the collector current of the transistor.

Allowing an arbitrary function for the rating of a part will add to the complexity of the stress calculation. As an alternative, if the rating curve is restricted to be piecewise linear, it is possible to separate the rating into individual segments which can each be used as single constant stress limits. In the case of the SOA curve shown in FIG. 17, four constant stress limits are required. The Icmax and Vcemax limits are simply single values. The power dissipation limit 164 can be handled by introducing a new variable for the power dissipation, Pd=Vce*Ic, which has a constant upper limit of Pdmax. The secondary breakdown limit 166 is also handled with the introduction of a variable which defines the equation of the secondary breakdown line shown on the SOA curve, $SB=V_{ce}*I_c^a$, where "a" is a constant depending on the slope of the secondary breakdown line. The maximum rating for secondary breakdown will be SBmax, which is a constant that can be determined from the SOA curve. Determination of the collector current stress will now require four stress ratio calculations. Each calculation is simplified, however, since all stress limits are constant.

This separation approach effectively eliminates the variability of the rating curve by introducing additional variables which have constant stress limits. The approach can be applied to any piecewise linear rating curve. In the case of the transistor SOA curve, the separation is easy to explain since each of the segments corresponds to a different physical limitation of the device. In some cases, however, the individual segments of the rating curve may not correspond to different physical limits.

Figure 18:
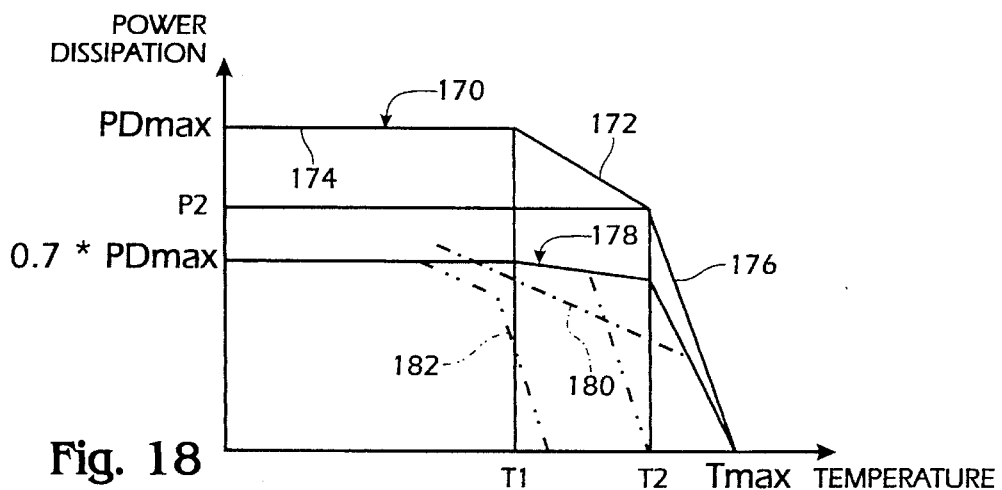
FIG. 18 is combined power rating curve and derating curve for a precision metal foil resistor, as used by the stress analysis mechanism.

FIG. 18 depicts a power rating curve 170 for a precision metal foil resistor. Using the separation approach, the rating curve of FIG. 18 is replaced with three constant stress limits. All limits relate to the power dissipation of the resistor. The first limit corresponds to the temperature independent power dissipation limit which has a maximum value of PDmax 174. The other two segments of the rating curve each require the definition of an additional variable. For the segment 172 between T1 and T2, the variable is defined as PD−mT, where PD is the resistor power dissipation, m is the slope of the line segment, and T is the resistor temperature. A similar variable is defined for the segment 176 between T2 and Tmax. Both of these variables have single constant upper stress limits. The separation of the rating curve into individual limits may be done within the template. If this is done, the designer may specify the breakpoints on the rating curve and the template will perform the separation.

Besides simplifying the implementation of the rating scheme, there is another important advantage to separating the rating curve into individual segments. It is related to the way derating is applied and is explained later herein. There are, however, two disadvantages to separating the rating curve: to apply derating specifically to the power dissipation of this type of resistor, the designer has to specify individual derating values for each segment of the curve. In addition, the stress report will show three separate stress ratios for the power dissipation, one for each segment of the curve.

Part Derating

For most applications, it is not advisable to design circuits that stress components to the manufacturer's maximum operating limits. If this is done, any drift in a component's value or a change in the ambient temperature may overstress one or more parts. To account for this possibility, the manufacturer's maximum operating conditions are often derated when a part is incorporated into a circuit. For example, a ¼ W resistor may be derated to 50% of its rated value, in which case it will be considered over-stressed if it dissipates more than ⅛ watt. Note that a derating value of 100% uses the rated value of the part.

Different derating values may be used depending on the application of the product. For instance, aerospace applications typically require that parts be derated more than for consumer electronics products (e.g., 30% derating for space applications vs. 70% derating for consumer electronics). For this reason, derating information should not be located in the template, but included in a special derating file, DERate.

Applying derating to a constant stress limit only requires changing the value and is thus a simple matter. Applying derating to an SOA type curve is not as simple, as illustrated in FIG. 18 for the precision metal foil resistor. If we assume a derating value of 0.7, we can draw many different derating curves; two possibilities are shown. Curve 178 is generated by scaling the rated curve to 70% of its value. Notice that above T1, the slope of the derated curve is different than the rated curve at 172. Also note that TMAX is unchanged by the derating. As an alternative, derating can be applied individually to each segment of the rating curve such that the slope is unchanged; this is shown as dot-dash curve 180. Note that T1, T2 and TMAX are all derated in this case. This latter approach is desirable for thermal curves, since the slope is typically related to the thermal resistance of the device and thus should not change with derating.

If the rating curve is separated into individual segments, the slope will automatically be maintained when derating is applied. In addition it is possible to derate each segment of the rating curve differently, which will be difficult to do if the rating curve was treated as a whole. This is illustrated in FIG. 18 by dash-double-dot line 182.

Stress Command

To provide the described stress analysis protocol, a stress command is added to simulator 37 as follows:

STRess (variables)
where the variables are defined as:

TABLE 6

| Variable | Stress Command Variables Value | Default |
|---|---|---|
| SMeasurelist | stress_limit_list | / . . . |
| DERate | _|filename | _(no derating) |
| RFile | Filename | stress |
| DFile | _|filename | last dfile |
| IP | _|initial_point_name | _ |
| XRange | ALL |real1 real2| COMP real1 real2 (real2 > real1) | ALL |
| WINSize | real (>0) | +inf |

SMeasurelist: specifies a list of stress measures for which the stress calculation will be performed. By default, the stress is calculated for all stress measures in the system (/ . . . ). To select a specific stress measure, the SMeasurelist must include the "id" given on the stress_measure line (see the definition for the stress_measure function, below).

DERate: specifies the name of the derating file to be used when calculating the stress ratios. By default, no derating file (_) is used which corresponds to 100% of the rating. Further details of the format for the derating file are described later herein.

RFile: specifies the filename in which to keep the intermediate results of the stress analysis. This is an ASCII file that is used with the stress report command to generate the stress report. By default, the results are stored in a file with a ".stress" suffix.

DFile: specifies the name of a data file which is to be used for the stress calculation. Typically this file will have been created from a DC, TR, or DCTR analysis, but it is possible to use an end point dfile created with a DC analysis. If both a dfile and an ip file are specified, the stress command ignores the dfile and uses the ip file. By default, the last dfile is used.

IP: specifies the name of an initial point file which is to be used for the stress calculation. Typically, this file will have been created by running a DC analysis. If both a dfile and an ip file are specified, the stress command ignores the dfile and uses the ip file. The default value for ip is "_", meaning that an ip file is not used.

XRange: specifies the range of values of the X variable that is to be used for the stress calculation. Three different forms are possible:

ALL real2 real2

COMPlement real1 real2

The first specification says to use all X values. The second specification says to include all X values between real1 and real2, inclusive. The third specification says to include all X values except those between real1 and real2. By default, XRange is set to ALL.

WINSize: specifies the size of a sliding window to use when calculating either the average or rms value of a stress_measure. As the window size is decreased, the average or rms value will approach the peak value for the waveform. By default, the window size is inf, which is the same as performing the calculation without a window.

Interfaces are provided to allow incorporation of the analysis mechanism into existing design products. In each interface, a STRESS item is added to the analysis menu/form.

Stress measure function

The syntax for the stress measure function is:

```
       stress_measure  (uid,gid,"name",val,measure,rating[, ref_rating])
where:
uid         identifies the stress measure (for example, pdmax).
gid         identifies a type or grouping of stress measures to which this stress
            measure belongs (for example, power).
name        is the text to be used to describe this stress measure in a stress report
            (for example, "Max Power Diss."). Limited to 18 characters.
val         is the name of a variable in the template from which the value of the
            stress measure is to be extacted using the measurement specified in the
            measure field (e.g., pwrd).
measure     specifies the measurement to be made on the template variable
            specified in the val field. This measurement provides the "actual" or
            "measured" value for the stress ratio calculation. Possible
            measurements include peak, max, min, rms, and average.
            Note that if the value for rating is positive, the peak measurement is
            equivalent to the max measurement. If the value for rating is
            negative, the peak measurement is equivalent to the min measurement.
rating      is the manufacture's rating for the stress measure (e.g., 40, pdmax).
            You can enter the actual value of the rating in this field, or you can
            enter a variable. If a variable is entered, the value can be provided as
            an argument in the header of the template.
ref_rating  is an optional single value reference rating. When a reference rating
            is specified, the measured and derated values are referenced to this
            value rather than to 0 when the stress ratio is calculated. For example,
            you may want to use 27° C. rather than 0 as a reference for a
            temperature-related stress measure.
```

When a stress analysis is run, individual stress_ratios are calculated for each stress_measure statement:

$$\text{stress\_ratio} = (\text{measure}(\text{val}) - \text{ref\_rating}) / (\text{derated\_rating} - \text{ref\_rating})$$

where measure(val) is either the peak, max, min, rms or average value of the val over the duration of the waveform; ref_rating is the reference rating from the stress_measure function; and derated_rating is the derated value of the rating specified on the stress_measure line. A value of "peak" for measure is equivalent to either max or min, depending on the relationship between rating and ref_rating, as shown below.

If the derated_rating is larger than the ref_rating, peak corresponds to a maximum and the following applies:

$$\text{derated\_rating} \quad \begin{array}{l} \text{stress\_ratio} > 100\% \\ \hline \text{stress\_ratio} = 100\% \end{array}$$

$$\text{ref\_rating} \quad \begin{array}{l} \text{stress\_ratio} = 0 \\ \hline \text{stress\_ratio} < 0 \end{array}$$

If the derated_rating is smaller than the ref_rating, peak corresponds to a minimum and the following applies:

$$\text{ref\_rating} \quad \begin{array}{l} \text{stress\_ratio} < 0 \\ \hline \text{stress\_ratio} = 0 \end{array}$$

$$\text{derated\_rating} \quad \begin{array}{l} \text{stress\_ratio} = 100\% \\ \hline \text{stress\_ratio} > 100\% \end{array}$$

The stress_ratio formula handles both cases shown above. In the case when ref_rating=derated_rating, an error will be reported.

The implementation of the stress command requires that if any changes are made to the element values or the rating values, then the original analysis (the DC, TR, DCTR, or DT analysis) must be re-run in order to obtain the corresponding stress results. As an example, consider that a transient analysis followed by a stress analysis has been run on a circuit. Now assume that a resistor rating is changed from 0.25 W to 0.5 W. To calculate the new stress ratios, both the transient and the stress analyses have to be rerun. Changes to the derating file will only require that the stress analysis be rerun.

Device type function

To allow derating based on part types and part classes, the device_type function is provided. The syntax is:

device_type("part_type", "part_class")

The quotes are required to allow for white space in either the part_type or the part_class. To make it easier for the designer to apply derating, a device_type statement is placed in every template that contains a stress_measure statement. To simplify the specification of the derating file, the part_type and part_class are in lower case type; multiple words are separated by single spaces.

device_type("resistor", "wirewound")

device_type("capacitor", "crd")

device_type("bjt", "npn power")

Derating file

As part of the stress command, a derating file, DERate, may be specified. The file consists of as many lines as are required to specify the derating information. Each line contains values for the first five entries shown below. The first entry must be a slash (/) or a pathname; the remaining entries may be asterisks (*), which will match any value at that position. The sixth entry is optional; it indicates whether the derating_value is a relative derating, an absolute rating, or an offset from the rated value. The default is a relative rating:

```
instance_path part_type part_class id derating_value
    <RELative|ABSolute|OFFSet>
```

The instance_path entry allows the selection of one or more parts or subsystems in the design. A specification of:

```
/ * * * 0.7
``` indicates that all of the components in the system are derated to 70% of their rated values. A specification of:

```
/r.* * * * 0.1 absolute
``` implies that all stress measures for all r's at the top level of the design are derated to an absolute value of 0.1. The instance_path should always start at the top level of the design, otherwise the derating specification will depend on the block from which the stress command is run. For example, an instance_path specification of c.* corresponds to all c's in the current block, which may not be the top level. By design, if the instance_path specifies a higher level block of a hierarchical system, derating will also be applied to all blocks below that level. This is why the above specification of / works for the entire design, rather than requiring a specification of /. . . ; in fact, both are equivalent. Similarly, if the design being analyzed has a subsystem named motdriv.a, then an instance_path specification of/motdriv.a or/motdriv.* will apply to any stress_measures in motdriv as well as all of the subsystems and elements below motdriv. In most applications, the instance_path specification should be/; only if a specific part or subsystem is to be derated specially should a different instance_path be required.

The part_type and part_class entries allow derating to be applied specially to different part types in the design. Both entries correspond to the device_type statement defined in the previous section. Both entries are optional, but a part_class cannot be specified without a part_type. Unlike in the device_type statement, the part_type and part_class only need to be placed in quotation marks if they contain white space. They may contain upper and lower case letters. When looking for a match with the part_type or part_class specification, two comparisons may be performed. Initially, an exact match is attempted between the derating entry and the device_type; if this fails, a second comparison is attempted after the part_type and part_class in the derating file are converted to lower case and stripped of any excess white space.

It is anticipated that the part_type and part_class will be used more often than the instance_path. To illustrate why, suppose the designer wishes to derate all resistors in the design. If we used a derating entry of:

```
/. . . /r. * * * * 0.5
``` only those resistors specified as r.* in the design will be derated. Resistors specified as rz, for instance, will not be derated. Including the following line in the derating file will apply derating to all parts with a part_type entry containing "resistor".

```
/ resistor * * 0.5
```

The id entry allows derating to be applied to one or more specific stress_measures. For example, the following line will apply derating to all stress_measures with an id of tjmax.

```
/ * * tjmax 0.5
```

If more than one entry in the derating file applies to a part, the later entry in the derating file (closer to the end of the file) takes precedence over an earlier entry. As an example, assume that the derating file contains the following five lines.

| / | *        | *        | *     | 0.8           |
|---|----------|----------|-------|---------------|
| / | resistor | *        | *     | 0.7           |
| / | resistor | wirewound| *     | 0.6           |
| / | *        | *        | tjmax | −50. offset   |
| / | resistor | "carb comp"| tjmax | 125. absolute |

Derating is applied to the circuit as follows: If a tjmax stress_measure exists for the "carb comp" resistor, a derated value of 125 will be used (even if the rated value was less than 125). All other parts with a tjmax stress_measure will have tjmax derated to tjmax−50. All stress_measures (except tjmax) for wirewound resistors will be derated to 60% of their rated values. All stress_measures (except tjmax) for all other resistors will be derated to 70% of their rated values. All other stress_measures will be derated to 80% of their rated values. It is possible to derate an individual component or part merely by specifying the part without using wildcard notation.

A derating file warning will be reported if the file contains a specific instance but that instance is not found in the current design. For example, a warning is issued if the above derating file is used for a design which does not contain both subA and subB. Warnings and errors are not reported when the derating file contains part_types and part_classes and stress_measures which are not used in the design. This allows the designer to create one derating file which contains every valid part_type and part_class and stress_measure which can be used for many different designs. The derating value defaults to a relative value of 1.0 (no derating) for those parts in the system that are not accounted for in the derating file. The derating file can contain other files. A less than symbol ("<") in column 1 followed by a file name will include the named file as if it had been typed directly into the derating file.

The stress analysis of the invention differs from prior stress protocols in that the stress measure parameters are declared in the template rather than being incorporated into the simulator proper. This provides a much greater flexibility for derating and stress analysis of devices at different levels, which more closely represents real-world events.

Stress Report Command

To satisfy the report generation requirements, a stress_.report command is added to simulator 37 as follows:

STRESS_Report (variables)

where the variables are defined as:

TABLE 7

Stress Report Variables

| Variable | Value | Default |
|---|---|---|
| OFile | _|filename | — |
| RFile | filename | last rfile produced |
| HEADfile | _|filename | — |
| STRESSMin | [real]|[UNDEF] | -inf |
| SORT | VALue \| PART_Type \| PART_Class | VALue (sort by value) |
| HIDE | list of columns | no value, meaning display all columns |
| PAGELength | integer (>=0) | 0 (no page breaks) |
| PAGEWidth | integer (0 to 1024) | 132 |

The variables in Table 7 are defined as follows:

OFile: specifies the name of the output file in which to store the stress report. If no file ("_") is specified, the results are written to the terminal.

RFile: specifies the name of the RFile which contains the intermediate results of the stress command. It is an error to specify an RFile that was not generated by the STRESS command. By default, the last generated RFile is used.

HEADfile: specifies the name of a designer created file which is included at the beginning of the stress report. This file may include information about the design being analyzed as well as any legal disclaimers. By default, a HEADfile is not included in the stress report.

STRESSMin: specifies the minimum stress ratio to include in the stress report. By default, the minimum ratio is -inf, which means all stress ratios with values other than UNDEF are reported. The STRESSMin value may be followed by the keyword NA, in which case a section at the bottom of the report will be added which includes all elements for which the stress measure rating has not been defined.

SORT: specifies how the results of the stress analysis are grouped and sorted in the stress report. By default, all elements are grouped together and the results are sorted by decreasing value of the stress_ratio. If "part_type" is specified, the entries in the stress report are first grouped according to their part_type and then within each group, the stress_ratios are sorted by decreasing value. The part_types are then reported in alphabetical order. All instances corresponding to templates that do not contain a "device_type" statement are grouped together and placed at the bottom of the report, listed by decreasing stress ratio values. Specifying "part_class" is similar to using "part_type", but within each part_type group, the entries are further subdivided according to their part_class and then sorted by decreasing stress_ratio for each part_class.

HIDE: is a list of columns which are not to be displayed in the stress report. By default, the HIDE variable is empty, which means that all of the columns listed in Table 8 will be displayed. Columns which are not to be displayed may be specified in a space-separated list taken from the names in Table 8. This will reduce the width of the report.

TABLE 8

Report Hidden Columns

| Name to use with stress_report command | Column name used in the report |
|---|---|
| INSTance | instance |
| PType | part type |
| PClass | part class |
| SMeasure | stress measure |
| RATed | rated value |
| DERating | derating |
| DRValue | derated value |
| ACTual | actual value |
| AT | at* |
| SRatio | stress ratio |
| BARchart | bar chart |

*Note: The "at" column can be turned on and off separately, but it will not appear if the "actual_value" column is turned off or if the stress analysis has been performed on the results of a DC analysis.

PAGELength: specifies the pagelength to use for the report. After pagelength lines, several blank lines will be inserted and the heading "Stress Analysis Report—date" will be repeated. The default pagelength of 0 will not insert any page breaks.

PAGEWidth: specifies the width of the report—typically 132 columns.

The stress report will include the name of the design file, the type of analysis run for the stress command and the date when it was run, the current date, the name of the derating file, the value of SMeasurelist, STRESSMin, SORT, XRange and WINSize variables. The heart of the report will be the stress table which will include the specified columns and the corresponding data. Samples of Stress Reports are shown in Reports 4–6, later herein. In each interface, a STRESS REPORT item will be added to the show results menu/form. A fixed font width will be required to ensure that the columns are aligned.

SENSITIVITY ANALYSIS

The sensitivity and sens_report commands are added to simulator 37. They allow a designer to calculate and display the sensitivity of one or more circuit characteristics or performance measures with respect to one or more circuit parameters.

Specification of Circuit Parameters

The sensitivity command requires a means to select the circuit parameters which are to be used for the sensitivity calculation. The designer is able to specify any parameter for any component (e.g., the base resistance of q.1). A filtering mechanism is included to limit the amount of output when an instance is chosen without specifying a particular parameter.

The sensitivity command requires a means to specify and calculate the performance measures of interest. In most cases, the performance measures will be scalar quantities, such as the dutycycle, risetime, voltage at a node, etc. In some cases, however, sensitivity waveforms are generated from the performance measure. For example, the designer may require the sensitivity of a node voltage over the duration of a transient analysis or over all frequencies in an AC analysis.

Sensitivity report 62 contains all relevant information about the analysis performed as well as the circuit characteristics used to calculate the sensitivity. The report includes the type of analysis and the time and date when it was run, the name of the design file, any designer specified options, etc. The designer is able to specify the format for the sensitivity report. This includes selection of the size of the page (lines and rows), which columns to display, the type of sorting and grouping to use, and the minimum sensitivity to report. Samples of Sensitivity Reports are provided later herein at Reports 1 and 7.

The sensitivity command is implemented in such a way that after the intermediate data file (RFile) is generated, a sensitivity report may be generated without the existence of either the design file or the .tbl file. This allows a sensitivity report to be generated from a previously run sensitivity analysis, even if the design has been changed since the time of the previously run analysis.

A subset of the performance measures originally specified for the sensitivity analysis may be displayed. For example, a designer may only want to display the sensitivity of the dutycycle for a circuit, when the original sensitivity calculation included the dutycycle, the frequency and the slew rate. To allow the designer to query the contents of the intermediate data file, the RFInfo command is added to simulator 37.

The templates will accept a designer-definable performance parameter, which may be inserted into a template by a designer. Sensitivity analysis allows the designer to define the performance of a specific device or part as a function of the performance of other devices or parts.

Sensitivity Command

A command for the sensitivity analysis protocol has the following syntax:

SENSitivity ( variables )
body
END

The variables are defined as:

TABLE 9

Sensitivity Command Variables

| Variable | Value | Default |
| --- | --- | --- |
| SPARList | sensitivity_list | no default |
| DELta | real (>0) | 0.01 |
| RFile | filename | sens |

The variables in Table 9 are defined as follows:

SPARList: specifies a list of parameters with which to calculate the sensitivity. The designer is required to specify one or more parameters since this list is empty by default.

DELta: specifies the relative size of the perturbation to use with the sensitivity calculation. This variable is not normally altered by the designer.

RFile: specifies the filename in which to keep the intermediate results of the sensitivity analysis. This file is used with the sensitivity report command to generate the sensitivity report. By default, the results are stored in a file with extension ".sens."

The SPARList variable is used to specify which circuit parameters are to be varied for the sensitivity calculation. A function called a variation_spec is provided. With this function, a designer may specify an element name in the SPARList, and the sensitivity calculation will be performed with respect to all parameters in the variation spec. If a variation_spec does not exist, the sensitivity will be calculated using the first numeric argument to the template.

The body of the sensitivity loop must contain commands to extract the desired performance measures. The measure command, previously discussed, uses a pfile as input and generates a number as output. Any number of analysis and measure commands may be included within the body of the sensitivity loop. Several examples of sensitivity commands are now presented.

In the first example, several measure commands are performed from a single analysis:

sens (spar1 r.1 c.1 c.fb
   dctr (tend 20 m, tstep 1 u
   measure risetime (cname out)
   measure dutycycle (cname out)
   measure at 16.6666 m (cname x1)
end In the second example, several analysis and measure commands are contained in the body of the sensitivity command:

sens (sparl r.1 c.1 c.fb
   dc
   ac (fend 10 meg
   measure bandpass (cname outc)
   tr (tend 10 m, tstep 1 u
   measure maximum (cname fb)
   dt (sweep v(v.vin), swb 0, swe 10, sws 0.1
   measure thresholds 5 (cname collect)
end In both preceding examples, sensitivities are calculated with respect to the value of the elements specified in the SPARList for each measure statement. Since the sensitivity is calculated using a perturbation of the specified parameters, the commands in the loop are executed more than once. For n parameters in the SPARList, n+1 executions of the loop body will be required: one for the nominal values and one additional execution with each of the parameters individually perturbed.

Due to the operation of the sensitivity command, if a post processing command (such as FFT, IFFT or Fourier) is used in the sensitivity body, the command must be preceded by an appropriate analysis for the results to be valid. For example, if the performance measure of interest is determined from an FFT, the transient analysis which generated the input file for the FFT must also be included in the sensitivity body. This is illustrated in the sensitivity command below:

sens (sparl r.1 c.1 c.fb
   dctr (tend 10 m, tstep 1 u)
   fft
   measure at 20 k (cname t1)
end The perturbation approach of calculating the sensitivity is computationally more expensive than the more commonly used adjoint method. The latter method can determine the sensitivity of all entries in the system matrix (i.e., all node voltages, etc.) with respect to a single parameter without having to perturb element values and rerun analyses. However, the adjoint method is more restrictive since it is not possible to calculate the sensitivity of a quantity which is not directly related to the variables in the system matrix. For instance, the adjoint method could not be used to determine the sensitivity of the dutycycle with respect to a parameter value.

Vary and Monte Carlo analyses are not permitted inside the body of the sensitivity command. However, it is possible to place a sensitivity command within a vary or Monte Carlo loop.

Sensitivity Report Command

To satisfy the report generation requirements, a sens_report command will be added to simulator 37 as follows:
SENS_Report (variables)
where the variables are defined as:

TABLE 10

Sensitivity Report Variables

| Variable | Value | Default |
|---|---|---|
| OFile | _I filename | — |
| RFile | filename | last rfile produced |
| HEADfile | _I filename | — |
| RNames | list of rnames | empty list, meaning display all rnames |
| SENSMin | real (0 to +inf) | 0 |
| STYPE | normalized I unnormalized I pseminormalized I fseminormalized | normalized |
| EPSilon | real (>= 0) | 1 u |
| SORT | value _I part_type I part_class | value (sort by value) |
| HIDE | list of columns | no value, meaning display all columns |
| PAGELength | integer (>= 0) | 0 |
| PAGEWidth | integer (0 to 1024) | 132 |

The variables in Table 10 have the following definitions:

OFile: specifies the name of the output file in which the sensitivity report is stored. If no file ("_") is specified, the results are only written to the terminal.

RFile: specifies the name of the RFile which contains the intermediate results of the sensitivity command. An error is reported if the specified RFile is not generated with a sensitivity analysis. By default, the last generated RFile is used.

HEADfile: specifies the name of a designer-created file which is included at the beginning of the stress report, immediately after the "Sensitivity Analysis Report—date" line. It is anticipated that this file will include information about the design being analyzed as well as any legal disclaimers. By default, a HEADfile is not included in the sensitivity report.

RNames: specifies which performance measures are to be included in the sensitivity report. An empty list or an asterisk (*) will use all rnames in the rfile, otherwise the RNames list must correspond to the rnames used by the measure command. The RFinfo command can be used to list which rnames are contained in a specified rfile. By default, all rnames are displayed in the report.

SENSMin: specifies the minimum absolute value of sensitivity to include in the sensitivity report. By default, the minimum value is 0, which means all sensitivities will be reported.

SType: specifies the type of normalization to use when displaying the sensitivities. Four possibilities exist. Assume a performance measure named F and a parameter named p. The NORMalized sensitivity is (dF/F)/(dp/p). This formula is only meaningful if both F and p are non-zero. If both are zero, the minimum absolute value of sensitivity is included in the sensitivity report. By default, the minimum value is 0, which means all sensitivities will be reported.

EPSilon: specifies a minimum threshold value to use when switching between normalized sensitivity and seminormalized or unnormalized sensitivity. The default value is $10^{-6}$.

SORT: specifies how the results of the sensitivity analysis will be grouped and sorted in the sensitivity report By default, there is no grouping and the results are sorted by decreasing absolute value of sensitivity. If "part_type" is specified, the entries in the sensitivity report are first grouped according to their part_type and then within each group, the sensitivities are sorted by decreasing absolute value. The part_types are then reported in alphabetical order. All instances corresponding to templates that do not contain a "device_type" statement will be grouped together and placed at the bottom of the report, listed by decreasing absolute value of sensitivity. Specifying "part_class" is similar to using "part_type", but within each part_type group, the entries are further subdivided according to their class and then sorted by decreasing absolute value of sensitivity for each class.

HIDE: is a list of columns which are not to be displayed in the sensitivity report. By default, the hide variable is empty, which means all of the columns will be displayed. If the designer wants to hide some of the columns, the unwanted columns may be specified in a space-separated list.

PAGELength: specifies the pagelength to use for the report. After pagelength lines, several blank lines are inserted and the table heading will be repeated. The default pagelength of 0 will not insert any page breaks.

PAGEWidth: specifies the number of columns to use for the report.

The sensitivity report includes the current date, the name of the design file, the commands within the body of the sensitivity loop, the date of the sensitivity analysis, the value of SPARList, SENSMin, SORT, and STYPE. The heart of the report is the sensitivity tables, one for each of the specified rnames. Each table includes the nominal value of the circuit measure as well as the specified columns and the corresponding sensitivities. The sens_report command will properly handle entries with +/- inf and undef. It should once again be noted that a stress analysis may be performed after the sensitivity analysis is complete.

MONTE CARLO—WORST CASE ANALYSIS

Monte Carlo—Worst Case Analyses, 66a, (MC-WCA) predicts a system's performance as the component values are varied to their maximum and minimum limits. MC-WCA permits designer selection of the number of individual simulations as well as whether or not device models of the same type track each other. Appropriate computer code segments are included in simulator 37 to implement commands in the MC-WCA protocol.

The tolerance, or minimum and maximum parameter, as used in MC-WCA, provides a statistical distribution with an assigned value. The default statistical distribution is Gaussian. The statistical data from a simulation may be saved in a file, and displayed in a line chart and/or histogram, as selected by the designer.

MC-WCA as used herein is designed to be more pessimistic than a standard Monte Carlo analysis (MCA) using available statistical distribution, i.e., a better estimate of the worst case performance is obtained with less effort than with standard MCA. The variable WORSTcase is added, and accepts values of YES and NO, with NO being the default. If WORSTcase is set to YES, all statistical distributions are changed into a Worst Case mode, i.e., the distributions return, with a 50% probability, the maximum or minimum limit of the component value.

Turning attention now to example circuits, in the analysis mechanism of the invention, part parameters are often changed in some way and the effect observed on design performance measures or on other parts in the design. The change may be a variation of a part parameter or a failure of a part. The effects observed may be changes in values of design performance measures, stresses on other parts, or failures of other parts.

The following text describes the variations and failures that can be induced in the parts used in the circuits which are described later herein in conjunction with FIGS. 19 and 25. These effects include stresses on parts (stress measures) and failures resulting from variations or failures of other parts (cascaded failures).

Variations

A variation is a change of a part parameter within the specified operating range for that parameter. Part parameters are varied when a sensitivity, EVA, or MCA is performed.

Figure 19:
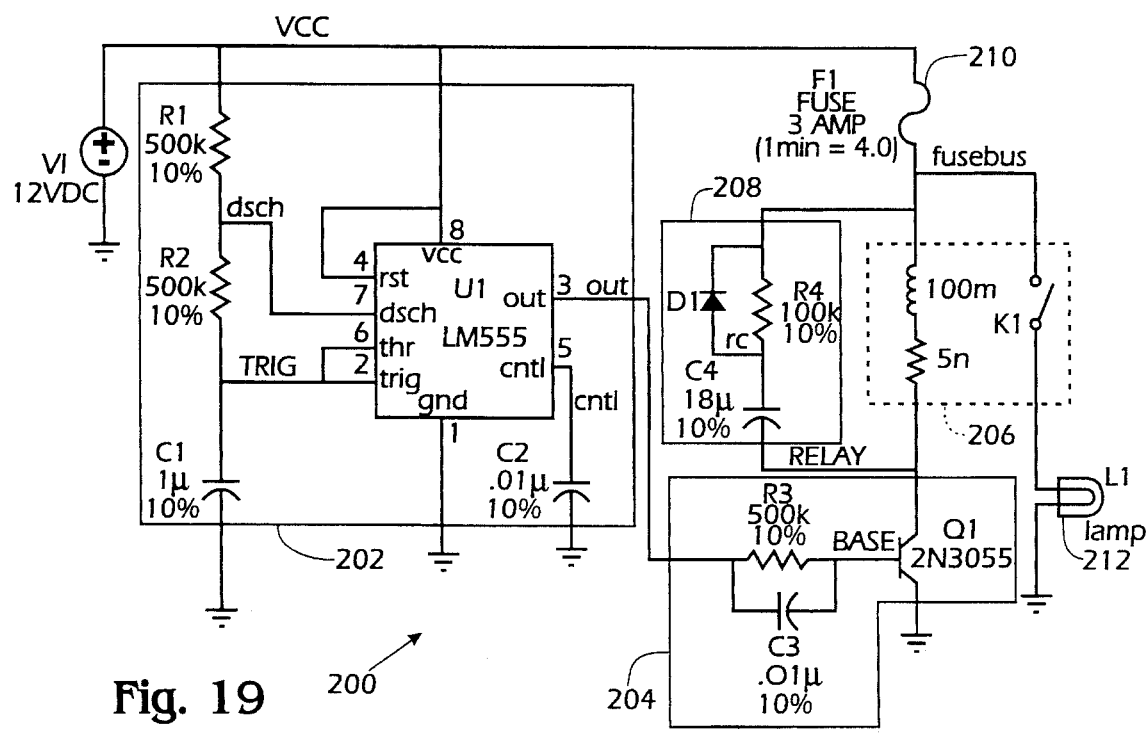
FIG. 19 is a schematic diagram of an automotive blinker circuit.
Figure 25:
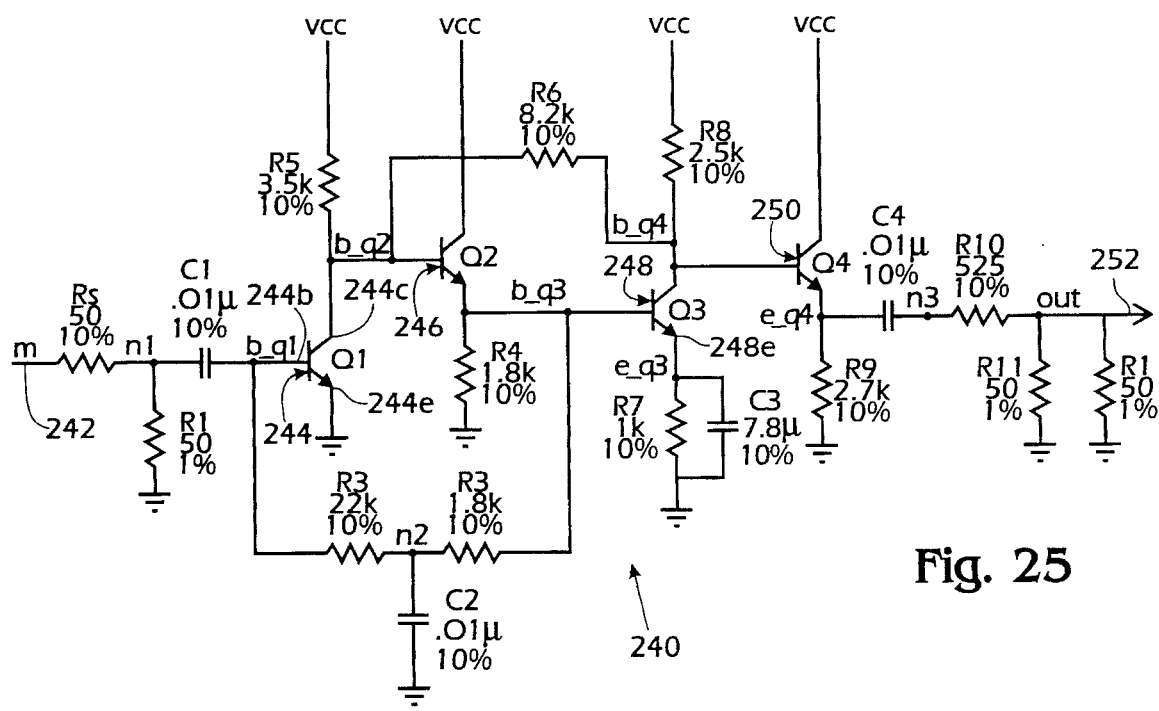
FIG. 25 is a schematic diagram of a four-stage line amplifier.

Table 11 shows the parts in the example circuits shown in FIGS. 19 and 25 that have parameters that can be varied and what those variations are.

TABLE 11

| Variable Parameters | | |
|---|---|---|
| Part type | Template Name | Parameter Varied |
| resistor | rq | resistance R |
| capacitor | cq | capacitance C |
| inductor | lq | inductance L |
| diode | dq | voltage VD across diode at a specified current ID through diode |
| transistor | qq | base-to-emitter voltage VBEat a specified collector current IC and forward current gain bF |
| transistor | q2n3055q | base-to-emitter voltage VBE at a specified collector current IC and forward current gain bF |
| fuse | fuseq | blow time TD |
| timer | lm555q | resistance of resistors in divider network |
| voltage source | vdcq | voltage V |

The variation spec contained in a template tells simulator 37 that the template contains a probablistic distribution of values, such as may be generated by a Monte Carlo algorithm. The simulator recognizes, by virtue of the command protocol, that one or more of the parameters in the template are subject to being varied during simulation. The simulator then performs the appropriate analysis based on the declared type of analysis, such as VARY, MC, EVA, RSS, etc. This arrangement allows the designer to let the simulator conduct the appropriate analysis to explore the parameter space in an orderly manner.

Failures

A failure occurs when a part no longer functions within its specification. Failures are induced into a design when a Failure Modes and Effects Analysis (FMEA) is done. Table 12 shows the types of failures that can be induced into the circuits shown in FIGS. 19 and 25. It should be appreciated that the enhanced HDL of the invention allows a designer to define a failure from outside of simulator 37. This differs from previous systems where it was necessary to use the simulator code to define a failure.

TABLE 12

| Failure Types | | |
|---|---|---|
| Part type | Template Name | Failure Modes |
| resistor | rq | short, open, leakage |
| capacitor | cq | short, open, leakage |
| inductor | lq | short, open, leakage |
| diode | dq | short, open, leakage |
| transistor | qq | short, open, leakage across VBE, VCB, and VCE |
| transistor | q2n3055q | short, open, leakage across VBE, VCB, and VCE |
| lamp | lamp_sfq | short, open, leakage around filament |
| timer | lm555q | shorts, opens, leakages of resistors in divider network |

Cascaded (or secondary) Failures

A cascaded (or secondary) failure is a part failure caused by a variation or failure of another part in the design. For example, a cascaded failure may be observed as a result of a failure induced during an FMEA, or it might be observed as a result of an event such as a fuse blowing, as shown in relation to FIG. 19. Some of the possible cascaded failures that may be simulated using the analysis mechanism of the invention are listed in Table 13.

TABLE 13

| Cascaded Failures | | |
|---|---|---|
| Part type | Template Name | Resulting Failures |
| resistor | rq | power exceeded causes open |
| capacitor | cq | voltage exceeded causes short |
| transistor | qq | VCE exceeded causes short |
| transistor | q2n3055q | VCE exceeded causes short |

Stress Measures

Stress measures are used by the nominal stress, EVA stress, and FMEA stress analyses to determine when a part is being stressed. Stress measures have been defined for the following parts, shown in FIGS. 19 and 25.

TABLE 14

| Stress Measures | | |
|---|---|---|
| Part type | Template Name | Stress Measures Defined |
| resistor | rq | peak power, voltage, current, reverse voltage, and temperature; |
| | | rms power, voltage, current, reverse voltage, and temperature; |
| | | average power, voltage current, reverse voltage, and temperature. |
| capacitor | cq | peak power, voltage, current, reverse voltage, and temperature; |
| | | rms power, voltage, current, reverse voltage, and temperature; |
| | | average power, voltage, current, reverse voltage, and temperature; |
| inductor | lq | peak power, voltage, current, reverse voltage, and temperature; |
| | | rms power, voltage, current, reverse voltage, and temperature; |
| | | average power, voltage, current, reverse voltage, and temperature; |
| diode | dq | reverse voltage |

TABLE 14-continued

Stress Measures

| Part type | Template Name | Stress Measures Defined |
|---|---|---|
| transistor | qq | ic, ib, ie max; vceo, vebo, vcbo max; tj max, pd max |
| transistor | q2n3055q | ic, ib, ie max; vceo, vebo, vcbo max; tj max, pd max |
| fuse | fuseq | peak power, voltage, current, reverse voltage, and temperature; rms power, voltage, current, reverse voltage, and temperature; average power, voltage, current, reverse voltage, and temperature; |
| lamp | lamp_sfq | peak power, voltage, current, reverse voltage, and temperature; rms power, voltage, current, reverse voltage, and temperature; average power, voltage, current, reverse voltage, and temperature; |
| timer | lm555q | for the internal resistors: peak power, voltage, current, reverse voltage, and temperature; rms power, voltage, current, reverse voltage, and temperature; average power, voltage, current, reverse voltage, and temperature; |

To illustrate how the analysis mechanism of the invention may be applied to a physical system, the following two examples are provided. The following section describes how the analysis mechanism of the invention may be used to analyze the automotive blinker circuit shown in FIG. 19.

FAILURE MODES AND EFFECTS ANALYSIS

The Failure Modes and Effects Analysis (FMEA) is used to determine the effects on design performance measures when parts in the circuit fail. Some typical failures are shorts, opens, or changes in value. When a stress analysis is combined with the FMEA, other parts in the circuit that exceed specifications due to a part failure can also be determined. Appropriate computer code segments are included in simulator 37 to implement commands in the FMEA protocol.

An FMEA may be performed to provide an indicator of design quality. FMEA causes parts to be failed in the design and then determines the effects of these failures on design performance measures. This analysis also determines which other parts in the design exceed their specifications as a result of the failures induced. Information provided by this analysis may be used, for example, to optimize a design for reduced cost of maintenance and repair.

CHARACTERISTICS OF THE AUTOMOTIVE BLINKER CIRCUIT

The automotive blinker circuit, shown generally at 200 in FIG. 19 includes a timer circuit 202 (U1, R1, R2, C1, and C2), a relay driver 204 (Q1, R3, and C3), a relay 206 (K1), a protection circuit 208 (R4, D1, and C4), a fuse 210 (F1), and a single-filament lamp 212 (L1).

Figure 20:
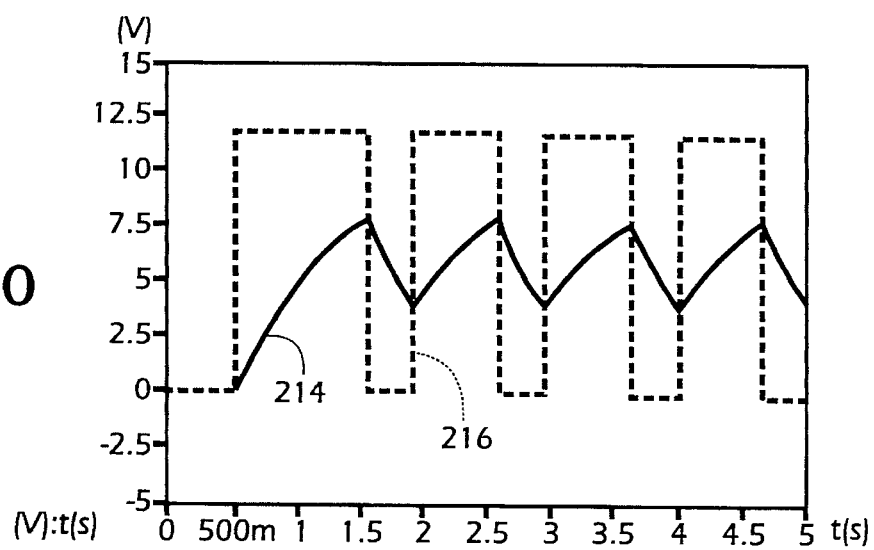
FIG. 20 is a graph of lamp voltage vs. time of the circuit of FIG. 19.

R1, R2, and C1 of timer circuit 202 determine dutycycle and frequency of the lamp cycle. Referring now to FIG. 20, the LM555 timer (U1) control signal Vtrig, depicted at 214, and the lamp voltage Vlamp, depicted at 216, are shown. The rise and fall times of control signal Vtrig 214 establish the frequency and dutycycle of the output of the timer circuit. These transition times are determined by the values of the resistors R1 and R2 and the capacitor C1. (The time constant of the rise time is (R1 +R2)*C1; the time constant of the fall time is R2*C1). The lamp is "on" during the rising transition of Vtrig 214 and "off" during the falling transition.

Surge current at lamp turn-on is modeled by the enhanced HDL. The lamp model used in this circuit has incorporated into it the typical dynamic thermal behavior of a lamp. This includes self-heating from the electrical current as well as a change in electrical resistance with temperature.

TEMPLATE 3

This template models the electrical behavior of a single filament lamp. An internal thermal model is used to find the instantaneous filament resistance. This resistance is a dynamic value, because of its temperature dependence.

A parameter specification method is employed whereby tables of significant physical characteristics are provided within the template. When the model is to be run, the user simply specifies the type of lamp, then all the pertinent data is available to reproduce that lamp's particular behavior. These lamp data tables can be customized by the user, based on independent measurement or manufacturer supplied information.

The electrical connections are p and m. When a voltage is applied between these pins, the resulting current (squared) produces a self-heating effect. The filament temperature will rise to the operating point, according to the thermal transient response. Because this temperature rise increases the filament resistance, there is an initial current surge far in excess of the final operating value.

The parameter "type" must specify the name of one of the lamp types defined within the model. The initial list of available types includes: "dash", "tail", "brake" and "head". The internal data tables contain parameter values that are typical for a variety of automotive lamp sizes. This design allows the user to incorporate a specific lamp's data into the model, and then easily specify those lamp characteristics when the model is called.

The system ambient temperature is specified by "tempc" (in deg C). The default is tempc=undef, so that if the system temperature is not specified, this will be detected and the external number "temp" will be read in and used.

Example Netlist Entries:

EXAMPLE: lamp_sf.halogen swbus gnd1=type=head, tempe=45

EXAMPLE: lamp_sf.dsh bus12 0 =dash

```
element template lamp_sf p m = type, tempc
electrical p,m
enum { dash,              #1
       tail,              #2
       brake,             #3
       head } type = dash #4
```

```
number tempc = undef     #Ambient temperature (deg. C.).
{
external number temp
number temp_eff,         #Screened ambient temperature.
    index    #Index number corresponding to "type" selection.
#The following numbers are lamp parameters that are used by the
#model depending which "type" of lamp is specified in the header.
#Lamp parameters are stored in the array "lamps[]".
number r0,       #Filament electrical resistance at room temperature (Ohms).
    rtc,     #Temperature coefficient of electrical resistivity, (1/C).
    k,       #Thermal radiation transport factor (Watts / deg. K 4).
    rth,     #Filament thermal resistance.
    cth      #Filament thermal capacitance.
struc lamp_properties {
    enum { dash,
        tail,
        brake,
        head} type_name     #Order must correlate with the
                            #"type" enum passed into the header.
    number r0_ref,          #Reference parameter values stored in
        rtc_ref,            #this array, for specific lamp types.
        k_ref,
        rth_ref,
        cth_ref
    } lamps[*] = \
#                REFERENCE DATA
#   type_name    r0       rtc       k         rth    cth

[(dash,      5.00,    0.0045,   4e-14,    10k,   80 u),
     (tail,      2.5,     0.0045,   1e-13,    5k,    200 u),
     (brake,     0.5,     0.0045,   4e-13,    1e3,   2 m),
     (head,      0.2,     0.0045,   3e-13,    700,   6 m)]
parameters {
    #Assign the reference filament parameters (appropriate to
    #the "type" of lamp specified), to the local parameters.
    if (type == dash) index = 1
    else if (type == tail) index = 2
    else if (type == brake) index = 3
    else if (type == bead) index = 4
    r0 = lamps[index ->r0_ref
    rtc = lamps[index]->rtc_ref
    k = lamps[index]->k_ref
    rth = lamps[index]->rth_ref
    cth = lamps[index]->cth_ref
    #Select the user specified ambient temperature, or else
    #use the external value of temperature = "temp".
    if (tempc==undef|tempc==inf) temp_eff = temp
    else           temp_eff = tempc
    }
filament.1 p m tfil tamb = r0 = r0,rtc = rtc,k = k,rth = rth,cth = cth
tempsrc.1 tamb 0 = temp_eff
}
```

Figure 21:
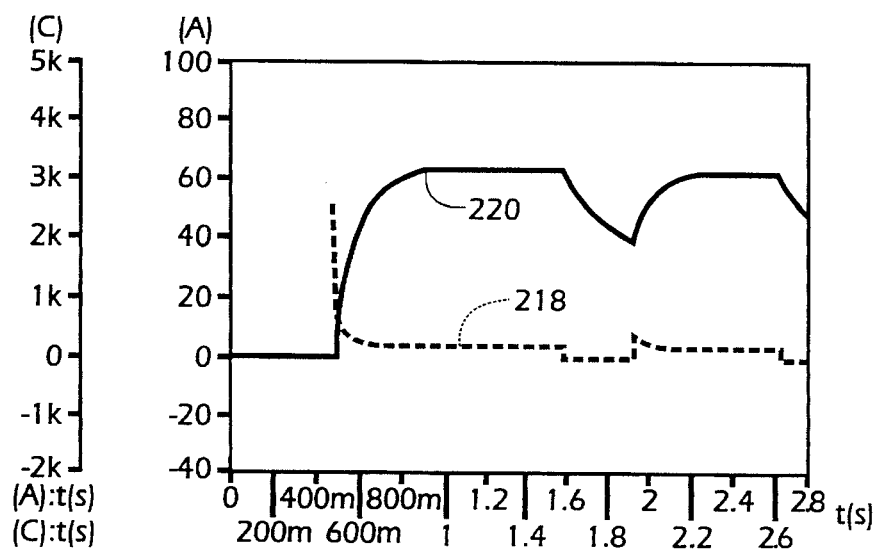
FIG. 21 is a graph of lamp current vs. filament temperature for L1 of FIG. 19.

FIG. 21 shows the relationship between the lamp current, depicted at 218, and filament temperature, depicted at 220. When the lamp is first turned on, the filament resistance is very low because the filament is cold. Thus, a large surge current exists for a short period of time. As the filament temperature rises, the resistance increases, and the current decreases to its steady state operating value. On the second cycle, the filament is still warm from the preceding cycle, and the lamp surge current is much less at the beginning of this (and subsequent) cycles. The steady state "on" current of the lamp is an order of magnitude lower than the peak of the surge.

TEMPLATE 4

This template models the electrical behavior of a fuse, and uses an internal thermal model to determine the time of melt-down for the fuse element (i.e. blow-time). Parameters are provided to allow the user to adjust the blow-time vs. current characteristics ("let-thru").

The electrical connections are p and m. The current flow (squared) between these pins produces the self-heating effect, which will raise the fuse element temperature and eventually "blow" the fuse. When the fuse blows, the electrical resistance between p and m becomes large (or infinite), as defined by the parameter "rblown".

Note: If this model is used directly in series with an ideal current source or an inductor, then a non-infinite value of the blown resistance must be specified. Otherwise, no "post-blow" solution can be found.

The first three parameter values are readily found in the standard databook fuse let-thru curves. The first parameter, "imin", is the minimum current at which the fuse will blow. This value is typically 1.3 to 2.0 times the rated fuse current. At the specified imin current, the blow time is very large. The next parameter, "ihigh", is a large current value for which the blow time is short. The blow time corresponding to ihigh is then specified by "tdhigh". For many fuse applications, these parameters alone will adequately reproduce the desired let-thru curve. The default values are:

imin=1.5 A, ihigh=10 A and tdhigh=20 msec. These values are typical for a 1 Amp rated, non-time delay fuse.

The fuse electrical resistance (cold) is specified by "r0". The post-blow resistance is given by "rblown". The temperature coefficient is given by "rtc" and the. temperature at which the fuse parameters were measured is specified by "temp0". The fuse resistance will then depend on the fuse temperature (tempfuse) as follows:

r(tempfuse)=r0*(1+rtc * (tempfuse−temp0))

The default values are: r0=0.02 Ohm, rblown=inf, rtc=0 and tempo=27C. Note that if a value of rtc other than 0 is specified, the shape of the let-thru curve will be affected. However, the specified imin, ihigh and tdhigh will generally be preserved.

The fuse element melting temperature (deg C) is specified by "tempmelt". The value of tempmelt will have an effect on let-thru only if the ambient circuit temperature (tempc) is different from temp0. The parameter "tdelay" represent the delay time from the moment the melting temperature is reached, until the electrical resistance value reaches rblown. This parameter can be used to shift the entire let-thru curve by a fixed amount. A non-zero value for tdelay will also provide a continuous resistance value transition, from r0 to rblown. This can be helpful if inductive loads are being supplied via the fuse. Finally, the system ambient temperature is specified by "tempc". If the ambient temperature is not the same a temp0, then the blow time will be affected (e.g. shortened if tempc>temp0), as expected. The default parameter values are: tempmelt=150 C., tdelay=0 sec and tempc=undef. If the system ambient temperature tempc is not defined, the external number "temp" will be used.

There are some restrictions on these parameter values. The value specified for imin must not be equal to 0. The absolute value of ihigh must be greater than imin, and tdhigh must be greater than 0. The fuse nominal resistance r0 must also be greater than 0. This means that "ideal" electrical behavior (i.e. r0=0) is not an acceptable specification for this model, as it is the self-heating of the fuse which creates the specified "blow" characteristics. The value of rblown must be positive and greater than r0. The melting temperature (tempmelt) must be greater than temp0. The temperature coefficient rtc must be such that the electrical resistance at the melting temperature is greater than 0. That is:

r0*(1+rtc*(tempmelt−temp0)) must be >0

This implies that a negative temperature coefficient can be specified, as long as the magnitude is small enough to satisfy the restriction. Finally, tdelay must be greater than or equal to 0.

The instantaneous values of the fuse resistance, the fuse current, the voltage across the fuse and the power being dissipated in the fuse can be observed by having the following term in the signal list:

. . . /fuse.xxx/r_tc.1/* where xxx is the instance name of the fuse of interest. These values are called r(r_tc.1), i(r_tc.1), v(r_tc.1) and power(r_tc.1), respectively. Note that the resistance value r(r_tc.1) is equal to the total fuse resistance only when the fuse is not blown. After the fuse blows, the total fuse resistance becomes rblown.

Example Netlist Entries:

EXAMPLE: fuse.5 amp vcc fzvcc=imin=7.3, ihigh=40, tdhigh=0.03
EXAMPLE: fuse.lamp vcc fzvcc=imin=1.9, ihigh=8, tdhigh=0.02,
EXAMPLE: r0=0.05, rtc=−0.001, tdelay=200 u
EXAMPLE: fuse.slow 10 vcc fzvcc=imin=17, ihigh=100, tdhigh=0.1,
EXAMPLE: rblown=1 g, rtc=1 m., temp0=27, tempmelt= 160, tempc=63

---

```
template fuse p m = imin, ihigh, tdhigh, r0, rblown, rtc, temp0,
                    tempmelt, tdelay, tempc electrical p,m number imin = 1.5,   # Minimum current required to
blow the fuse.
       ihigh = 10,   # A large current relative to the minimum.
       tdhigh = 0.02, # Time to blow fuse at current = ihigh.
       r0 = 20m,     # Fuse resistance measured at temp0.
       rblown = inf, # Fuse resistance when blown.
       rtc = 0,      # Temperature coefficient of fuse resistance.
       temp0 = 27,   # Measurement temperature for fuse
       parameters (deg C.).
       tempmelt = 150, # Melting point of the fuse material
       (deg C.).
       tdelay = 0,   # Delay, from the time the fuse
       temperature goes
                     # above tempmelt, until the fuse blows.
       tempc = undef # Ambient fuse temperature if specified;
       if tempc
                     # is not specified, the external number "temp"
                     # (system temperature) is used.

{ number rth,    # Fuse thermal resistance.
       cth,    # Fuse thermal capacitance.
       temp_eff, # Effective value of the ambient temperature.
       rblw_r0  · Value of rblown minus r0.

external number temp

Define the internal thermal connections.

thermal_c tfuse,  # Internal thermal connection points.
          ta state nu  blown,  # Assertive state which determines if fuse
                  # is blown, (equals 2 if blown, 1 if not).
          blowtime, # Internal state to monitor time of fuse blow.
          before,   # Threshold "before" state.
          after     # Threshold "after" state.

parameters { if (imin == undef I imin == inf I imin == 0) {
        saber_message("TMPL_S_ILL_VALUE",
        instance( ),"imin")
    } if (ihigh == undef I ihigh == inf I abs(ihigh) <=
    abs(imin)) {
        saber_message("TMPL_S_ILL_VALUE",
        instance( ),"ihigh")
    } if (tdhigh == undef I tdhigh == inf I tdhigh <= 0) {
        saber_message("TMPL_S_ILL_VALUE",
        instance( ),"tdhigh")
    } if (r0 == undef I r0 == inf I r0 <= 0) {
        saber_message("TMPL_S_ILL_VALUE",
        instance( ),"r0")
    } if (rblown == undef I (rblown <= r0 & rblown −= inf)) {
        saber_message("TMPL_S_ILL_VALUE",
```

```
        instance( ),"rblown")
    }
else if ( rblown == inf )  rblw_r0 = inf
else       rblw_r0 = rblown − r0 if (tempmelt == undef | tempmelt == inf | tempmelt <=
temp0) {
    saber_message("TMPL_S_ILL_VALUE",
    instance( ),"tempmelt")
    } if (rtc == undef |
rtc == inf | (1 + rtc*(tempmelt − temp0)) <= 0) {
    saber_message("TMPL_S_ILL_VALUE",
    instance( ),"rtc")
    } if (tdelay == undef | tdelay == inf | tdelay < 0) {
    saber_message("TMPL_S_ILL_VALUE",
    instance( ),"tdelay")
    } if ((tempc == undef) | (tempc == inf)) temp_eff = temp
else       temp_eff = tempc rth = (tempmelt−temp0)/
    ((imin**2)*r0*(1+rtc*(tempmelt−temp0)))
cth = tdhigh*(ihigh**2)*r0*(1+rtc*(tempmelt−temp0)/2)/
    (tempmelt−temp0)

} when(dc_init) { if (temp_eff <= tempmelt)

schedule_event(time,blown,1)
        schedule_event(time,blowtime,0)

# Note: blowtime is set to 0 at dc_init, even though the
    # fuse is not blow during dc analysis. This is so the plot
    # scale is not distorted by an arbitrary non-zero value.

} else { schedule_event(time,blown,2)
        schedule_event(time,blowtime,0)
        message("%: Fuse blown at DC, ambient temp. >
        tempmelt.",
                    instance( ))

}
    } when(threshold(tc(tfuse),tempmelt,before,after)) { if(after == 1) { schedule_event(time,blown,2)
        schedule_event(time,blowtime,time)
        schedule_next_time(time)
        message("%: Fuse blown at time = % ",instance( ),time)

}
    }

Electrical Netlist sw_1pnc.1 blown p sw  = ron = 0, roff = inf,
                    tdbrk = tdelay, tdmk = 0, rfunc = cont r.1 p sw = rnom = rblw_r0, include_stress=0 r_tc.1   sw   m tfuse = r0 = r0, alpha = rtc , t0 = temp0

Thermal Netlist tempsrc.1 ta   0   = temp_eff
```

```
ctherm.1 tfuse 0    = cth rtherm.1 tfuse ta   = rth

}
```

Figure 22:
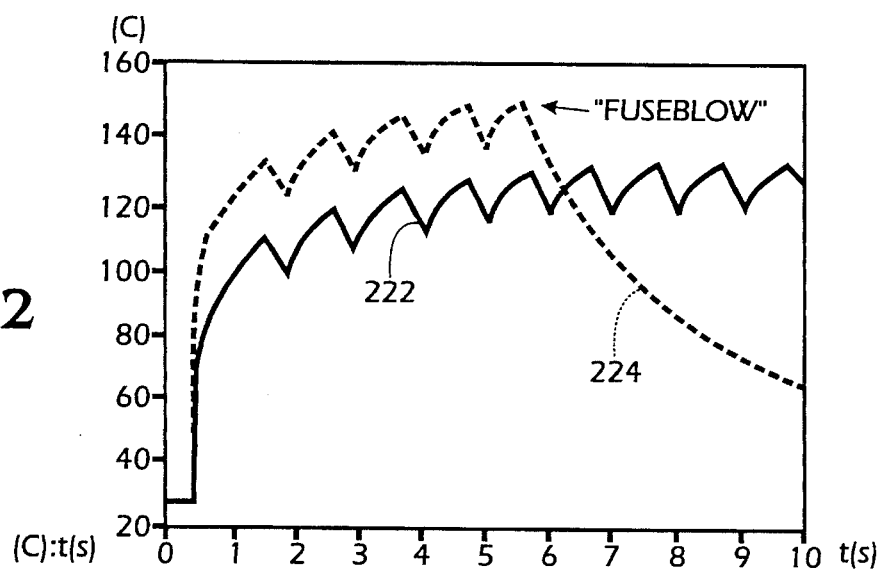
FIG. 22 is a graph of temperature vs. time for F1 of FIG. 19.

The fuse model, like the lamp model, has incorporated into it dynamic thermal effects. The fuse will not blow if only a short spike of excessive current is applied to it. The current applied must be of sufficient duration to heat the fuse to its melting point. FIG. 22 depicts the fuse temperature at environment temperatures of 27° C., at 222, and 50° C., at 224. Both waveforms show the cumulative build-up of temperature in fuse 210 with repeated lamp cycles. In the "hot" environment, the temperature of the fuse ultimately reaches the fuse melting point of 150° C., and the fuse blows. The fuse in blinker circuit 200 does not blow, as shown in FIG. 22 at low temperature 222 when the turn on surge current of the lamp, shown in FIG. 21 is applied. The rapid rise in temperature of the fuse due to the surge current is evident in FIG. 22, but the fuse does not heat sufficiently to blow during the short time period that the current is applied.

Cascaded failure of a transistor resulting from a fuse blow is shown in FIG. 23. A cascaded (or secondary) failure of a part is a failure that results from a variation or failure of another part in the circuit. A cascaded failure may be specified by setting a parameter in a model to specify the condition for that failure.

Figure 23A:
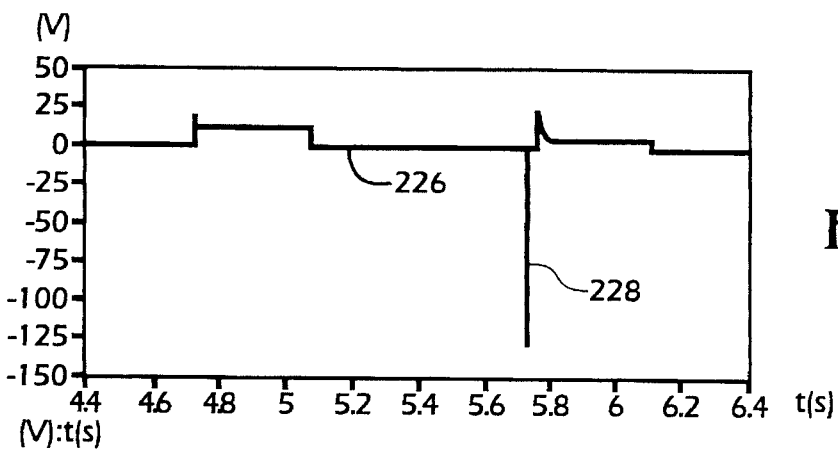
FIG. 23a is a graph of collector voltages vs. time for Q1 of FIG. 19 without a cascaded failure condition specified.

The upper waveform 226 in FIG. 23a shows a simulation of the behavior of the collector voltage of transistor Q1 without a cascaded failure condition specified. The "fuse blow" event at about 5.75 seconds causes a voltage spike 228 at the collector of the transistor due to the energy storage in the relay inductor (K1). The waveform shows a voltage spike of more than −125 volts at the collector of the transistor followed by a return to normal behavior.

Figure 23B:
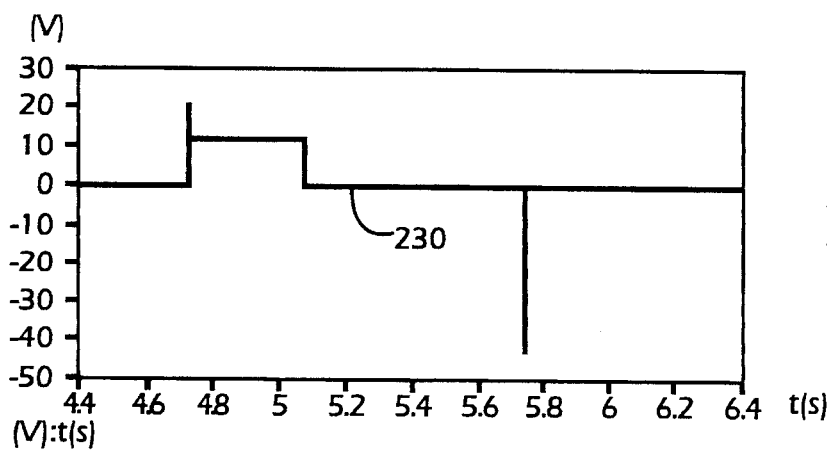
FIG. 23b is a graph of collector voltages vs. time for Q1 of FIG. 19 with a cascaded failure specified.

FIG. 23b shows a simulation of the collector voltage at 230 with a cascaded failure specified for the transistor. The cascaded failure has been specified in the model as a short between the collector and emitter when VCE is less than −40 V. The waveform shows a −40 volt spike at the collector after which the collector permanently is shorted to ground.

Sensitivity analysis shows sensitivity of frequency and dutycycle to R1 (/rq.r1), R2 (/rq.r2), and C1(/cq.c1). A Sensitivity report generated by the analysis mechanism is reproduced below.

REPORT 1

| SENSITIVITY ANALYSIS REPORT |
|---|
| Report Description |
| The normalized sensitivity was taken with respect to the parameters specified by "r(rq.r1) r(rq.r2) c(cq.c1)". For each performance measure, the parameters are sorted by decreasing absolute value of sensitivity, |

| Input Parameter Summary | | |
|---|---|---|
| Parameter List: | SPARList | r(rq.r1) r(rq.r2) c(cq.c1) |
| Normalization: | SType | NORMalized |
| Reporting threshold: | SENSMIN | 0 |

| Sensitivity of dutyc |
|---|
| Nominal value of dutyc = 0.6667 |

| Part | Parameter | Device Type | Parameter Nom. Value | Sensitivity |
|---|---|---|---|---|

REPORT 1-continued

SENSITIVITY ANALYSIS REPORT

| /rq.r1 | r | Resistor | 500000 | 0.183 |
| /rq.r2 | r | Resistor | 500000 | −0.111 |
| /cq.c1 | c | Capacitor | 1μ | −0.00783 |

Sensitivity of freq

Nominal value of freq = 0.9614

| Part | Parameter | Device Type | Parameter Nom. Value | Sensitivity |
|---|---|---|---|---|
| /cq.c1 | c | Capacitor | 1μ | −0.988 |
| /rq.r2 | r | Resistor | 500000 | −0.661 |
| /r2.r1 | r | Resistor | 500000 | −0.333 |

The analysis mechanism allows a designer to specify design performance measures for a design. For example, two design performance measures of interest in the blinker circuit of FIG. 19 are the frequency and the dutycycle of the lamp. These are single-number values determined from a transient waveform, such as the lamp voltage waveform shown in FIG. 20. The analysis mechanism allows design performance measures such as these to be specified.

tolerances may be specified for parts that show low sensitivity.

The sensitivity report, shown in Report 1, shows how sensitive the frequency and dutycycle of the lamp are to the components R1, R2, and C1 in the blinker circuit. For each design performance measure, the sensitivity to R1, R2, and C1 are given. The number given in the right hand column under the label "Sensitivity" in this report is the percent that the design performance measure will change with a 1% change in the part value. The report shows that the dutycycle is more sensitive to R1 and R2, while the frequency is more sensitive to C1.

Extreme value analysis shows extreme values for dutycycle and frequency. The Extreme Value Analysis (EVA) may be used to find the approximate minimum and maximum worst case values for a design performance measure when part values are varied within their tolerance ranges. A sensitivity analysis is done with the nominal part values to determine the direction that the part values must be changed in order to result in a maximum and minimum worst case value for the design performance measure. After the EVA, a stress analysis may be performed at the two extreme value conditions to determine if parts in the design are stressed under those conditions.

The following Report 2 displays the results of an Extreme Value Analysis for the lamp dutycycle. The allowed range for the lamp dutycycle was specified to be 0.6 to 0.8. The EVA report shows that the lamp dutycycle is within the allowed range at both its maximum and minimum values.

REPORT 2

EXTREME VALUE ANALYSIS REPORT

Report Description

The extreme value analysis was taken with respect to the parameters specified by "r(rq.r1) r(rq.r2) c(cq.c1)". The sensitivities reported for the nominal design and at both extremes are normalized.

Input Parameter Summary

| Parameter List: | SPARList | r(rq.r1) r(rq.r2) c(cq.c1) |
| Normalization: | SType | NORMalized |
| Reporting threshold: | RAnges | 0.6 0.8 |

Extreme value analysis of dutyc

For the performance measure "dutyc", the nominal value is 0.6667, the minimum value is 0.6256, and the maximum value is 0.7132. The allowed range for dutyc is from 0.6 to 0.8. The dutyc is within the allowed range.

Summary

Allowed range for dutyc:    0.6 0.8
Minimum value for dutyc:    0.6256
Nominal value for dutyc:    0.6667
Maximum value for dutyc:    0.7132

| Part | Parameter Name | Device Type | Parameter Value at Minimum | Parameter Value at Nominal | Parameter Value at Maximum | Sens. at Min | Sens. at Nom | Sens. at Max |
|---|---|---|---|---|---|---|---|---|
| /rq.r1 | r | Resis. | 405000 | 500000 | 605000 | 0.165 | 0.165 | 0.183 |
| /rq.r2 | r | Resis. | 605000 | 500000 | 405000 | −.147 | −.159 | 0.111 |
| /cq.c1 | c | Capac. | 1.21μ | 1μ | 81n | 0.00127 | −.0204 | 0.00783 |

Figure 24:
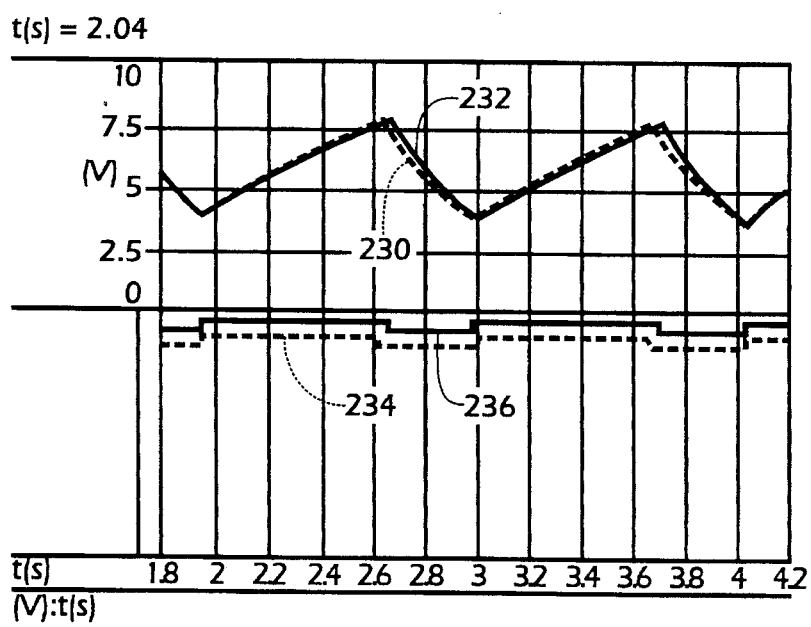
FIG. 24 is a graphical representation of the mixed-mode transient analysis of the circuit of FIG. 19.

Once the design performance measures of interest are selected for a circuit, the sensitivity analysis may be used to determine how sensitive the selected components are to variations in all (or selected) part values in the circuit. This information may be used to select appropriate tolerances for parts in the circuit. For example, tighter tolerances for parts may be specified where parts show high sensitivity in order to improve performance. In order to reduce costs, looser The graph in FIG. 24 shows the maximum and minimum lamp dutycycles. This graph is a composite of the results of two simulator transient analyses. For the first analysis, the parts in the blinker circuit were given the values that yielded the maximum value for dutycycle as determined by the EVA analysis. For the second analysis, the parts were given the values that yielded the minimum value for dutycycle. The results of the two analyses were then combined for this graph. The signals shown in the top half of the graph are the LM555 timing control signal under minimum 230 and maximum 232 conditions. The nominal waveform for this signal is shown in FIG. 20. The signals shown in the bottom half of the graph are the digital output control signal of the LM555 timer, Vtng(min) 234 and Vtng(max) 236.

A report depicting the results of an EVA for the lamp frequency is reproduced as Report 3. The allowed range for the lamp frequency was specified to be 0.6 to 1.1 Hz. The EVA report shows that the allowed range was violated at the maximum value for frequency. The sensitivity analysis at the end of the report shows that frequency is most sensitive to the value of the capacitor C1. Thus, to optimize the design, the tolerance of C1 should be tightened.

parts in the circuit as it was intended to do, or, if not, which parts were stressed by the event.

Reports from a series of three stress analyses are shown below. The first stress analysis was done on a transient analysis in which a "fuse blow" event did not occur and no cascaded failures were specified. (Report 4) The "Stress Ratio" in the right column of the Stress Table is the ratio of the "Actual Value" of the stress measure for the part to the "Derated Value" of the part. The "Derated Value" is the "Rated Value" derated by the "Derating" factor. The highest stress ratio under these conditions was the protection circuit resistor R4 (572%). The report shows that three stress measure ratings of the circuit of FIG. 19 were exceeded, the

REPORT 3

EXTREME VALUE ANALYSIS REPORT

Report Description

The extreme value analysis was taken with respect to the parameters specified by "r(rq.r1) r(rq.r2) c(cq.c1)". The sensitivities reported for the nominal design and at both extremes are normalized.

Input Parameter Summary

| Parameter List: | SPARList | r(rq.r1) r(rq.r2) c(cq.c1) |
|---|---|---|
| Normalization: | SType | NORMalized |
| Performance Measure Range: | RAnges | 0.6 1.1 |

Extreme value analysis of freq

For the performance measure "freq", the nominal value is 0.9614, the minimum value is 0.6564, and the maximum value is 1.466. The allowed range for freq is from 0.6 to 1.1. The freq is outside the allowed range at the high extreme.

Summary

Allowed range for freq:   0.6 1.1
Minimum value for freq:   0.6564
Nominal value for freq:   0.9614
Maximum value for freq:   1.466 (violation)

| Part | Parameter Name | Device Type | Parameter Value at Minimum | Parameter Value at Nominal | Parameter Value at Maximum | Sens. at Min | Sens. at Nom | Sens. at Max |
|---|---|---|---|---|---|---|---|---|
| /rq.r1 | r | Resis. | 605000 | 500000 | 405000 | −.333 | 0.346 | −.333 |
| /rq.r2 | r | Resis. | 605000 | 500000 | 405000 | −.665 | −.675 | −.661 |
| /cq.c1 | c | Capac. | 1.21μ | 1μ | 81n | −.994 | −1 | −.988 |

Stress analysis identifies parts stressed by the fuse blow event. The stress analysis determines which parts exceed their specifications during a DC or transient analysis. For example, during the transient analysis that produced the upper waveform in FIG. 22, the fuse "blew". The stress analysis will show if the fuse actually protected the other peak power rating of the resistor R4 and the base-emitter voltage and junction temperature of the relay driver transistor Q1.

REPORT 4

STRESS ANALYSIS REPORT

Report Description

The stress was taken for the stress measures specified by
"rq.*/peak_pwr cq.*/peak_v q2n3055q.*
dq.*/ . . . /peak_vr". The report is sorted by decreasing value of Stress Ratio.
Input Parameter Summary Stress Measure List:
SMeasurelist   rq.*/peak_pwr cq.*/peak_v q2n3055q.* dq.*/ . . . /peak_vr

Stress Table

| Part | Device Type | Stress Measure | Rated Value | Derating | Derated Value | Actual Value | Stress Ratio |
|---|---|---|---|---|---|---|---|

REPORT 4-continued

STRESS ANALYSIS REPORT

| /rq.r4 | Resistor | Peak power | 0.25 | 1 | 0.25 | 1.43 | 572 |
|---|---|---|---|---|---|---|---|
| /q2n3055q.q1 | BJT | BE voltage | 7. | 1 | 7 | 37.9 | 542 |
| /q2n3055q.q1 | BJT | JT | 50 | 1 | 50 | 70.8 | 142 |
| /rq.r3 | Resistor | Peak power | 0.25 | 1 | 0.25 | 0.204 | 81.7 |
| /q2n3055q.q1 | BJT | CB voltage | 100 | 1 | 100 | 38.8 | 38.8 |
| /cq.c4 | Capacitor | Peak voltage | 25 | 1 | 25 | 9.21 | 36.8 |
| /q2n3055q.q1 | BJT | CE voltage | 60 | 1 | 60 | 21.9 | 36.4 |
| /cq.c3 | Capacitor | Peak voltage | 25 | 1 | 25 | 3.02 | 12.1 |
| /q2n3055q.q1 | BJT | Base current | 7 | 1 | 7 | 0.2 | 2.86 |
| /q2n3055q.q1 | BJT | Collec. cur. | 15 | 1 | 15 | 0.239 | 1.59 |
| /q2n3055q.q1 | BJT | Power | 115 | 1 | 115 | 0.438 | 0.381 |
| /rq.r1 | Resistor | Peak power | 0.25 | 1 | 0.25 | 288μ | 0.115 |
| /rq.r2 | Resistor | Peak Power | 0.25 | 1 | 0.25 | 128μ | 0.0512 |
| /cq.c1 | Capacitor | Peak voltage | 25 | 1 | 25 | 0 | 0 |
| /cq.c2 | Capacitor | Peak Voltage | 25 | 1 | 25 | 0 | 0 | where: BE is Base-Emitter; CB is Collector-Base; CE is Collector-Emitter and JT is junction temperature;

The second stress analysis was done on a transient analysis in which a "fuse blow" event did occur, Report 5. Again, no cascaded failures were specified. The highest stress ratio under these conditions was the protection circuit resistor R4 (47400%). The report shows that four stress measure ratings were exceeded, the peak power rating of the resistor R4, the base-emitter voltage and junction temperature of the relay driver transistor Q1, and the power rating of the relay driver resistor R3.

The third stress analysis was again done on a transient analysis in which a "fuse blow" event occurred, Report 6. In this case, a cascaded failure was specified for the relay driver transistor Q1, which resulted in a Vce short in the transistor when the fuse blew, as shown in FIG. 23b. The highest stress ratio under these conditions was the transistor Q1 (14800%). Six stress measure ratings were exceeded including four stress measures for this transistor and the peak power ratings of the resistors R4 and R3.

REPORT 5

STRESS ANALYSIS REPORT

Report Description

The stress was taken for the stress measures specified by
"rq.*/peak_pwr cq.*/peak_v q2n3055q.*
dq.*/ . . . /peak_vr". The report is sorted by decreasing value of Stress Ratio.

Input Parameter Summary

Stress Measure List:
SMeasurelist  rq.*/peak_pwr cq.*/peak_v q2n3055q.* dq.*/ . . . /peak_vr

Stress Table

| Part | Device Type | Stress Measure | Rated Value | Derating | Derated Value | Actual Value | Stress Ratio |
|---|---|---|---|---|---|---|---|
| /rq.r4 | Resistor | Peak power | 0.25 | 1 | 0.25 | 118 | 47400 |
| /q2n3055q.q1 | BJT | BE voltage | 7. | 1 | 7 | 124 | 1770 |
| /q2n3055q.q1 | BJT | JT | 50 | 1 | 50 | 558 | 1110 |
| /rq.r3 | Resistor | Peak power | 0.25 | 1 | 0.25 | 0.788 | 315 |
| /q2n3055q.q1 | BJT | CE voltage | 60 | 1 | 60 | 26 | 44.7 |
| /q2n3055q.q1 | BJT | CB voltage | 100 | 1 | 100 | 37.8 | 37.8 |
| /cq.c4 | Capacitor | Peak voltage | 25 | 1 | 25 | 9.41 | 37.6 |
| /cq.c3 | Capacitor | Peak voltage | 25 | 1 | 25 | 2.56 | 10.2 |
| /q2n3055q.q1 | BJT | Collec. cur. | 15 | 1 | 15 | 1.32 | 8.84 |
| /q2n3055q.q1 | BJT | Power | 115 | 1 | 115 | 5.31 | 4.62 |
| /q2n3055q.q1 | BJT | Base current | 7 | 1 | 7 | 0.2 | 2.86 |
| /rq.r1 | Resistor | Peak power | 0.25 | 1 | 0.25 | 288μ | 0.115 |
| /rq.r2 | Resistor | Peak Power | 0.25 | 1 | 0.25 | 128μ | 0.0512 |
| /cq.c1 | Capacitor | Peak voltage | 25 | 1 | 25 | 0 | 0 |
| /cq.c2 | Capacitor | Peak Voltage | 25 | 1 | 25 | 0 | 0 | where: BE is Base-Emitter; CB is Collector-Base; CE is Collector-Emitter and JT is junction temperature;

REPORT 6

STRESS ANALYSIS REPORT

Report Description

The stress was taken for the stress measures specified by
"rq.*/peak_pwr cq.*/peak_v q2n3055q.* dq.*/. . ./peak_vr".
The report is sorted by decreasing value of Stress Ratio.

Input Parameter Summary

Stress Measure List: SMeasurelist   rq.*/peak_pwr cq.*/peak_v q2n3055q.* dq.*/. . ./peak_vr

Stress Table

| Part | Device Type | Stress Measure | Rated Value | Derating | Derated Value | Actual Value | Stress Ratio |
|---|---|---|---|---|---|---|---|
| /q2n3055q.q1 | BJT | JT | 50 | 1 | 50 | 7400 | 14800 |
| /q2n3055q.q1 | BJT | BE voltage | 7 | 1 | 7 | 932 | 13300 |
| /rq.r4 | Resistor | Peak power | 0.25 | 1 | 0.25 | 18.4 | 7370 |
| /q2n3055q.q1 | BJT | CB voltage | 100 | 1 | 100 | 932 | 932 |
| /rq.r3 | Resistor | Peak power | 0.25 | 1 | 0.25 | 0.71 | 284 |
| /q2n3055q.q1 | BJT | Collec. cur. | 15 | 1 | 15 | 34.6 | 231 |
| /q2n3055q.q1 | BJT | Power | 115 | 1 | 115 | 73.8 | 64.2 |
| /cq.c4 | Capacitor | Peak voltage | 25 | 1 | 25 | 9.41 | 37.6 |
| /q2n3055q.q1 | BJT | CE voltage | 60 | 1 | 60 | 22.1 | 36.8 |
| /cq.c3 | Capacitor | Peak voltage | 25 | 1 | 25 | 8.34 | 33.3 |
| /q2n3055q.q1 | BJT | Base current | 7 | 1 | 7 | 0.2 | 2.86 |
| /rq.r1 | Resistor | Peak power | 0.25 | 1 | 0.25 | 288µ | 0.115 |
| /rq.r2 | Resistor | Peak Power | 0.25 | 1 | 0.25 | 128µ | /0.0512 |
| /cq.c1 | Capacitor | Peak voltage | 25 | 1 | 25 | 0 | 0 |
| /cq.c2 | Capacitor | Peak Voltage | 25 | 1 | 25 | 0 | 0 | where: BE is Base-Emitter; CB is Collector-Base; CE is Collector-Emitter and JT is junction temperature;

FOUR-STAGE LINE AMPLIFIER

This section describes how the analysis mechanism may be used to analyze a four-stage line amplifier designed for a telecommunications application. The circuit is shown generally at 240 in FIG. 25. Circuit 240 includes an input 242 and four amplifier stages which each include a transistor. The first stage includes transistor Q1, 244, the second stage includes transistor Q2, 246, the third stage includes transistor Q3, 248 and the fourth stage includes transistor Q4, 250. Each transistor includes a base, or beta, such as 244b, a collector, such as 244c, and an emitter, such as 244e. The circuit has an output 252. Additional components includes an input resistor Rs, a feedback resistor R6, an output resistor R10, an input coupling capacitor C1 and an output coupling capacitor C4. Other elements are provided for noise suppression.

Design performance measures may be specified for a design. As previously noted, a design performance measure is a single-number value that has been extracted from a waveform generated by a simulator analysis. Several design performance measures of interest for this circuit are:

bandwidth (extracted from an ac analysis waveform)

gain (extracted from an ac analysis waveform)

risetime (extracted from a transient analysis waveform)

A sensitivity analysis may be used to determine how sensitive the design performance measures for a circuit are to variations in part values. A report for a sensitivity analysis for the line amplifier circuit 240 is reproduced later herein as Report 7. This report includes the sensitivities of each of the design performance measures bandwidth, gain, and risetime to part value variations for each part in the circuit. It shows that bandwidth is most sensitive to the feedback resistor R6, the capacitor C3 at the emitter of Q3, 248e, and the beta of the first stage transistor Q1, 244b. Gain is most sensitive to the feedback resistor R6, the output resistor R10, and the input resistor Rs. Risetime is most sensitive to the feedback resistor R6, the output coupling capacitor C4, and the output resistor R10.

The sensitivity analysis may be used to identify parts in the design that have the greatest impact on performance. This information may be used to optimize part tolerances in the circuit. For example, the relatively high sensitivity of all the design performance measures to the feedback resistor R6 may indicate that it would be desirable to specify a tighter tolerance for this part. A looser tolerance may be specified for less sensitive part values in the circuit. Thus, more expensive, higher tolerance parts can be specified only where they provide the most improvement in design performance.

REPORT 7

SENSITIVITY ANALYSIS REPORT

Report Description

The normalized sensitivity was taken with respect to the parameters specified by "/ /*.*.". For each performance measure, the parameters are sorted by decreasing absolute value of sensitivity.

Input Parameter Summary

| Parameter List: | SPARList | / /*.* |
|---|---|---|
| Normalization: | SType | NORMalized |

REPORT 7-continued

SENSITIVITY ANALYSIS REPORT

Reporting threshold:   SENSMIN   0

| Part | Parameter | Device Type | Parameter Nom. Value | Sensitivity |
|---|---|---|---|---|
| Sensitivity of bandwidth | | | | |
| Nominal value of dutyc = 15.89 MHz | | | | |
| /rq.r6 | r | Resistor | 8200 | −0.409 |
| /cq.c3 | c | Capacitor | 7.8n | −0.231 |
| /qq.q1 | beta | BJT | 91.4 | −0.225 |
| /rq.r5 | r | Resistor | 3500 | −0.222 |
| /rq.r2 | r | Resistor | 22000 | 0.213 |
| /cq.c4 | c | Capacitor | 10n | −0.148 |
| /rq.r3 | r | Resistor | 1800 | 0.144 |
| /cq.c2 | c | Capacitor | 10n | 0.137 |
| /rq.r10 | r | Resistor | 525 | −0.115 |
| /rq.r8 | r | Resistor | 2500 | −0.0885 |
| /rq.r7 | r | Resistor | 1000 | −0.0789 |
| /rq.r1 | r | Resistor | 50 | −0.0576 |
| /rq.rs | r | Resistor | 50 | −0.0576 |
| /cq.c1 | c | Capacitor | 10n | −0.0422 |
| /qq.q4 | beta | BJT | 91.4 | −0.00783 |
| /qq.q2 | beta | BJT | 91.4 | −0.00547 |
| /rq.r9 | r | Resistor | 2700 | 0.00515 |
| /qq.q3 | beta | BJT | 91.4 | 0.00452 |
| /rq.r3 | r | Resistor | 50 | −0.00275 |
| /rq.r1 | r | Resistor | 50 | −0.00275 |
| /rq.r11 | r | Resistor | 1800 | −862.μ |
| Sensitivity of gain | | | | |
| Nominal value of gain = 14.25 | | | | |
| /rq.r6 | r | Resistor | 8200 | 0.941 |
| /rq.r10 | r | Resistor | 525 | −0.915 |
| /rq.rs | r | Resistor | 50 | −0.515 |
| /rq.r1 | r | Resistor | 50 | 0.48 |
| /rq.r1 | r | Resistor | 50 | 0.475 |
| /rq.r11 | r | Resistor | 50 | 0.475 |
| /rq.r8 | r | Resistor | 2500 | 0.069 |
| /rq.r5 | r | Resistor | 3500 | 0.0453 |
| /qq.q1 | beta | BJT | 91.4 | 0.0423 |
| /cq.c3 | c | Capacitor | 7.8n | 0.0337 |
| /cq.c1 | c | Capacitor | 10n | 0.018 |
| /rq.r9 | r | Resistor | 2700 | 0.00623 |
| /qq.q4 | beta | BJT | 91.4 | 0.00412 |
| /rq.r4 | r | Resistor | 1800 | 0.00303 |
| /rq.r3 | r | Resistor | 1800 | 0.00272 |
| /qq.q2 | beta | BJT | 91.4 | 0.00222 |
| /qq.q3 | beta | BJT | 91.4 | 0.00193 |
| /rq.r7 | r | Resistor | 1000 | 0.00191 |
| /cq.c4 | c | Capacitor | 10n | 0.00172 |
| /rq.r2 | r | Resistor | 22000 | 763μ |
| /cq.c2 | c | Capacitor | 10n | −314μ |
| Sensitivity of risetime | | | | |
| Nominal value of risetime = 48.2n | | | | |
| /rq.r6 | r | Resistor | 8200 | 0.333 |
| /cq.c4 | c | Capacitor | 10n | 0.187 |
| /rq.r10 | r | Resistor | 525 | 0.186 |
| /rq.r2 | r | Resistor | 22000 | 0.124 |
| /rq.rs | r | Resistor | 50 | 0.121 |
| /rq.r8 | r | Resistor | 2500 | −0.1 |
| /rq.r5 | r | Resistor | 3500 | −0.092 |
| /rq.r7 | r | Resistor | 1000 | 0.0712 |
| /rq.r1 | r | Resistor | 50 | −0.0561 |
| /qq.q1 | beta | BJT | 91.4 | −0.0502 |
| /cq.c3 | c | Capacitor | 7.8n | 0.0361 |
| /cq.c2 | c | Capacitor | 10n | −0.00802 |
| /rq.r1 | r | Resistor | 50 | 0.00472 |
| /rq.r11 | r | Resistor | 50 | 0.00472 |
| /rq.r3 | r | Resistor | 1800 | 0.00448 |
| /cq.c1 | c | Capacitor | 10n | 0.00377 |
| /qq.q4 | beta | BJT | 91.4 | 0.00306 |
| /rq.r4 | r | Resistor | 1800 | 0.00236 |
| /qq.q2 | beta | BJT | 91.4 | −0.00212 |
| /qq.q3 | beta | BJT | 91.4 | 0.00189 |
| /rq.r9 | r | Resistor | 2700 | 0.00141 |

Extreme Value Analysis and EVA Stress Analysis

The EVA may be used to find minimum and maximum worst case values for a design performance measure when part values are varied within their tolerance ranges.

The first EVA report gives EVA results for the design performance measure mid-band gain. The allowed range for the mid-band gain has been specified as 12 to 50. The extreme values for midband gain are well within this tolerance range.

REPORT 8

EXTREME VALUE ANALYSIS REPORT

Report Description

The extreme value analysis was taken with respect to the parameters specified by "/ /*.*". The sensitivities reported for the nominal design and at both extremes are normalized.

Input Parameter Summary

| | | |
|---|---|---|
| Parameter List: | SPARList | / /*.* |
| Normalization: | SType | NORMalized |
| Performance Measure Range: | RAnges | 1 10000 |

Extreme value analysis of gain

For the performance measure "gain", the nominal value is 14.25, the minimum value is 8.495, and the maximum value is 30.21. The allowed range for gain is from 12 to 50. The freq is outside the allowed range at the low extreme.

Summary

| | |
|---|---|
| Allowed range for gain: | 12 50 |
| Minimum value for gain: | 8.459 (violation |
| Nominal value for gain: | 14.25 |
| Maximum value for gain: | 30.21 |

| Parameter | Parameter | Parameter | Sens. | Sens. | Sens. |
|---|---|---|---|---|---|

REPORT 8-continued

EXTREME VALUE ANALYSIS REPORT

| Part | Parameter Name | Device Type | Value at Minimum | Value at Nominal | Value at Maximum | at Min | at Nom | at Max |
|---|---|---|---|---|---|---|---|---|
| qq.q1 | beta | BJT | 73.8 | 91.4 | 111 | 0.0723 | 0.0423 | 0.0418 |
| qq.q2 | beta | BJT | 73.8 | 91.4 | 111 | 0.00275 | 0.00222 | 0.00198 |
| qq.q3 | beta | BJT | 73.8 | 91.4 | 111 | 0.00278 | 0.00193 | 0.00148 |
| qq.q4 | beta | BJT | 73.8 | 91.4 | 111 | 0.00428 | 0.00412 | 0.00497 |
| rq.rs | r | Resistor | 60.7 | 50 | 40.4 | −0.62 | −0.515 | −0.414 |
| rq.r10 | r | Resistor | 637 | 525 | 424 | −0.941 | −0.915 | −0.887 |
| rq.r3 | r | Resistor | 1450 | 1800 | 2180 | 0.00259 | 0.00272 | 0.00305 |
| rq.r2 | r | Resistor | 17700 | 22000 | 26700 | 698μ | 763μ | 606μ |
| rq.r6 | r | Resistor | 6620 | 8200 | 9960 | 0.932 | 0.941 | 0.943 |
| rq.r4 | r | Resistor | 1450 | 1800 | 2180 | 0.00316 | 0.00303 | 0.00332 |
| rq.r8 | r | Resistor | 2020 | 2500 | 3030 | 0.0748 | 0.069 | 0.0729 |
| rq.r5 | r | Resistor | 2820 | 3500 | 4250 | 0.0436 | 0.0453 | 0.0582 |
| rq.r1 | r | Resistor | 40.4 | 50 | 60.7 | 0.564 | 0.48 | 0.386 |
| rq.r7 | r | Resistor | 807 | 1000 | 1210 | 0.00437 | 0.00191 | 874μ |
| rq.r9 | r | Resistor | 2180 | 2700 | 3280 | 0.00585 | 0.00623 | 0.00517 |
| rq.r11 | r | Resistor | 40.4 | 50 | 60.7 | 0.482 | 0.475 | 0.466 |
| rq.r1 | r | Resistor | 40.4 | 50 | 60.7 | 0.482 | 0.475 | 0.466 |
| cq.c3 | c | Capacitor | 6.3n | 7.8n | 9.47n | 0.055 | 0.0337 | 0.0248 |
| cq.c2 | c | Capacitor | 12.1n | 10n | 8.07n | −600.μ | −314.μ | −260.μ |
| cq.c1 | c | Capacitor | 8.07n | 10n | 12.1n | 0.0264 | 0.018 | 0.0172 |
| cq.c4 | c | Capacitor | 8.07n | 10n | 12.1n | 0.00196 | 0.00172 | 0.00162 |

The second EVA report gives EVA results for the design performance measure bandwidth. The allowed range for the bandwidth has been specified as 8 MHz to 30 MHz. The maximum value for the bandwidth is outside the allowed range.

REPORT 9

EXTREME VALUE ANALYSIS REPORT

Report Description

The extreme value analysis was taken with respect to the parameters specified by "/ /*.*". The sensitivities reported for the nominal design and at both extremes are normalized.

Input Parameter Summary

| | | |
|---|---|---|
| Parameter List | SPARList | / /*.* |
| Normalization: | SType | NORMalized |
| Performance Measure Range: | RAnges | 10000 30 MHz |

Extreme value analysis of bandwidth

For the performance measure "bandwidth", the nominal value is 15.89 MHz, the minimum value is 8.973 MHz, and the maximum value is 31.32 MHz. The allowed range for bandwidth is from 8 MHz to 30 MHz. The bandwidth is outside the allowed range at the high extreme.

Summary

| | | | | | |
|---|---|---|---|---|---|
| Allowed range for bandwidth: | | | 8 MHz 30 MHz | | |
| Minimum value for bandwidth: | | | 8.973 MHz | | |
| Nominal value for bandwidth: | | | 15.89 MHz | | |
| Maximum value for bandwidth: | | | 31.32 MHz (violation) | | |

| Part | Parameter Name | Device Type | Parameter Value at Minimum | Parameter Value at Nominal | Parameter Value at Maximum | Sens. at Min | Sens. at Nom | Sens. at Max |
|---|---|---|---|---|---|---|---|---|
| /qq.q1 | beta | BJT | 111 | 91.4 | 73.8 | −12.9 | −0.225 | −1.21 |
| /qq.q2 | beta | BJT | 108 | 91.4 | 73.8 | 0.00168 | −0.00547 | −0.00743 |
| /qq.q3 | beta | BJT | 73.8 | 91.4 | 73.8 | 0.00542 | 0.00452 | 0.00305 |
| /qq.q4 | beta | BJT | 111 | 91.4 | 73.8 | −0.00186 | −0.00783 | −0.00706 |
| /rq.rs | r | Resistor | 60.7 | 50 | 40.4 | −0.0689 | −0.0576 | −0.0494 |
| /rq.r10 | r | Resistor | 637 | 525 | 424 | −0.0875 | −0.115 | −0.192 |
| /rq.r3 | r | Resistor | 1680 | 1800 | 2180 | 0.0268 | 0.144 | 0.0763 |
| /rq.r2 | r | Resistor | 18900 | 22000 | 26700 | 0.44 | 0.213 | 0.0931 |
| /rq.r6 | r | Resistor | 9960 | 8200 | 6620 | −0.204 | −0.409 | −0.35 |
| /rq.r4 | r | Resistor | 1940 | 1800 | 1450 | −0.00271 | −862μ | −0.00161 |
| /rq.r8 | r | Resistor | 3030 | 2500 | 2020 | −0.258 | −0.0885 | −0.14 |
| /rq.r5 | r | Resistor | 4250 | 3500 | 2820 | −12.8 | −0.222 | −1.17 |
| /rq.r1 | r | Resistor | 60.7 | 50 | 40.4 | −0.0689 | −0.0576 | −0.0494 |
| /rq.r7 | r | Resistor | 1210 | 1000 | 903 | −12.8 | −0.0789 | 0.0354 |
| /rq.r9 | r | Resistor | 2180 | 2700 | 3280 | 0.0027 | 0.00515 | 0.00282 |

REPORT 9-continued

EXTREME VALUE ANALYSIS REPORT

| /rq.r11 | r | Resistor | 60.7 | 50 | 40.4 | −0.00275 | −0.00275 | −0.00458 |
| /rq.r1 | r | Resistor | 60.7 | 50 | 40.4 | −0.00275 | −0.00275 | −0.00458 |
| /cq.c3 | c | Capacitor | 9.47n | 7.8n | 6.3n | −0.624 | −0.231 | −0.189 |
| /cq.c2 | c | Capacitor | 9.43n | 10n | 12.1n | 0.373 | 0.137 | 0.0752 |
| /cq.c1 | c | Capacitor | 12.1n | 10n | 8.07n | −0.422 | −0.0422 | −0.159 |
| /cq.c4 | c | Capacitor | 12.1n | 10n | 8.07n | −0.0974 | −0.148 | −0.233 |

Figure 26:
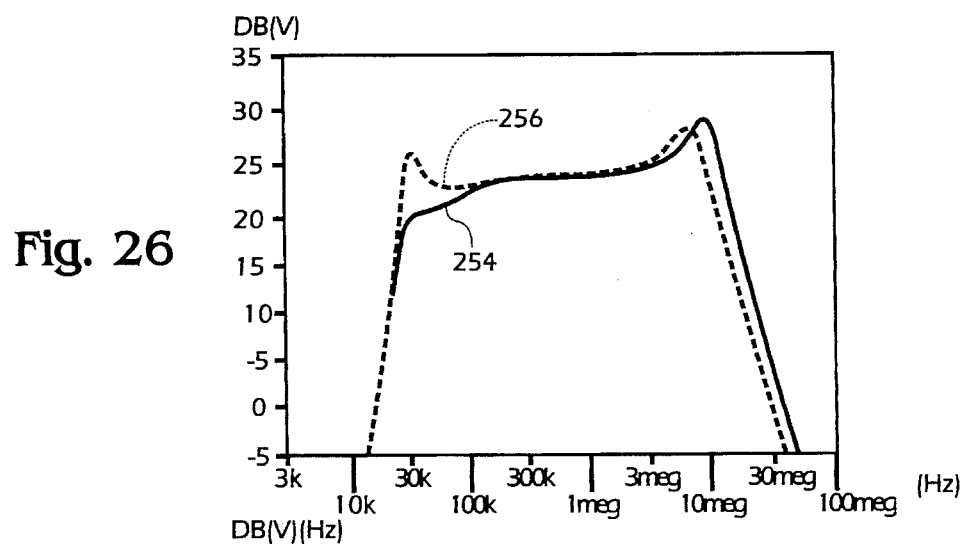
FIG. 26 is a graph of nominal and minimum bandwidths of the line amplifier of FIG. 25.

FIG. 26 shows a graph of the ac response of the line amplifier with part values chosen for nominal 254 and minimum 256 bandwidth. The nominal bandwidth waveform was generated with parts at their nominal values. For the minimum bandwidth waveform, the results of the EVA bandwidth analysis were used to determine which parts were the most sensitive factors. The parameters in REPORT 9 were shifted to the values at the edge of their tolerance ranges, yielding the minimum value for bandwidth.

Figure 27:
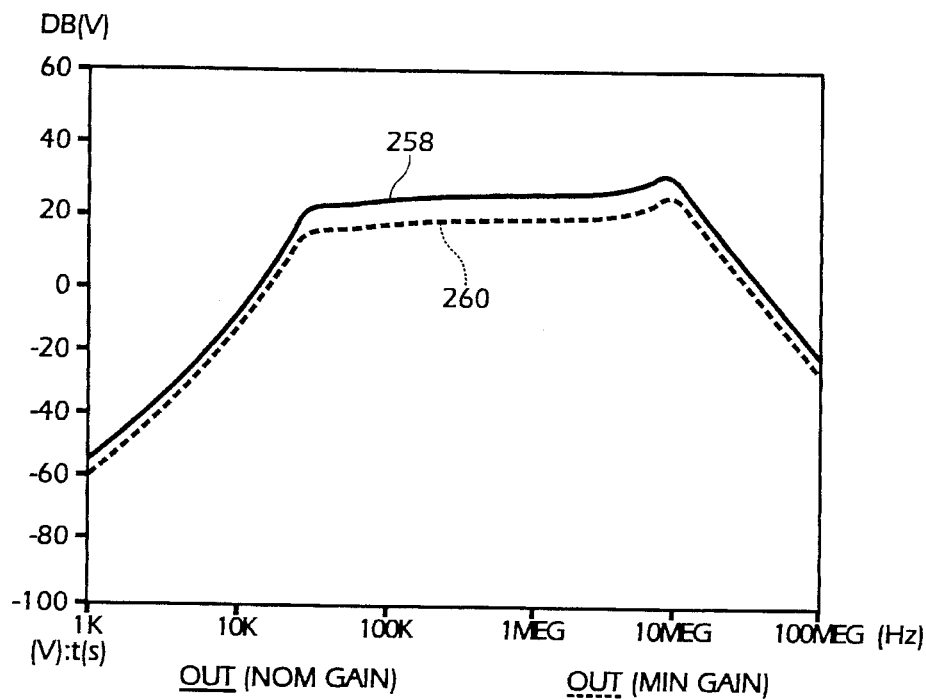
FIG. 27 is a graph of nominal and minimum gains of the line amplifier of FIG. 25.

FIG. 27 shows a graph of the ac response of the line amplifier with part values chosen for nominal 258 and minimum 260 gain. In this case the values of R6, R10, Rs, as well as the values of all other components in the example line-amplifier circuit, were selected to yield the minimum value for gain as determined by the EVA analysis.

Figure 28:
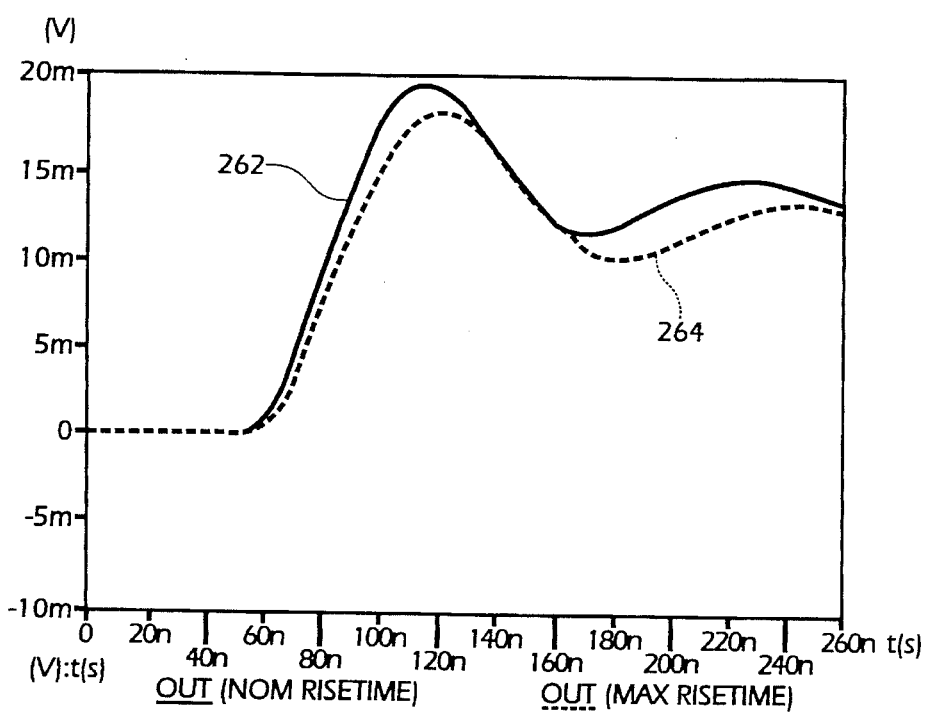
FIG. 28 is a graph of nominal and minimum risetimes of the line amplifier of FIG. 25.

FIG. 28 shows a graph of the transient response of the line amplifier with part values chosen for nominal 262 and maximum 264 risetime. Waveform 264 shows the response for values of R6, C4, R10, as well as the values of all other components in the example line-amplifier circuit, that yield the worst case maximum value of risetime.

Failure Modes and Effects Analysis

The Failure Modes and Effects Analysis (FMEA) is used to determine the effects on design performance measures when parts in the circuit fail. Some typical failures are shorts, opens, or changes in value. When a stress analysis is combined with the FMEA, other parts in the circuit that exceed specifications due to a part failure can also be determined.

Figure 29:
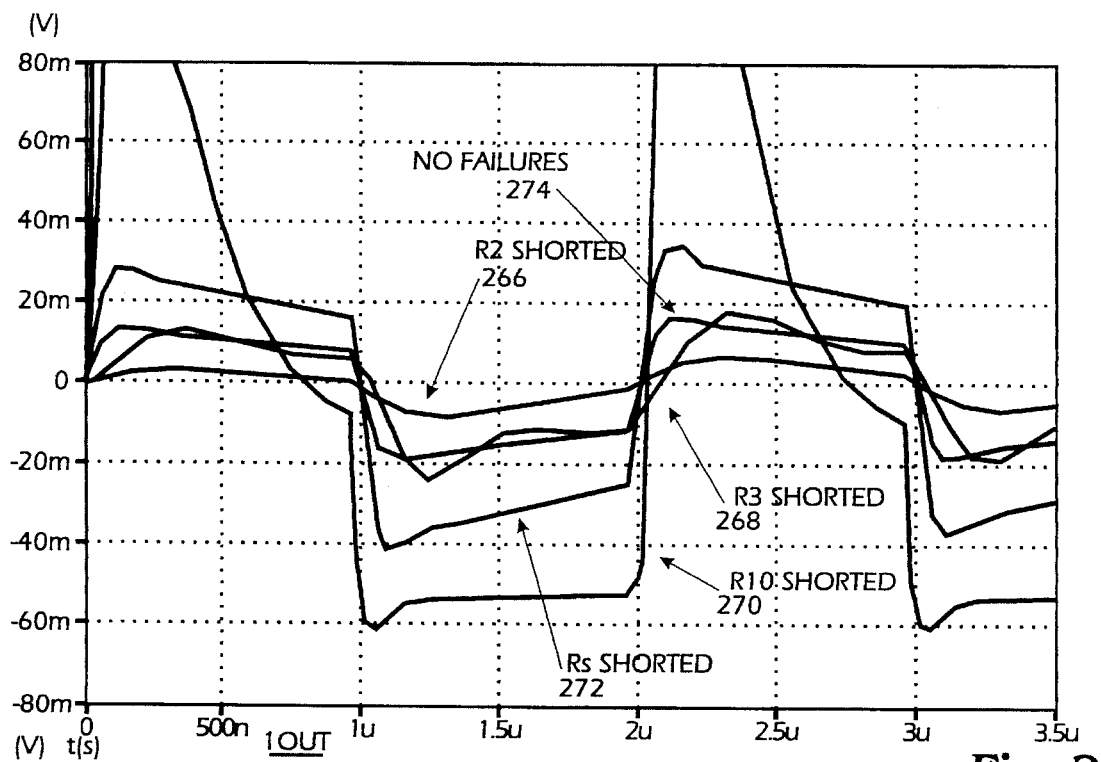
FIG. 29 is a graph depicting the transient responses of the line amplifier of FIG. 25 showing the effects of shorting each resistor in the circuit.

The graph in FIG. 29 is a composite of the transient responses resulting from failure of selected resistors, such as R2, line 266, R3, line 268, R10, line 270, Rs, line 272, and line 274, which represents transient responses when all of the previously selected resistors are functioning properly. These are the transient responses from which the values of the risetimes are extracted to generate the FMEA report.

The FMEA report shown in Report 10 gives the value of the design performance measure risetime that results when each resistor in the circuit is shorted, as shown in FIG. 29. For each failure, the FMEA report indicates whether the resulting value of the risetime falls within its allowed range or whether it is below or above the range.

REPORT 10

FAILURE MODES AND EFFECTS ANALYSIS REPORT

Report Description

The failure modes and effects analysis was taken with respect to the parameters specified by "rq.*/. . ./short". The following ranges were established:
The allowed range for risetime: 45n 50n Input Parameter Summary Fault List: FPARList rq.*/. . ./short REPORT 10-continued

FAILURE MODES AND EFFECTS ANALYSIS REPORT

| | Report sorting by: | FMEASORT | | FAULT | |
| | Faults reported: | FMEASELect | | ALL | |
| | Allowed ranges: | RAnges | | 45n 50n | |
| Part | Device Type | Fault | At time | No. of Failures | Value of Risetime (n) | Above/ Below limit |
|---|---|---|---|---|---|---|
| /rq.rs | Resistor | short | 0 | 1 | 39.6 | below |
| /rq.r10 | Resistor | short | 0 | 1 | 97.7 | above |
| /rq.r3 | Resistor | short | 0 | 1 | 57 | above |
| /rq.r2 | Resistor | short | 0 | 1 | 110 | above |
| /rq.r6 | Resistor | short | 0 | 1 | 264 | above |
| /rq.r4 | Resistor | short | 0 | 1 | 10.3 | below |
| /rq.r8 | Resistor | short | 0 | 1 | 10 | below |
| /rq.r5 | Resistor | short | 0 | 1 | 23.2 | below |
| /rq.r1 | Resistor | short | 0 | 1 | 382 | above |
| /rq.r7 | Resistor | short | 0 | 1 | 5.52 | below |
| /rq.r9 | Resistor | short | 0 | 1 | 0 | below |
| /rq.r11 | Resistor | short | 0 | 1 | 0 | below |
| /rq.r1 | Resistor | short | 0 | 1 | 0 | below |

INDUSTRIAL APPLICABILITY

The analysis mechanism of the invention is useful for performing detailed computer simulations of real-world systems, such as electro-mechanical systems, without the necessity of actually building the system. This enables designers to test proposed systems for reliability and longevity in significantly less time and with the expenditure of significantly fewer resources than is required if an actual system is required to be constructed.

Although a preferred embodiment of the invention has been disclosed herein, it should be appreciated that variations and modifications may be made thereto without departing from the scope of the invention as defined in the appended claims.

We claim:

1. A system performance simulator (20) for simulating the performance of a physical, real-world system (200, 240), including an analysis mechanism (50) for analyzing system performance of the physical, real-world system (200, 240), comprising:

a simulator (37);

a template set (24), having plural templates therein, written in a hardware description language which represents physical, real-world devices;

an extraction mechanism for extracting indicators of design quality of at least one template in a represented system based on a specific analysis protocol (56, 60, 66, 70, 74) from a simulation of the physical, real-world system, wherein said extraction mechanism includes computer code segments for said specific analysis protocol (56, 60, 66, 70, 74), where part of said code segments is located in said template set, which template code segment includes a behavior protocol which represents the behavior characteristics of a device when the device is operated in accordance with a predefined parameter set, and wherein part of said code segments is located in said simulator (37) which simulator code segment includes a command protocol for implementing the code segment located in a template; and a display interface (62, 68, 72, 76), connected to an I/O device (38) for displaying said indicators of design quality to a designer.

2. The analysis mechanism of claim 1 which includes an iterating module (66a, 66b, 66c), connected to said simulator (37) to input systematically a series of values into a romplate as device parameters, wherein said iterating module (66a, 66b, 66c) provides said series of values by iteration algorithms taken from the group consisting of EVA, RSS, and Monte Carlo, and wherein said iterating module (66a, 66b, 66c) incorporates a mechanism for the control of a sensitivity analysis mechanism (60) and the utilization of the results of the sensitivity analysis.

3. The analysis mechanism of claim 1, wherein said indicators of design quality are indicative of performance parameters taken from the group consisting of performance measurement analysis (56), sensitivity analysis (60), stress analysis (74), WCA (66), FMEA (70), centering and tolerancing (58), and design optimization (57).

4. The analysis mechanism of claim 3, wherein said behavior protocol includes a designer-implemented derating protocol for selectively derating at least one represented part in a real-world system.

5. The analysis mechanism of claim 3, wherein collections of represented pans may be selectively derated by different derating factors.

6. The analysis mechanism of claim 3, wherein said behavior protocol in one template is responsive to the behavior of another template.

7. The analysis mechanism of claim 3, wherein said behavior protocol includes a designer-implemented failure protocol for selectively failing at least one represented part in a real-world system.

8. The analysis mechanism of claim 3, wherein said behavior protocol includes a designer-implemented stress-measure protocol for selectively identifying at least one stress measure in a represented part in a real-world system.

9. The analysis mechanism of claim 3, wherein said behavior protocol includes a designer-implemented measurement protocol for selectively defining template-contained waveform-to-scalar measurements.

10. The analysis mechanism of claim 3, wherein said behavior protocol includes a designer-implemented transformation protocol for selectively defining template-contained waveform-to-waveform transformations.

11. A system performance simulator (20) for simulating the performance of a physical, real-world system (200, 240), including an improved analysis mechanism (50) for analyzing system performance of the physical, real-world system (200, 240), comprising:

a simulator (37);

a template set (24), including plural templates therein, wherein each template is written in a hardware description language and represents a physical, real-world device;

an extraction mechanism for extracting indicators of design quality of at least one template in a represented system based on a specific analysis protocol (56, 60, 66, 70, 74) from a simulation of the physical, real-world system; wherein said extraction mechanism includes computer code segments for said specific analysis protocol (56, 60, 66, 70, 74), and wherein part of said code segments is located in templates in said template set and includes a behavior protocol which represents the behavior characteristics of a device when the device is operated in accordance with a predefined parameter set, and part of said code segments is located in said simulator (37), wherein said behavior protocol includes a designer-implemented derating protocol for selectively derating at least one represented part in a real-world system;

an iterating module (66a, 66b, 66c) connected to simulator (37) to input systematically a series of values into a template as device parameters by providing said series of values by iteration algorithms taken from the group consisting of EVA, RSS, and Monte Carlo; and a display interface (62, 68, 72, 76) connected to I/O device (38) for displaying said indicators of design quality to a designer.

12. The analysis mechanism of claim 11, wherein said iterating module (66a, 66b, 66c) incorporates a mechanism for controlling a sensitivity analysis mechanism (60) and the utilization of the results of said sensitivity analysis.

13. The analysis mechanism of claim 11, wherein said indicators of design quality are indicative of performance parameters taken from the group consisting of performance measurement analysis (56), sensitivity analysis (60), stress analysis (74), WCA (66), FMEA (70), centering & tolerancing (58), and design optimization (57).

14. The analysis mechanism of claim 11, wherein collections of represented parts may be selectively derated by different derating factors.

15. The analysis mechanism of claim 11, wherein said behavior protocol in one template is responsive to the behavior of another template.

16. The analysis mechanism of claim 11, wherein said behavior protocol includes a designer-implemented failure protocol for selectively failing at least one represented part in a real-world system.

17. The analysis mechanism of claim 11, wherein said behavior protocol includes a designer-implemented stress-measure protocol for selectively identifying at least one stress measure in a represented part in a real-world system.

18. The analysis mechanism of claim 11, wherein said behavior protocol includes a designer-implemented measurement protocol for selectively defining template-contained waveform-to-scalar measurements.

19. The analysis mechanism of claim 11, wherein said behavior protocol includes a designer-implemented transformation protocol for selectively defining template-contained waveform-to-waveform transformations.

20. In a system performance simulator (20) for simulating the performance of a physical, real-world system (200, 240), including an analysis mechanism (50) for analyzing system performance of the physical, real-world system (200, 240), comprising:

a simulator (37);

a template set (24), having plural templates therein, written in a hardware description language, wherein each template represents a physical, real-world device;

an extraction mechanism for extracting indicators of design quality of at least one template in a represented system based on a specific analysis protocol (56, 60, 66, 70, 74) from a simulation of the physical, real-world system; wherein said extraction mechanism includes computer code segments for said specific analysis protocol (56, 60, 66, 70, 74), and wherein part of said code segments is located in a template and includes a behavior protocol which represents the behavior characteristics of a device when the device is operated in accordance with a predefined parameter set, and part of said code segment is located in said simulator (37), wherein said behavior protocol includes a designer-implemented derating protocol for selectively derating at least one represented part in a system, wherein collections of represented parts may be selectively derated by different derating factors, wherein said behavior protocol in one template is responsive to the behavior protocol of another template, wherein said behavior protocol includes a designer-implemented hilure protocol for selectively failing at least one represented, real-world device in a represented, real-world system;

an iterating module (66a, 66b, 66c), connected to said simulator (37) incorporating a mechanism for the control of the sensitivity analysis mechanism (60) and the utilization of the results of the sensitivity analysis, and to input systematically a series of values into a template as device parameters; and a display interface (62, 68, 72, 76), connected to I/O device (38), for displaying said indicators of design quality to a designer.

* * * * *